US008379874B1

(12) United States Patent
Simon

(10) Patent No.: US 8,379,874 B1
(45) Date of Patent: Feb. 19, 2013

(54) APPARATUS AND METHOD FOR TIME ALIGNING PROGRAM AND VIDEO DATA WITH NATURAL SOUND AT LOCATIONS DISTANT FROM THE PROGRAM SOURCE AND/OR TICKETING AND AUTHORIZING RECEIVING, REPRODUCTION AND CONTROLLING OF PROGRAM TRANSMISSIONS

(76) Inventor: Jeffrey Franklin Simon, Doylestown, PA (US)

( * ) Notice: Subject to any disclaimer, the term of this patent is extended or adjusted under 35 U.S.C. 154(b) by 0 days.

(21) Appl. No.: 13/229,330

(22) Filed: Sep. 9, 2011

Related U.S. Application Data

(60) Continuation of application No. 13/205,234, filed on Aug. 8, 2011, which is a division of application No. 12/023,852, filed on Jan. 31, 2008, now Pat. No. 7,995,770.

(60) Provisional application No. 60/899,290, filed on Feb. 2, 2007, provisional application No. 61/403,093, filed on Sep. 10, 2010, provisional application No. 61/404,066, filed on Sep. 27, 2010.

(51) Int. Cl.
*H05K 11/12* (2006.01)

(52) U.S. Cl. .................. 381/82; 381/1; 381/77; 381/98; 455/41.2; 455/250.1

(58) Field of Classification Search .................. 381/1, 9, 381/77, 82, 98
See application file for complete search history.

(56) References Cited

U.S. PATENT DOCUMENTS

| | | | |
|---|---|---|---|
| 2,567,431 | A | 9/1951 | Halstead |
| 3,235,804 | A | 2/1966 | McIntosh |
| 3,906,160 | A | 9/1975 | Nakamura et al. |
| 4,165,487 | A | 8/1979 | Corderman |
| 4,610,024 | A | 9/1986 | Schulhof |
| 4,618,987 | A | 10/1986 | Steinke et al. |
| 4,829,500 | A | 5/1989 | Saunders |
| 4,899,388 | A | 2/1990 | Mlodzikowski et al. |
| 4,993,074 | A | 2/1991 | Carroll |
| 5,058,169 | A | 10/1991 | Temmer |
| 5,131,051 | A | 7/1992 | Kishinaga et al. |
| 5,432,858 | A | 7/1995 | Clair, Jr. et al. |
| 5,619,582 | A | 4/1997 | Oltman et al. |
| 5,668,884 | A | 9/1997 | Clair, Jr. et al. |

(Continued)

FOREIGN PATENT DOCUMENTS

| | | |
|---|---|---|
| FR | 2006116 | 12/1969 |
| JP | 55-077295 | 6/1980 |

(Continued)

OTHER PUBLICATIONS

Tontechnick-Rechner-Sengpielaudio, “Calculation: Speed of Sound C in Air and the Important Temperature”, www.sengpielaudio.com/calculator-speedsound, printed Jan. 8, 2008, 5 pages.

Tontechnick-Rechner-Sengpielaudio, “Calculation: Speed of Sound in Humid Air”, www.sengpielaudio.com/calculator-airpressure, printed Jan. 15, 2008, 12 pages.

(Continued)

*Primary Examiner* — Dung A. Le

(57) ABSTRACT

A wireless device and method may comprise, by way of example, a device and method for receiving wireless transmissions which may include locating data, or authorization data or program data, for determining its location from the locating data, or for determining synchronization for program data, or for ticketing, or for a combination thereof. Authorization data and/or locating data and/or other data may be used to authorize reproduction and/or controlling of received program data, and or for controlling the wireless device. Video program data may be delayed by a number of video frames, preferably an integer number, so as to be substantially synchronized with natural sound. The device and method may determine a location for delaying received program data to be substantially in time alignment with natural sound. A ticketing entity may control a ticket and/or and authorization, and/or may control a remote device thereby.

58 Claims, 16 Drawing Sheets

U.S. PATENT DOCUMENTS

| | | | | |
|---|---|---|---|---|
| 5,710,818 | A * | 1/1998 | Yamato et al. | 381/1 |
| 5,757,932 | A | 5/1998 | Lindemann et al. | |
| 5,822,440 | A | 10/1998 | Oltman et al. | |
| RE38,405 | E | 1/2004 | Clair, Jr. et al. | |
| 6,718,039 | B1 * | 4/2004 | Klayman et al. | 381/1 |
| 7,043,031 | B2 | 5/2006 | Klayman et al. | |
| 7,044,362 | B2 | 5/2006 | Yu | |
| 7,788,279 | B2 | 8/2010 | Mohajer et al. | |
| 7,881,657 | B2 | 2/2011 | Wang et al. | |
| 2003/0109246 | A1 | 6/2003 | Shimizu et al. | |
| 2008/0123869 | A1 | 5/2008 | Huang | |
| 2010/0082491 | A1 | 4/2010 | Rosenblatt et al. | |

FOREIGN PATENT DOCUMENTS

| | | |
|---|---|---|
| JP | 57-202138 | 12/1982 |
| WO | 92/05673 | 4/1992 |

OTHER PUBLICATIONS

Tim Brice and Todd Hall, National Weather Service Forecast Office, “The Speed of Sound Calculation” www.srh.noaa.gov/elp/wxcalc/speedofsound, printed Jan. 8, 2008, 2 pgs.
Pictures “Effectron”, Special Effects Generator (Delta Lab), prior to Jan. 31, 2008.
Shazam Entertainment, Ltd., Avery Li-Chun Wang, “An Industrial-Strength Audio Search Algorithm”, date prior to Sep. 9, 2011, 7 pages.
Bryan Jacobs, “How Shazam Works”, Jan. 10, 2009, 20 pages http://laplacian.wordpress.com/2009/01/10/how-shazam-works/.
SoundHound, Inc., “Instant Music and Discovery”, ©2011, 7 pgs, www.soundhound.com.

* cited by examiner

Exploded View of Fig. 7A

APPARATUS AND METHOD FOR TIME ALIGNING PROGRAM AND VIDEO DATA WITH NATURAL SOUND AT LOCATIONS DISTANT FROM THE PROGRAM SOURCE AND/OR TICKETING AND AUTHORIZING RECEIVING, REPRODUCTION AND CONTROLLING OF PROGRAM TRANSMISSIONS

This application is a continuation of U.S. patent application Ser. No. 13/205,234 entitled "APPARATUS AND METHOD FOR AUTHORIZING REPRODUCTION AND CONTROLLING OF PROGRAM TRANSMISSIONS AT LOCATIONS DISTANT FROM THE PROGRAM SOURCE" filed Aug. 8, 2011, which is a division of U.S. patent application Ser. No. 12/023,852 entitled "APPARATUS AND METHOD FOR ALIGNING AND CONTROLLING RECEPTION OF SOUND TRANSMISSIONS AT LOCATIONS DISTANT FROM THE SOUND SOURCE" filed Jan. 31, 2008 now U.S. Pat. No. 7,995,770, which claims the benefit of U.S. Provisional Application Ser. No. 60/899,290 entitled "SYSTEM AND METHOD FOR AUDIO REPRODUCTION TIME ALIGNMENT FOR A DISPARATE LOCATION FROM THE AUDIO SIGNAL SOURCE" which was filed Feb. 2, 2007, and this application further claims the benefit of U.S. Provisional Application Ser. No. 61/403,093 entitled "SYSTEM AND METHOD FOR VIDEO REPRODUCTION TIME ALIGNMENT FOR A DISPARATE LOCATION FROM THE AUDIO SOURCE SIGNAL" filed Sep. 10, 2010, and of U.S. Provisional Application Ser. No. 61/404,066 entitled "SYSTEM AND METHOD FOR RECEPTION OF AUTHORIZED SECURED WIRELESS DATA TRANSMISSIONS FOR A DISPARATE LOCATION FROM AN ACOUSTIC AUDIO SOURCE SIGNAL" filed Sep. 27, 2010, each of the foregoing patent applications and provisional patent applications is hereby incorporated herein by reference in its entirety.

The present invention relates to a wireless device and method, and in particular, to a wireless device and method for time aligning video data with natural sound and/or for authorizing program data.

Concerts, entertainments and other events have increasingly been coming to be held in large venues, not just in theaters, but in arenas, stadiums, amphitheaters, parks, neighborhoods, and the like. Such venues present challenges in providing quality audio programming to the audience due to unique acoustical and technical issues.

As the size of the venue has grown, the audience has come to extend further and further from the source of the performance. In a typical theater, even the last row is usually only 100-200 feet from the stage and so the performance can be seen and heard fairly well. In a stadium, however, parts of the audience can be many hundreds of feet from the stage and the performers, and so the time that it takes for the sound to propagate through the air to the audience can become discernable to the listener, e.g., he can detect that the sound he is hearing is not synchronized with the performance he sees, as best he can.

At some live concerts in Philadelphia, for example, the audience covers an area extending for over a mile along a wide Parkway (having roads and park lands) from the Art Museum almost to City Hall. On the National Mall in Washington, D.C., for example, an audience of hundreds of thousands may be spread out over an enormous mall area with some being thousands of feet from the stage and the performers.

Various sound processing and amplification arrangements have been devised for reproducing sound from loudspeakers that are located at various locations over such venue, with the amplified sound being reproduced at different times by different loudspeakers so as to tend to provide coherent sound throughout most if not all of the venue, and large video screens may be provided to display images of the performance for those who are too far away from the stage to appreciate the performance using their natural vision.

Audio reception devices have come to be employed in these sorts of venues so that the audience may hear a purer or cleaner reproduction of the audio via a radio broadcast than they might hear from the origin or via the loudspeakers given the presence of other sources of sound, e.g., talking and singing and screaming by other audience members, cell phone ringers and conversations, and noise sources such as vehicles, sirens, food vendors and other concessions, hawkers, wind, aircraft, and the like. A major problem with conventional audio devices is that the sound they reproduce will precede in time the natural sound from the origin and the loudspeakers which typically are close to the origin. This is because the speed of sound in air (the natural sound) is much slower (about 4.5 seconds per mile) than is the speed of radio waves in air (which approaches the about 186,000 miles per second speed of light). This difference produces a discernable delay in the arrival of natural sound after the arrival of the radio broadcast sound, and this difference can be both annoying and undesirable.

To address this shortcoming, several different approaches have been described. In one, the audio device has a manually adjustable delay that the user can adjust so that the received radio broadcast sound is delayed sufficiently that it apparently coincides with the arriving natural sound. Recognizing that this manual adjustment could be difficult for many users, and inconvenient, several automated schemes have been devised. In one such scheme, a microphone of the audio device picks up the local natural sound and attempts to electronically correlate the local natural sound with the received broadcast sound, but often (if not usually, at a concert), there is so much non-program noise in the local natural sound that no correlation can be made and the device fails to operate properly.

In another such scheme, the broadcast sound is transmitted over several channels in each of which the audio is delayed by a small amount, e.g., 30 milliseconds (msec.) from the previous channel, and the audio device determines its radial distance from the stage to select the channel that provides a delay that approximates the actual delay of the natural sound. The matching of the delay is almost always imperfect, and so the user will often be dissatisfied with the reproduced sound. It would be quite costly and likely not practical to broadcast enough channels to accommodate the wide range of delays that would be experienced in a larger venue, especially considering the complexity that would introduce into the transmitters as well as the receivers. Sometimes, "close enough" is not good enough.

In some venues, such as an arena and a stadium, the arrangements of loudspeakers around a stage inherently create areas or zones wherein the phasing of a stereo sound is reversed, i.e. the loudspeaker on a listener's left is producing right channel audio and the loudspeaker on the listener's right is producing left channel audio. Neither of the foregoing systems and their audio reception devices address this problem, with the result that the stereo audio reproduced in the head sets thereof is out of phase with the live natural stereo sound and the resulting cancellation effect tends to produce monaural sound.

In addition, video images of the performance may also be transmitted to receivers in the venue and because of the differences between the speed of sound and the speed of light, the received video will precede the arrival of the corresponding natural sound via the atmosphere and so the natural sound and the video will be out of time synchronization, which is annoying to a viewer/listener. In a larger venue, the discrepancy can become so great as to significantly detract from the enjoyment of the performance, even where transmitted audio data is delayed so as to come into substantial synchronization with the natural sound.

All of the foregoing lack ability to control access and use of received program data such as by authorizations and ticketing. Accordingly, there is a need for a device and method that provide for authorizing the reception and controlling of program material. This may be provided in a device and system that automatically synchronizes broadcast and natural program material, e.g., broadcast video and natural sound. Desirably, such arrangement would also provide other features that could enhance the experience of the user.

According to one aspect, a wireless device and method may comprise, by way of example, a device and method for receiving wireless transmissions which may include locating data, or authorization data or program data, for determining its location from the locating data, or for determining synchronization for program data, or for ticketing, or for a combination thereof. Authorization data and/or locating data and/or other data may be used to authorize reproduction and/or controlling of received program data, and or for controlling the wireless device. Video program data may be delayed by a number of video frames, preferably an integer number, so as to be substantially synchronized with natural sound. The device and method may determine a location for delaying received program data to be substantially in time alignment with natural sound. A ticketing entity may control a ticket and/or and authorization, and/or may control a remote device thereby.

BRIEF DESCRIPTION OF THE DRAWING

The detailed description of the preferred embodiment(s) will be more easily and better understood when read in conjunction with the FIGURES of the Drawing which include.

Figure 1:
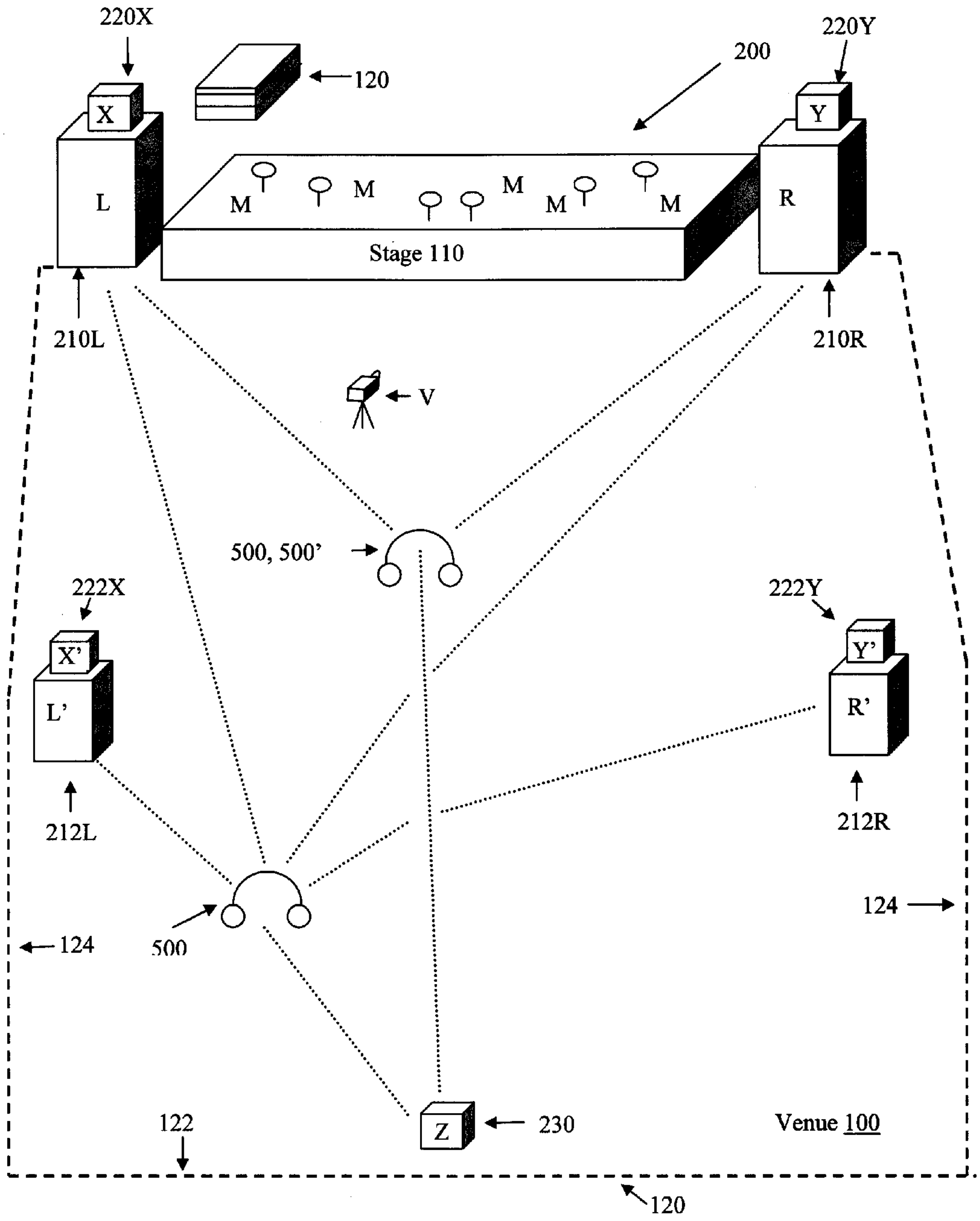
FIG. 1 is a schematic diagram of an example venue wherein sound is propagated from a program source to a reception region.

In the Drawing, where an element or feature is shown in more than one drawing figure, the same alphanumeric designation may be used to designate such element or feature in each figure, and where a closely related or modified element is shown in a figure, the same alphanumerical designation primed or designated "a" or "b" or the like may be used to designate the modified element or feature. Similarly, similar elements or features may be designated by like alphanumeric designations in different figures of the Drawing and with similar nomenclature in the specification. It is noted that, according to common practice, the various features of the drawing are not to scale, and the dimensions of the various features are arbitrarily expanded or reduced for clarity, and any value stated in any Figure is given by way of example only.

DESCRIPTION OF THE PREFERRED EMBODIMENT(S)

FIG. 1 is a schematic diagram of an example venue 100 wherein sound is propagated from a program source, e.g., stage 110, to a reception region 120. Venue 100 includes a boundary 120 within which a program performed on stage 110 may be seen and heard. Boundary 120 may be defined by a physical structure such as the walls of a room, auditorium, arena or stadium, or may be a non-physical boundary 120 which would not impede the viewing and/or hearing of a program, such as imaginary lines, ropes or tapes, a fence, saw horses or the like. In venue 100, e.g., a program may be performed on stage 110 wherein the sound (audio) thereof is picked up by one or more microphones M and after processing, is propagated into venue 100 via one or more loudspeakers 210, 212.

Typically, sound from microphones M on the right half of stage 110 is reproduced by loudspeaker 210R located at the right of stage 110 and sound from microphones M on the left half of stage 110 is reproduced by loudspeaker 210L located at the left of stage 110. Where the distance from stage 110 to the rear of venue 100 (i.e. to boundary 122 of boundary 120 that is farthest from stage 110) is substantial, one or more additional auxiliary loudspeakers 212R, 212L, respectively reproducing the right and left program sound may be placed in relatively rightward and leftward locations near side boundaries 124 intermediate stage 110 and rear boundary 122.

Auxiliary loudspeakers 212R, 212L are also referred to as delay speakers because the program audio reproduced thereby is typically delayed in time from the program audio as reproduced by primary loudspeakers 210. Where personal receivers 500, 500' as described herein are utilized, because the time delay arrangement provided thereby is accurate and adapts to movement of receiver 500, 500' in venue 100 and to the actual current atmospheric condition, delay speakers 212 may be eliminated in many applications or may be limited to reproducing only the lower sub-frequencies, e.g., 20 Hz to 120 Hz.

Apparatus 200 for receiving audio from microphones M, for processing such audio, and for driving loudspeakers 210, 212 may be provided in a control center 120 or any other convenient location, and may be a permanent part of venue 100 or may be portable, e.g., in a trailer or other vehicle. While illustrated in relation to example venues 100 having a stage 110, of the sort that might be used for concerts, ceremonies, performances, and/or other entertainments, the present arrangement is not limited to such standard and/or formalized venues and locations. For simplicity, all such will be referred to as venues and as performances or programs thereat. One or more video cameras V may be provided for providing video images of the performance which may be processed, e.g., mixed, and distributed via apparatus 200.

In addition to the processing and amplification of the audio program, apparatus 200 preferably also includes wireless transmitters 220, 230 for broadcasting at least within boundary 120 of venue 100. Preferably, wireless transmitter 220X is located proximate left loudspeaker 210L and wireless transmitter 220Y is located proximate right loudspeaker 210R, preferably in vertical alignment with loudspeakers 210L, 210R, so that the wireless signals transmitted thereby originate in substantial co-location with the amplified audio from loudspeakers 210. Where auxiliary loudspeakers 212 are employed, optional auxiliary wireless transmitter 222X is located proximate auxiliary left loudspeaker 212L and optional auxiliary wireless transmitter 222Y is located proximate right loudspeaker 212R, preferably in vertical alignment therewith.

Wireless transmitters 220, 222, 230 may be referred to as telemetry transmitters or telemetry beacons in view of their telemetering data such as program data, location data, atmospheric data, and the like, and/or may also be referred to as beacon transmitters in view of their function in providing transmissions (beacons) from which personal receivers 500, 500' may determine their respective physical locations.

Signals transmitted by transmitters 220X, 220Y include at least left and right audio program, atmospheric data, and respective locating signals, which could be a carrier signal and/or data modulated on a carrier signal. Signals transmitted by optional auxiliary wireless transmitters 222X, 222Y may include at least respective locating signals, which could be a carrier signal and/or data modulated on a carrier signal. Apparatus 200 may further comprise an auxiliary wireless transmitter 230 preferably located relatively rearward in venue 100 for transmitting at least a locating signal, which also could be a carrier signal and/or data modulated on a carrier signal. Signals transmitted by transmitters 220, 222, 230 are illustrated by the jagged lines emanating therefrom. Signals transmitted by transmitters 220, 222, 230 are synchronized for accuracy in determining location therefrom, as described below.

The audience, hereinafter users or listeners, may have personal receivers 500, 500' for receiving and processing signals transmitted by wireless transmitters 220, 222, 230 as may be employed, whereby the transmitted audio program may be listened to via loudspeakers, typically headphones or ear buds or ear phones or another transducer, of receiver 500, 500'. Receivers 500, 500' each may receive the respective locating signals transmitted by transmitters 220X and 220Y, and optionally by transmitter 230, from which each receiver 500, 500' may determine its location within venue 100, including its distance from speakers 210R, 210L, and speakers 212R, 212L, if present. Typically, the locating signal transmitted by each transmitter is unique to that transmitter 220X, 222X, 220Y, 222Y, 230, e.g., by frequency or by data therein, so that which signal originated at which transmitter is known so that the location of receiver 500, 500' within area 120 of venue 100 may be determined. Transmitters 220, 222, 220X, 222X, 220Y, 222Y, 230, 230Z may also be referred to as beacons or as telemetry transmitters.

Preferably, the layout for all of loudspeakers 210, 212 is known so that the distance to the nearest loudspeaker 210, 212 is to one directing sound towards the location of receiver 500, 500', and not one directing sound away from that location. While two sources of location data may be sufficient in certain instances, it is preferred that locating signals from three transmitters 220X, 220Y, 230 be employed in determining the location of receiver 500, 500' for better accuracy. Where location in three dimensions is desired, it is preferred that locating signals from four transmitters 220X, 220Y, 230 not all in the same plane be employed in determining the location of receiver 500, 500'.

Personal receiver 500, 500' may utilize its determined distance from the nearest of speakers 210, 212, whether determined from the transmitted locating signals or from correlating the natural sound received through the air with the transmitted audio program, and the atmospheric data received from at least one of wireless transmitters 220, 222, to determine the actual present speed of sound in venue 100 and therefrom the difference in time between the wirelessly transmitted audio program and the natural sound of the audio program as would be heard in that location from the nearest of loudspeakers 210, 212. Receiver 500, 500' delays the wirelessly transmitted audio program by the determined difference in time and reproduces the delayed audio program in loudspeakers associated with receiver 500, 500', so that the reproduced audio program is synchronized with, i.e. is in time alignment with, the natural sound audio program from the nearest of loudspeakers 210, 212. Where receiver 500, 500' receives program video and/or text data from transmitters 220, 222, the video information and/or the text data may be similarly delayed by the determined time difference so as to be in time alignment with the natural sound. These and other features of receiver 500, 500' are described further herein below.

Similarly, personal receiver 500, 500' may determine the distance from the nearest loudspeakers 210L, 212L reproducing left channel audio and from the nearest speaker 210R, 212R reproducing right channel audio, and may then delay the corresponding channels of the wirelessly transmitted left and right channel audio by the respective delay times determined in relation to the distances from the nearest left and right channel loudspeakers, respectively. Likewise, where four or more loudspeakers 210, 212 produce four channel or greater sound (quadraphonic or surround sound), the respective distances to each of those loudspeakers may be determined and the time delay of the natural sound therefrom may also be determined, so that the corresponding respective channels of the wirelessly transmitted audio data may be delayed by the delay time corresponding thereto, respectively.

Where auxiliary loudspeakers 212L, 212R are employed, the sound reproduced thereby is delayed with respect to the sound produced by loudspeakers 210L, 210R so as to be synchronized, e.g., time aligned, therewith so that the natural sound throughout venue 100 is perceived as being consistent, without echo and other effects caused by time differences between the sound produced by different sources. In one alternative, transmitters 220X, 220Y associated with loudspeakers 210L, 210R, respectively, may broadcast the program audio associated with the particular loudspeaker with which it is associated. In another alternative, transmitters 222X, 222Y associated with loudspeakers 212L, 212R, respectively, may broadcast the delayed program audio associated with that particular auxiliary loudspeaker. In this alternative, the transmitted signals may include data identifying the loudspeaker and the group of loudspeakers it is part of, and its stereo phasing, so that the processing by receiver 500, 500' described below is simplified, however, it would be more difficult to set up and synchronize larger numbers of transmitters and so the basic three or four transmitter 220X, 220Y, 230, 230Z is generally preferred.

It must be noted that the change in the speed of sound between a temperature of 50° F. (e.g., in the early morning) and of 115° F. (e.g., in the afternoon) can produce a time difference of up to about 30 milliseconds at a distance from the source of about 500 feet, which is a time difference that is normally corrected for delay loudspeakers systems of the sort used in outdoor venues, and that is considered a "Special Effect Sound" or a "Doubled Audio Signal." Time differences of as little as 5-10 milliseconds have been reported as producing perceivable effects on a listener. At distances of 3000 feet or greater, as is common in large venues such as the annual 4th of July show held on the Benjamin Franklin Parkway in Philadelphia, the out of synchronization time for natural sound can be more than about 400 milliseconds. People who attend and pay substantial admission fees for the ability to listen to and record a live concert expect to receive CD-quality (compact disk digital audio recordings) sound which requires accurate synchronization and reproduction of transmitted program audio which cannot be provided if the effect of temperature on the speed of sound is not corrected.

Figure 2:
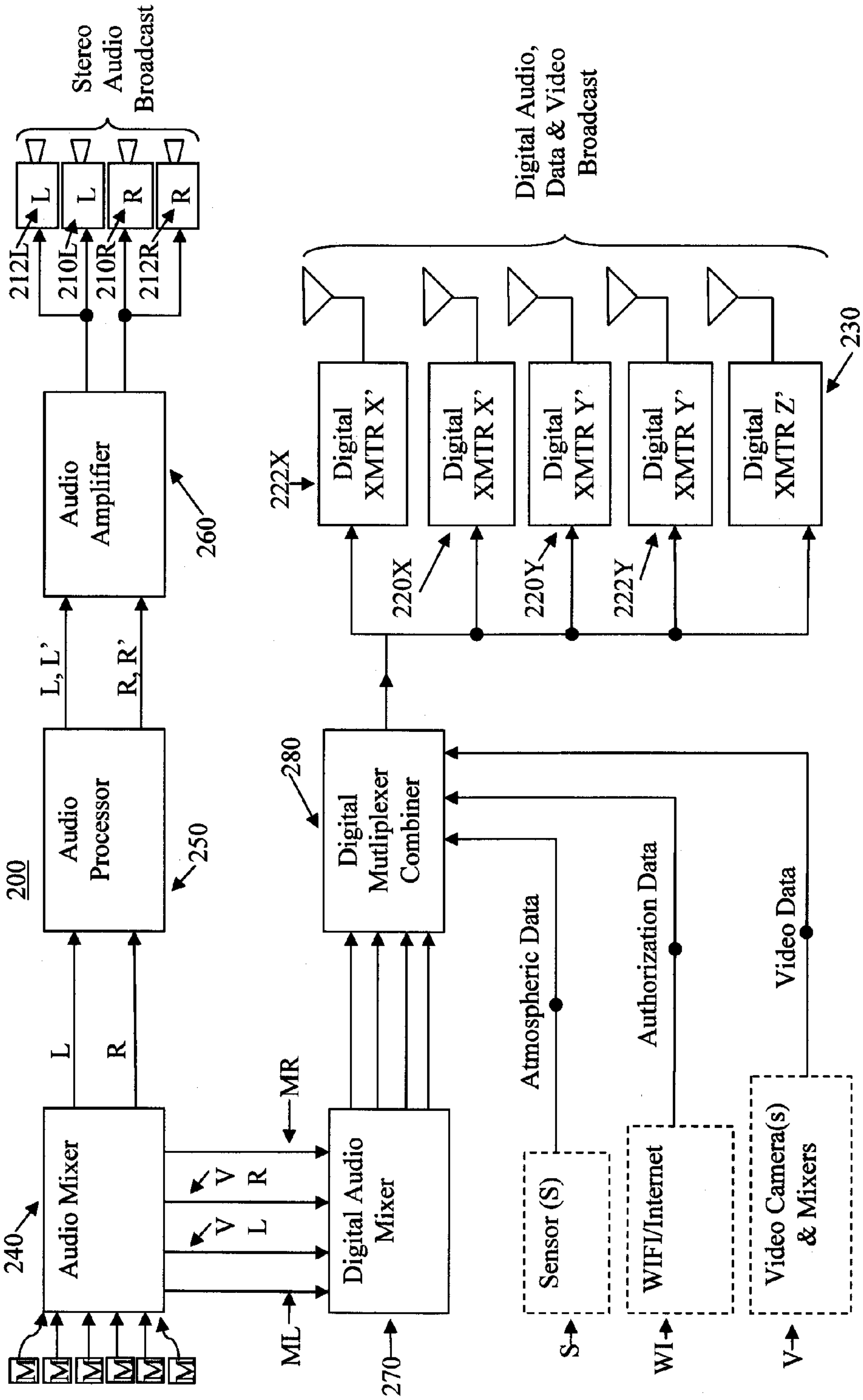
FIG. 2 is a schematic block diagram of an example embodiment of an audio and wireless transmission arrangement suitable for the example venue of FIG. 1.

FIG. 2 is a schematic block diagram of an example embodiment of an audio and wireless transmission arrangement 200 suitable for the example venue 100 of FIG. 1. The audio program, e.g., music and/or sound, picked up by microphones M is coupled to stereophonic (stereo) audio mixer 240 wherein the electrical signals from the various microphones may be adjusted and/or standardized in level and mixed together to provide plural audio tracks of a left and right L, R stereo program to audio processor 250. Processor 250 performs dynamic adjustments, equalization and speaker management, including introducing appropriate delays for stereo audio signals L', R' that will be reproduced relatively far from the main loudspeakers 210, e.g., by auxiliary speakers 212. Processed left and right audio signals are amplified by amplifier 260 and are distributed, e.g., wirelessly or via wires and/or cables, to loudspeakers 210L, 210R, 212L, 212R for stereophonic (stereo) acoustic reproduction in venue 100.

In addition, plural stereo audio tracks are provided by audio mixer 240 to digital audio mixer 270 which includes one or more analog-to-digital (A/D) converters which provide corresponding plural digitized audio tracks. Such tracks may include one or more left and right vocal tracks VL, VR, and one or more left and right instrumental music tracks ML, MR, as may be desired. The plural digitized audio tracks from digital mixer 270 are processed by digital multiplexer combiner 280 wherein they are multiplexed and/or otherwise combined and processed to configure the audio program tracks for wireless digital broadcasting. Multiplexer combiner 280 may include a computer running software for editing, changing, re-mixing and/or reconfiguring the plural audio tracks.

Multiplexer combiner 280 also receives current local atmospheric data, and may receive authorization data and/or video data from one or more video cameras V for combining with the plural digital audio tracks. While such video may be a feed from a single camera, feeds from plural video cameras may be mixed to provide a video program. Optionally, text data, such as program words and/or lyrics, a libretto, subtitles, informational messages, performer and/or actor information, and the like, and translations thereof, may also be included in the digital data provided by combiner 280.

Digital multiplexer combiner 280 provides plural digital data signals for transmission by respective ones of wireless transmitters 220, 222, 230 and also inserts identifying information into those digital data signals for identifying the transmitter that is transmitting the corresponding signal. Thus, the digital data signals provided by combiner 280 for transmitters 220, 222 includes transmitter identifying data, transmitter locating data, digital audio program data, and/or local atmospheric data, and optionally authorization data. Although all of transmitter signals would include transmitter identifying data, transmitter locating data, not all transmitter signals would need include all of the foregoing data.

In particular, current local atmospheric data includes local temperature data such as may be obtained from one or more sensors S, e.g., a thermistor, thermocouple, temperature probe or other temperature sensor suitably located at venue 100 for sensing the temperature thereat. Current local atmospheric data may also include relative humidity data and/or barometric pressure data provided by sensors S which could typically be desirable where venue 100 is very large. Temperature data therefrom is utilized, and optional humidity and pressure data may be utilized, by receivers 500, 500' for determining the actual speed of sound under the actual current atmospheric conditions at venue 100 as described herein. Alternatively, however, it is noted that the current actual speed of sound may be determined from the current local atmospheric data by apparatus 200, e.g., by a processor associated with multiplexer combiner 280, and be transmitted by transmitters 220, 222, 230 with the other data transmitted thereby.

Such sensors S may be located near to stage 110 or control center 120, or may be at one or more locations within boundary 120, e.g., associated with one or more of transmitters 220, 222, 230, which could be advantageous for determining an average temperature or other condition for venue 100. Such sensors S may communicate with multiplexer combiner 280 via a wired and/or wireless link, or may directly communicate with and insert atmospheric data into the signals being transmitted by a particular one or ones of transmitters 220, 222, 230, e.g., a transmitter 220, 222, 230 with which it is associated.

Authorization data may include Internet Protocol (IP) addresses and/or electronic serial number (ESN) and/or other unique data identifying ones of receivers 500, 500' that are authorized to receive and/or reproduce all or part of the signals transmitted by transmitters 220, 222, e.g., including authorizations in similar manner to which cell phones, cable TV converters, satellite TV receivers and the like are authorized to receive their respective messages and broadcasts. Authorization data may be generated locally at venue 100, or may be obtained and/or processed via the Internet, a WiFi connection, a Bluetooth connection, a Zigbee connection, a network, a wireless network, a 3G network, a 4G network, a wired connection, a USB connection, or any other suitable connection and/or network WI. Typically an IP address or other unique identifier for a particular receiver 500, 500' would be permanently stored therein.

Authorizations may represent, e.g., any one or more of admission to venue 100 and/or to any particular portion or region thereof (e.g., premium seating areas), authorization to receive stereo audio programming and/or plural track audio programming, authorization to receive video programming, authorization to record audio and/or video programming, authorization to receive text data, the maximum distance a receiver 500, 500' can be from any one or more loudspeakers, representations of boundary 120 of venue 100 and/or of portions thereof, and the like. Thus, any receiver 500, 500' may be controlled to operate only in certain portions of venue 100 and/or with only certain features operable, and the user may be enabled to or may be precluded from recording the programming (audio and/or video), as may be appropriate and consistent with whatever rights and/or package a user has purchased, thereby allowing receivers 500, 500' to be controlled by the operator of the venue, performance and/or transmitters 220, 222, 230, and for preventing unauthorized receivers from being utilized to receive the transmitted program.

Authorizations may be obtained, e.g., purchased, via an Internet connection using USB interface 645, by programming by the proprietor or operator of the event or performance, and/or if receiver 500, 500' includes a transmitter interface for WiFi, Bluetooth, 3G, 4G, Zigbee, CDMA, TDMA, or another radio frequency link, wireless or wired network, via such link, connection, network and/or the Internet.

Wireless transmitters 220, 222, 230 may be any suitable digital transmitters, and may employ radio frequency (RF), optical and/or other wireless transmissions, as may be desired, however, RF transmitters are typically preferred. Transmitters 220, 222, 230 may employ any suitable form of modulation and format, e.g., AM, FM, phase modulation, CDMA, TDMA, spread spectrum, WiFi, Bluetooth, Zigbee, 3G, 4G, LPS, and the like, although a digital signal format is preferred. A WiFi, Zigbee, 3G, 4G, or other Internet compatible format is advantageous where communication via the Internet is desirable, as may be the case where user authorizations and access may be established and/or verified and/or executed via the Internet. The power levels of transmitters 220, 230 and their respective antennas may be selected, tailored and/or adjusted, if desired, to provide adequate coverage and reception within venue 100 without extending too far beyond boundary 120.

Figure 3:
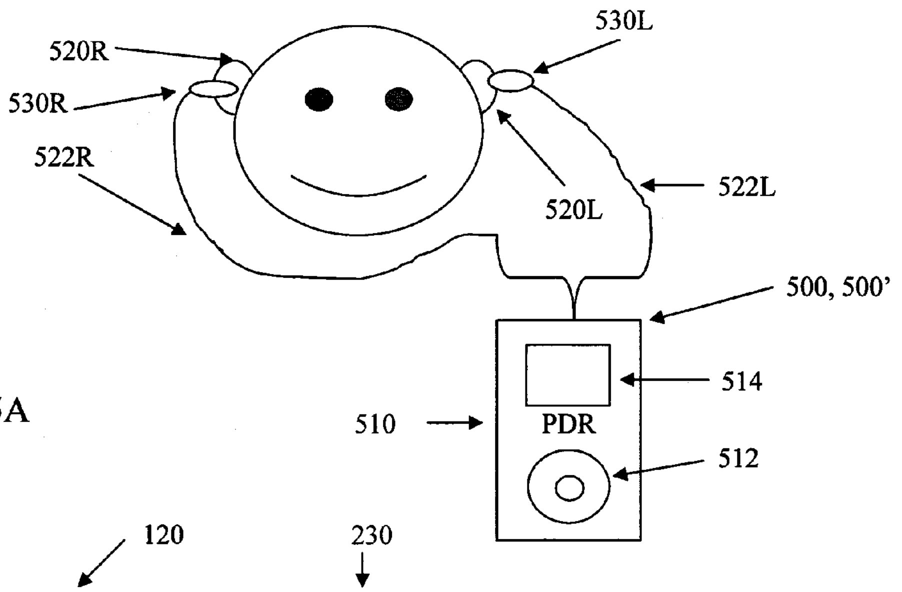
FIG. 3 is a schematic diagram of an example personal wireless device useful in the example venue of FIG. 1.
Figure 4:
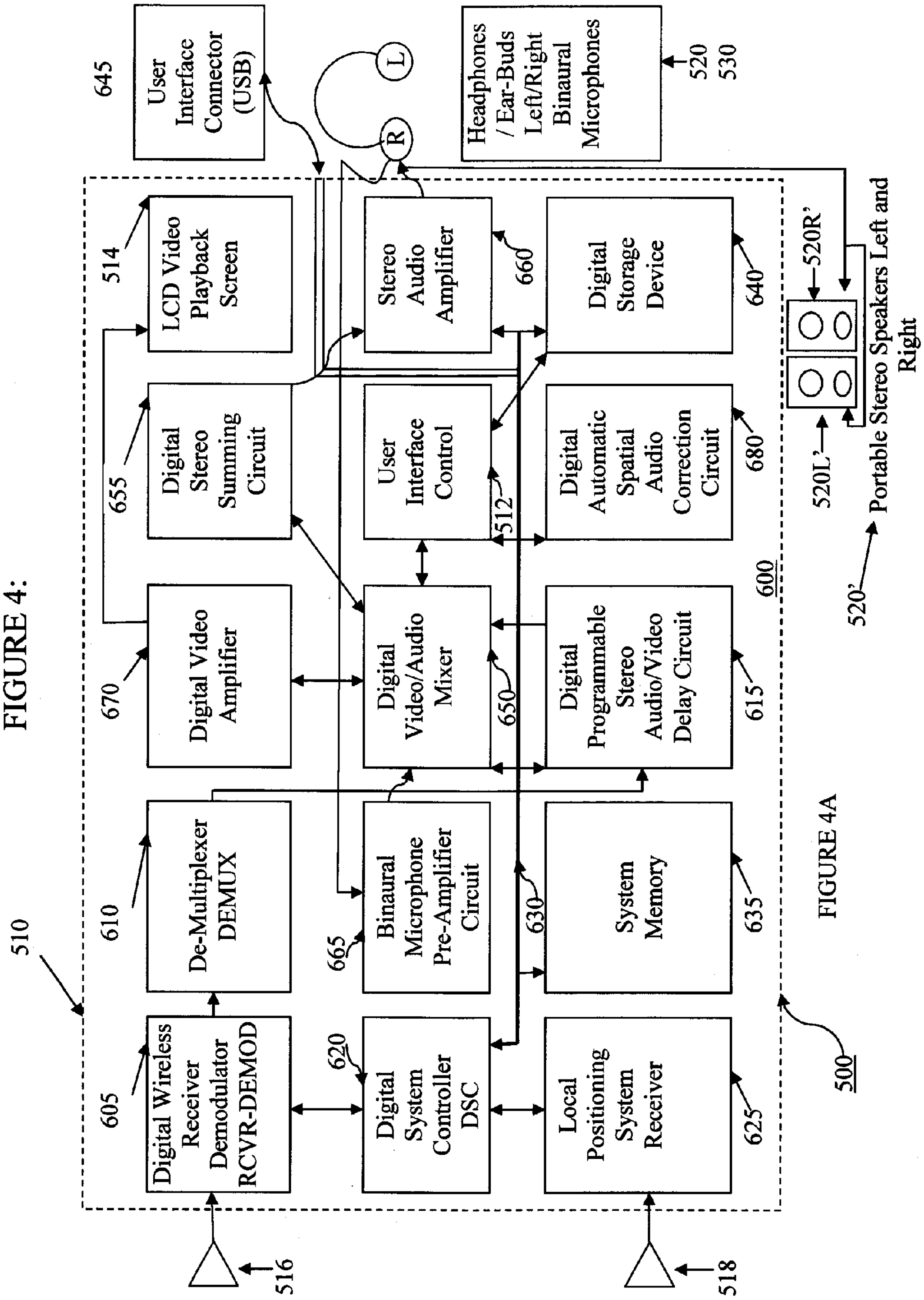
FIG. 4 includes FIG. 4A which is a schematic block diagram of an example embodiment of the personal wireless device arrangement of FIG. 3 and FIGS. 4B and 4C which are schematic block diagrams of example alternative embodiments thereof.

FIG. 3 is a schematic diagram of an example personal receiver 500, 500' useful in the example venue 100 of FIG. 1 and FIGS. 4A, 4B and 4C of FIG. 4 are schematic block diagrams of example embodiments thereof. Receiver 500, 500' preferably includes a housing 510 containing the electronic circuitry, preferably digital circuitry, for receiving and processing signals transmitted from transmitters 220, 222, 230, and an audio reproduction device 520 such as a loudspeaker, ear phones, ear bud, ear mold, headphone, or another audio device or transducer, herein usually referred to as headphones, preferably having separate outputs 520L, 520R for reproducing left and right stereo audio. Left and right headphones 520L, 520R preferably each have a respective microphone 530L, 530R, e.g., binaural microphones 530, associated therewith for picking up the ambient sound at the user's ear regions, e.g., ambient sound in stereo. Binaural microphones 530 may be attached to headphones 520 or may be integrated therewith, as is usually preferred.

Housing 510 includes a control 512, e.g., a thumb ring, thumb wheel, control wheel, five-way rocker switch, touch sensitive display screen, or other input device, by which a user may input commands and/or data, and a display screen 514, e.g., an LCD, OLED, LED, or other display for text and/or graphics, by which information, data, graphics and/or video may be displayed for a user. Preferably, control 512 includes a thumb wheel which is designed to respond to thumb or finger rotation on an actuation surface and to pressure (depression) to activate and/or select audio and optionally video mixing and system controlling parameters for controlling audio and video functions of receiver 500, 500'. Typically, an electro-mechanical control wheel or thumb wheel 512 is mounted and set flush with housing 510 below or next to LCD or other display 514 of personal receiver 500, 500'.

Headphones 520 and binaural microphone 530 typically communicate with housing 510 via wires or cables 522L, 522R, or alternatively, via a wireless link, such as a Bluetooth or other link, preferably a digital wireless link, although an analog link can be employed. Where a digital communication link is employed, it would seem advantageous that such link be digitally encoded and/or access protected so that only authorized wirelessly-linked headphones 520 may be utilized with a given authorized receiver 500, 500', as might be advantageous for preventing one receiver 500, 500' for which authorization has been obtained to broadcast program data to plural wireless headphones, for all or some of which proper authorization has not been obtained.

Housing 510 includes electronic circuitry 600 therein that may collect and store:

(1) Preprogrammed data representing venue 100 in two and optionally in three dimensions (e.g., from 2-D and 3-D CAD drawings, plans and/or maps, or other digitized representation thereof, with or without acoustic properties and/or acoustic modeling of venue or space 100 and/or of any sound transducers 210, 212 therein), (2) Atmospheric data (temperature and optionally humidity and/or barometric pressure), (3) Location information relating to signals from corresponding transmitters 220X, 220Y, 230, 222X, 222Y, and/or other location finding devices, (4) Digital data, program data and authorization data from ones of transmitters 220, 222, 230, and (5) Binaural microphone signals from binaural microphones 530 placed on left and right listener headphones for their left and right ears.

Wireless signals are received at a receiving device, e.g., at antenna 516 and 518 where wireless RF transmission is employed. Receiver-demodulator 605 receives and demodulates the received wireless signals from antenna 516 which are de-multiplexed by demultiplexer 610 to extract the digital audio program data, and the optional digital video program data, which are communicated to programmable digital delay circuit 615 which delays the audio program data and the optional video program data by a programmable time determined, e.g., by controller 620. Circuitry 600 includes a digital clock for providing date and time data and for providing timing signals; and such digital clock may be provided by digital system controller 620 or by another element of circuitry 600.

Wireless locating signals may be received at a receiving device, e.g., at antenna 518 where wireless RF transmission is employed. Local positioning system (LPS) receiver 625 receives and decodes the received wireless locating signals which are communicated to controller 620. Receiver 625 may determine the location of personal receiver 500, 500' by comparing the timing and/or phase of the received locating signals, or the relative arrival times thereof, or by triangulation, or by a trilateralization process, or by a local positioning device, or by a global positioning system (GPS) system, or by any other suitable means. Digital controller 620 cooperates with receiver 625 for controlling receiver 625 and for receiving location data therefrom, and for determining the location of personal receiver 500, 500' in venue 100, and its distance from the nearest of loudspeakers 210L, 210R, 212L, 212R in the example shown, and may also determine movement thereof (e.g., provide motion detection) by determining changes to location over time.

While separate antennas 516, 518 are illustrated, reception may be provided by any one or more antennas. Where antennas 516, 518 both receive signals that are relatively close in frequency, one antenna may be used for both functions. If beacon transmitters 220, X, 220Y and/or 230 were to transmit at substantially different frequencies, then separate antennas may be provided for receiving the X, Y and Z locating signals. In any case, antennas may be provided in receiver 500, 500' is any suitable manner, e.g., on a headband associated with headphones 520, and separate antennas may be provided at the left and/or the right sides of headphones 520 and/or at housing 510, or wires 522L and/or 522R could serve as one or more antennas or antenna elements.

Controller 620 is preferably a digital system controller that processes received data and controls the elements of circuitry 600 via digital instructions and data communicated via digital data bus 630. Controller 620 may be a microprocessor, digital signal processor, or other digital control circuit, or another circuit having programmable and/or programmed calculating and logic functions, and may be a generic processor or a custom processor for receiver 500, 500', as may be convenient and desirable. Instructions for operation of controller 620 may be programmed therein, e.g., in PROM or other permanent or re-programmable memory, or may be in whole or in part stored in cache memory 635 and/or in storage device 640 and read as needed.

Controller 620 may utilize venue drawing, plan and/or map data stored in system memory cache 635 (e.g., which may be RAM and/or PROM memory) and/or in digital storage device 640 (e.g., which may be a miniature hard drive or large capacity RAM where recording of the audio and/or video program is provided for) for determining the location. If the location of personal receiver 500, 500' is within predetermined boundary 120 of venue 100, or is within a predetermined portion thereof, then controller 620 may enable circuitry 600 to receive, process and reproduce the audio program and optionally the video program. Data, e.g., pre-authorization data and venue plan/map data, and/or recorded program data, may be communicated to and from circuitry 600 via a user interface such as USB port 645 and data bus 630 under control of digital controller 620.

Receiver demodulator 605 may also communicate any received authorization data to controller 620 which processes such data for determining access rights authorized and for enabling and/or disabling elements of circuitry 600 in accordance with the authorization data. At the basic level, controller 620 verifies from an IP address or an ESN confirmation that reception of a broadcast program is permitted, and if so, enables receiver 605 and/or delay circuit 615 to process such program data. If not, controller 620 can block program data, e.g., either at receiver 605 or at delay circuit 615, and/or can block LPS receiver 625 from locating receiver 500, 500' from transmitted locating signals. LPS receiver 625 may be activated for locating receiver 500, 500' only when digitally time-stamped data packets contain data that has also been preprogrammed and pre-stored on storage device 640 of personal receiver 500, 500', e.g., by the event proprietor or broadcaster. Time-stamped data packets may also be utilized to signal controller 620 to allow transmitted program content to flow through the various elements of personal receiver 500, 500'. Typically an IP address or other unique identifier for a particular receiver 500, 500' would be permanently stored therein, e.g., in receiver 605, in controller 620, or in memory 635, in its manufacture and/or initial set up.

More complex authorizations may include combinations of authorizations and pre-authorizations for any particular event. In such case it may be necessary to program personal receiver 500, 500' with a special per concert or special event "In Attendance Ticket Number." This concert or special event "In Attendance Ticket Number" would correspond to a ticket for the same concert or special event and/or to a seat number in a given concert or special event venue 100, ensuring that a user must also purchase a ticket to the concert or event where a payment and ticket is required for attendance and/or to use a receiver 500, 500' at such event. A user would then have his "In Attendance Ticket" scanned upon arrival at the concert or event to obtain the ticket number thereof and also have his receiver 500, 500' scanned by event personnel to obtain the identifying number thereof and the ticket number stored therein. If this scanned ticket number and receiver 500, 500' information matches, it would be digitally stored and communicated to a broadcast programming computer, e.g., the computer of combiner 280, which compiles a list of valid "In Attendance Ticket Numbers" in attendance at venue 100. Upon activation prior to the concert or event, broadcast computer 280 will provide and transmitter 220 will transmit the compiled valid "Approved and In Attendance Ticket Numbers" authorization data.

Figure 3A:
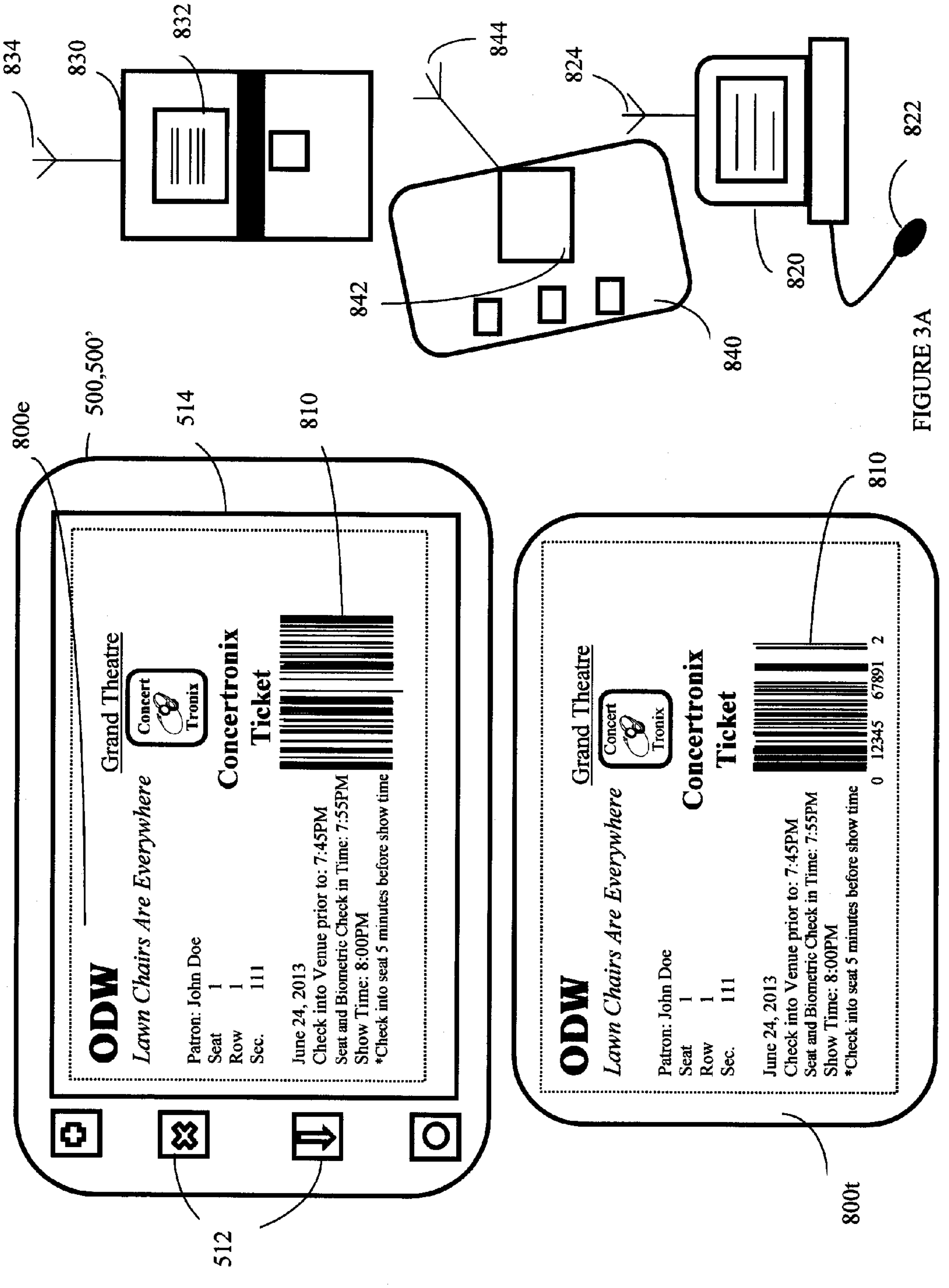
FIG. 3A is a diagram of a tangible ticket and an electronic ticket usable therewith.

Referring to FIG. 3A which is a diagram of a tangible ticket 800*t* (e.g., paper ticket 800*t*) and an electronic ticket 800*e* (e.g., an image on display 514 of personal device 500, 500'). E-ticket 800*e* is typically provided as an image on the display 514 of a personal receiver 500, 500' that is generated from ticketing and/or authorization data that has been communicated to device 500, 500' either by a wired connection, e.g., as by a USB or other cable 822 connecting device 500, 500' for communication with a computer 820 or other ticketing device 820, or by a wireless communication 824, e.g., an optical or radio frequency communication. Ticket 800*e*, 800*t* scanning and/or purchase and/or communication relating thereto may employ a kiosk 830 which includes a reading device 832, e.g., a scanning device and/or other reading device, e.g., a wireless reader, and may communicate via a wired connection and/or a wireless link, e.g., via antenna 834. Viewing screens 840 in the venue may include wireless communication devices 842 that communicate via antenna 842 with personal devices 500, 500' to verify the ticketing and/or rights thereof (including being in an authorized location) and if verified and/or validated, to wirelessly communicate an authorization to wireless device 500, 500' which is thereby enabled to receive, process, reproduce, record or store and/or replay program data in accordance with the authorized rights. Communication may employ any suitable form of modulation and format, e.g., AM, FM, phase modulation, CDMA, TDMA, spread spectrum, WiFi, Bluetooth, Zigbee, 3G, 4G, LPS, and the like, although a digital signal format is often preferred.

Each of tickets 800*e*, 800*t* includes data that define the rights and/or authorizations associated therewith, wherein certain data is presented in a human readable form, e.g., as alpha-numeric characters and symbols and/or icons or other graphic indicators, and wherein certain data is presented in a machine-readable form, e.g., as a barcode, a 2-D barcode and/or other representation. By way of example, information presented in human readable form might include the name of the program, e.g., of a concert or event (e.g., "Lawn Chairs Are Everywhere"), the venue and/or location thereof (e.g., the "Grand Theater"), the date and/or time thereof (e.g., "Jun. 24, 2013"), an identification (e.g., section, row, seat) of a seat and/or particular area therein, the name or other identifier of the person ("Patron" "John Doe") to whom the ticket was issued, identification of a sponsor and/or promoter (e.g., "Concertronix"), an identification of a performer or artist (e.g., "ODW"), and the like.

Also by way of example, the barcode 810 may encode a numerical value that represents some or all of the human readable information and/or additional information relating to the ticket and/or authorization, or may encode a numerical value that represents a record in a table or database which contains the information relating to the ticket and/or authorization, as may be convenient. Barcode 810 may be or represent an "In Attendance Ticket Number" and if verified, an "Approved and In Attendance Ticket Number," as described. Barcode 810 may have, but need not have, a human readable form of the number it represents, e.g., "0 12345 67890 2" displayed in proximity thereto.

E-Ticket 800*e* or physical ticket 800*t* may be presented at an access point to a program (e.g., at a gate or entrance to an event or concert) and scanned by a reading device, e.g., a barcode reader or ticket reader, that captures the barcode number either from the ticket image 800*e* or from the physical ticket 800*t* and communicates that information to a ticketing computer which verifies the authenticity of the ticket and then, if the ticket is valid, grants access in accordance with the rights and/or authorizations purchased by the ticket holder. In addition, rights and/or authorizations for a particular personal device 500, 500' may be controlled in conjunction with the locating function thereof so that the rights and/or authorizations obtained may include physical location limitations, time limitations, feature limitations, and the like so that personal device 500, 500' will operate to receive and enable reception and/or reproduction and/or storage and playback of program data only in accordance within the program, physical location, time and feature rights and/or authorizations that have been purchased and/or obtained.

It is noted that, as described herein, rights and/or authorizations, e.g., tickets, may be purchased and/or obtained either prior to a program, e.g., an event or concert, and/or may be purchased and/or obtained during a program, e.g., an event or concert, so that a ticket holder can change the rights and/or authorizations already obtained and/or may obtain additional rights and/or authorizations as he or she may desire. In such instance, the obtaining and/or purchasing transaction may be conducted via wireless communication between the personal wireless receiver 500, 500' and a ticketing computer, website, or other ticketing device 820, 830. Communication for conducting such transaction may employ any suitable form of modulation and format, e.g., AM, FM, phase modulation, CDMA, TDMA, spread spectrum, WiFi, Bluetooth, Zigbee, 3G, 4G, LPS, and the like, although a digital signal format is often preferred.

Controllers 620 of personal receivers 500, 500' receiving the digitally transmitted "Approved and In Attendance Ticket Numbers" authorization data will compare its own "In Attendance Ticket Number" from memory 635 with the received transmitted "Approved and In Attendance Ticket Numbers." If there is correspondence, system controller 620 will confirm that the appropriate authorization is present, and then will permit circuitry 600 to process the signals containing the transmitted program content (audio and/or video, as the authorization may be) of the program, e.g., a concert or special event, in accordance with the actual authorization. Optionally, the foregoing authorization and confirmation may also include obtaining and storing the identifying data (e.g., a unique serial number, an IP address and/or an ESN confirmation) for receiver 500, 500' via USB port 645 when the ticket is procured, and further verifying correspondence of the stored receiver identity with that of the receiver 500, 500' presented and scanned upon arrival at the concert or event.

The foregoing would allow the concert/event proprietor or operator to charge separate and distinct fees for different levels of access, e.g., for receiver 500, 500' to receive the audio program (e.g., listen only, L+R stereo), for receiver 500, 500' to receive a multi-track stereo audio program (e.g., listen and adjust only, upgrade from L+R stereo), for receiver 500, 500' to receive the video program (e.g., view only), for receiver 500, 500' to receive the audio and video programs (e.g., listen and view), for receiver 500, 500' to record the stereo audio program, for receiver 500, 500' to record the multi-track audio program, and/or for receiver 500, 500' to record the video program. Whether to, e.g., view only, or to listen and/or view the program, to record the audio program, this sign up and or purchasing of programming may be executed prior to or during the broadcast event of said program or programs.

In addition, the time period for which a personal receiver 500, 500' is activated responsive to authorization signals may be controlled either by requiring periodic re-authorization from re-transmitted authorization codes or by a programmed time, as might be included in the ticket number data. It is noted that data transmitted to personal receiver 500, 500' is typically and preferably in a digital format, such as digitally time stamped data packets. Controller 620 is programmed to respond to and decode such data packets and the information contained therein. Pre-programmed time data packets may also signal controller 620 in a receiver 500, 500' to shut down all processing when a time window for program reception has expired for a particular program or concert.

When controller 620 enables operation, LPS receiver 625 computes its physical location, optionally including elevation, with respect to a predefined venue 100 for a concert or special event, and may periodically re-compute its location, e.g., by comparing its real time computed location against a pre programmed 2 or 3 dimensional CAD drawing/map of venue 100 which typically is stored in memory storage device 640.

Personal receiver 500, 500' then may compare its computed location relative to the CAD drawing/map of venue 100 relative to the distance and elevation of receiver 500, 500' from the pre-programmed loudspeaker locations stored as part of the CAD drawing/map of venue 100, e.g., the locations and acoustical characteristics of the loudspeakers may be represented therein providing in effect a virtual acoustical model or representation thereof. Loudspeaker location information of the CAD drawing/map typically includes 2 or 3 dimensional information relative to loudspeaker 210, 212 locations within venue 100, speaker coverage area of each loudspeaker 210, 212, designations of any type or part of the audio program being reproduced by each loudspeaker 210, 212, each of which may include left, right, left rear, right rear, sub-bass, center-channel, front or mono, and/or rear or mono audio program tracks, whether direct or delayed, e.g., in a stereo, quadraphonic and/or surround sound arrangement.

Personal receiver 500, 500' then may compute therefrom the distance and elevation to each loudspeaker 210, 212 in venue 100, and may determine the distance receiver 500, 500' is from the nearest left and right loudspeakers 210, 212, or from greater volume loudspeakers 210, 212 relative to the actual acoustical sound field at the location of receiver 500, 500'. This determination may be generalized or may take into account the various channels of audio reproduced by the various loudspeakers, such as stereo audio, quadraphonic audio and/or 4.1, 5.1, 7.1 or greater surround sound. Receiver 500, 500', and specifically controller 620, then determines the electronic signal delay or delays to be applied to the wireless broadcast program from receiver 605 and demultiplexer 610 for the purpose of reproducing the broadcast wireless audio program in earphones 520 in relative synchronization with the audio heard from loudspeakers 210, 212 in the acoustical listening area of receiver 500, 500', thereby to enhance the audio program for the listener/user of receiver 500, 500', e.g., by a common delay time and/or by specific delay times relating to the various channels or tracks of audio program data.

It is noted that both left and right stereo audio channels (or plural track audio, or quadraphonic and/or surround sound audio) can be delayed by the same time, e.g., the propagation time from the nearest loudspeaker 210, 212, as is the typical implementation, however, the left and right stereo audio channels (or left and right channel plural track audio and/or quadraphonic and/or surround sound audio) can be delayed by different times, e.g., the left channel stereo audio (left channel plural track audio or quadraphonic and/or surround sound audio) may be delayed by the propagation time from the nearest left channel loudspeaker 210L, 212L, and the right channel stereo audio (right channel plural track audio or quadraphonic and/or surround sound audio) may be delayed by the propagation time from the nearest right channel loudspeaker 210R, 212R, thereby to provide even more precise time alignment of the left and right channel audio (or plural track audio, or quadraphonic and/or surround sound audio) as reproduced by receiver 500, 500' with the natural left and right channel natural sound arriving from the closest left channel loudspeakers 210L, 212L and right channel loudspeakers 210R, 212R, respectively.

Substantially simultaneously, controller 620 receives local atmospheric data relative to venue 100 as transmitted by one or more of transmitters 220, 222, 230, either from receiver demodulator 605 or from demultiplexer 610 (e.g., via delay circuit 615). Controller 620, or alternatively programmable digital delay circuit 615, utilizes the received current atmospheric data to compute the actual speed of sound in venue 100, and from the computed actual speed of sound and the distance to the nearest loudspeaker 210, 212, computes the time required for sound to propagate from the nearest loudspeaker 210, 212 to receiver 500, 500'.

The signal delay computed represents the stereo audio delay needed to be applied at individual stereo earphones 520 to align in time the broadcast program from transmitters 220, 222 and the natural sound as propagated from "virtual" loudspeakers through the air in venue 100, which is a true representation of the real physical loudspeakers 210, 212 within venue 100 determined from the determined location of receiver 500, 500' within the 2 or 3 dimensional venue 100 and the computed actual speed of sound in venue 100 relative to atmospheric data at that given time. Because the space 120 may be represented by drawings and/or maps and/or plans stored in memory 635, and/or storage device 640, e.g., and so can be considered a virtual space, individual loudspeakers may be represented by their respective locations in space 120 and by their respective acoustical/sound reproduction characteristics, whereby the loudspeakers may be represented as virtual loudspeakers (sound transducers) in the virtual space represented by the stored drawings and/or maps and/or plans.

Programmable digital signal delay circuit 615 applies the computed delay time to audio program data and optionally to data and video program data, thereby to obtain substantial time alignment between the reproduced audio (and optionally video) broadcast program at headphones 520 and the natural sound from the nearest of loudspeakers 210, 212. The determined delay time is stored, e.g., in delay circuit 615 or in memory 635 or both, and may be retrieved as needed. As the location of receiver 500, 500' is periodically determined, and/or as the actual atmospheric data may change, processor 620 recalculates the appropriate delay time and updates delay circuit 615, so that the time alignment is maintained as the user may move around in venue 100 and as the local weather may change.

It is noted that the delay time for video data may typically be substantially the same as the delay time for audio data, e.g., by selecting the shortest delay time computed for either left channel or right channel audio with respect to the nearest loudspeaker 210, 212 as described above. Thus, the same delay may delay the video data so that the video display will be in synchronism with the delayed audio data as reproduced in headphones 520. Further the same delay will typically be applied to the data transmitted, if any.

It is also noted that while it is generally satisfactory to delay all channels and/or tracks the audio by the same delay time determined with respect to the nearest loudspeaker 210, 212, different channels and/or tracks may optionally be delayed by different times so that, e.g., left channel stereo audio may be delayed by a time determined relative to the nearest loudspeaker 210L, 212L reproducing left channel audio sound and right channel stereo audio may be delayed by a time determined relative to the nearest loudspeaker 210R, 212R reproducing right channel audio sound. As a result, both audio channels would be reproduced in the respective earphones of headset 520 substantially simultaneously with the natural sound arriving for the respective left and right channel loudspeakers 210L, 210R, 212L, 212R. Further, such different delay times may likewise be determined and applied with respect to the audio channels of stereo sound, quadraphonic sound and/or surround sound, as the case may be.

Programmable digital delay circuit 615 includes sufficient memory, e.g., RAM, shift registers, and the like, to store audio data, text data, and/or video data for a time that is at least the maximum anticipated delay for a venue 100. If receiver 500, 500' is for use in a theater or arena venue, e.g., a venue 100', 100", then the time delay will likely be 200 milliseconds or less and so the required memory capacity is quite modest. If receiver 500, 500' is for use in a large outdoor venue, e.g., a venue 100, then the time delay could approach three seconds and so the required memory capacity is substantial. Digital delay circuit 615 includes memory for at least two channels of audio, e.g., stereo audio, and may accommodate plural track, e.g., six or eight track, audio, and may include memory to store several or many fields or frames of video data, e.g., up to 90 fields for a large venue. It is noted that because display 514 may be relatively small, e.g., an about 2 inch by 3 inch or smaller LCD display, low resolution video would be satisfactory and the required memory capacity could be reduced accordingly. Even larger displays, such as an about 4.5 inch diagonal display of a smart phone or an about 10.5 inch diagonal display of a tablet or net book computer, can be accommodated with reasonable memory capacity. If it were desired to store full resolution video, however, then video data could be stored on a miniature hard drive such as storage device 640.

In the alternative venue arrangement wherein transmitters 220X, 220Y are associated with loudspeakers 210L, 210R, respectively, and broadcast the program audio associated with that particular loudspeaker, and/or wherein transmitters 222X, 222Y are associated with loudspeakers 212L, 212R, respectively, and broadcast the delayed program audio associated with that particular auxiliary loudspeaker, receivers 500, 500' may select the program audio broadcast by the transmitter 220X, 220Y, 222X, 222Y associated with the ones of left and right loudspeakers 210L, 210R, 222L, 222R that it has determined are nearest, and so need only delay the program audio and/or video therefrom by a time determined from the actual speed of sound and the distance to the nearest speaker or speakers, thereby reducing the delay time needed and the capacity of the receiver 500, 500' delay circuit 615 that stores the program audio and/or video for that delay time.

Digital Audio/Video Mixer 650 receives plural tracks of delayed audio data and optionally receives delayed video data from digital delay circuit 615 and provides facilities for user control of the audio program and optionally the video program. Audio/video mixer 650 is controlled by user interface 512, e.g., via a electro-mechanical control wheel or thumb wheel 512, and also communicates inputs from control 512 via data bus 630 to processor 620 and optionally to others of elements 615-680. Mixer 650 may be implemented by computer instructions (software) controlling a digital processor or by a special purpose integrated circuit.

Mixer 650 responds to user inputs from user interface control 512 for allowing the user to adjust reproduction of the audio program, including, e.g., audio volume, audio dynamics, tone, and/or equalization of at least two stereo audio channels, and optionally plural tracks of stereo audio, of the wireless broadcast audio program in headphones 520. Such control 512 may be exercised, e.g., separately as to each channel of the stereo audio as reproduced by headphones 520 and/or as recorded by storage device 640, as to each track of plural track program audio as reproduced by headphones 520 and/or as recorded by storage device 640, and/or as to the optional program video as reproduced by display 514 and/or as recorded by storage device 640, as may be enabled in the manufacture and/or programming of receiver 500, 500' and/or as desired by a user.

User control 512 also allows a user to input commands and/or data for controlling and/or adjusting the functions, features and other operation of personal receiver 500, 500' that are user controllable and/or adjustable. For example, optionally, user interface control 512 also allows user selection and control of display 514 including when display 514 is utilized as a video screen 514, e.g., for displaying and not displaying the video program, for adjusting, color and/or tint, brightness, contrast, sharpness, and the like.

Digital/Audio Mixer 650 provides mixed audio signals/data, which may be stereo audio or plural-track audio, to stereo audio summing circuit 655 which combines the various audio channels and/or tracks, e.g., by summing or by a more complex function, into left and right channel stereo digital audio which is provided to amplifier 660 which amplifies and applies the left and right channel stereo audio to the left and right speakers, respectively, of headphones 520 and/or to optional left and right portable stereo speakers 520L', 520R', which may be separate speakers or may be contained in housing 510. Amplifier 655 may include digital stereo amplifiers followed by respective digital-to-analog (D/A) converters or may include an digital-to-analog (D/A) converter followed by analog stereo amplifiers, as desired.

Mounted to or on or nearby the respective left and right speakers of headphones 520 are a pair of binaural microphones 530 for picking up the ambient sound proximate the respective ears of a user wearing headphones 520. Signals from left and right microphones 530L, 530R of binaural microphone 530 are respectively amplified and digitized by binaural microphone pre-amplifier circuit 665 which may preferably include analog pre-amplifiers followed by an A/D converter, but which may include A/D converters followed by digital amplifiers. Amplified binaural (stereo) ambient sound data from pre-amplifier 665 is coupled to digital audio/video mixer 650 wherein it may be adjusted in level and/or mixed with the stereo audio and/or plural track audio data from delay circuit 615. Mixer 650 may adjust the level of ambient sound either according to a pre-determined adjustment and/or in response to user inputs via user control 512.

Because the ambient sound includes program audio that is delayed in propagating through the atmosphere from loudspeakers 210, 212, the binaural ambient sound and the audio program sound from the wireless broadcast delayed by delay circuit 615 are substantially in time alignment at the output of mixer 650, and as reproduced by headphone 520. It is noted that the ambient sound picked up by binaural microphones 530 may be employed to introduce ambient sound into what the user hears at headphone 520, and may or may not be employed to determine a time delay to be applied to time align the wirelessly broadcast program audio and/or video with the natural sound.

This arrangement allows compensation for the attenuation of the ambient sound inherent in using headphones, ear buds and similar speakers 520 that reduce the level of ambient sound reaching the ear, either automatically or in response to user inputs via control 512, and also allows for automatic adjustment of the reproduced audio at headphone 520. A user may use control 512 for adjusting the respective levels of the program audio as received via the wireless broadcast and of the ambient sound as reproduced from binaural microphones 530 so as to hear a desired (subjective) pleasing combination thereof, e.g., of the relatively "pure" wireless program audio and of the natural sound at the user's location in venue 100, 100', 100". This allows for customization according to individual preferences, e.g., where one person might prefer to emphasize the wireless program audio over the ambient sound, and where another person might prefer to amplify the ambient sound to overcome the attenuation of headphones 520 while hearing the wireless program audio at a lower level. It also allows a user to set a level wherein conversation of nearby people picked up by microphones 530 can be heard via headphone 520 and conversation conducted, if desired.

This arrangement also allows system/circuit 600 to automatically determine the relative ambient sound pressure (including audio from loudspeakers 210, 212 and other sounds) from the levels of the signals produced by binaural microphones 530 (as representative of that being heard by each ear of the listener), to then reproduce the synchronized wireless audio program and the binaural microphone sound (which are in synchronism (time alignment) with sound produced by near ones of loudspeakers 210, 212 by operation of delay circuit 615) at respective levels approximating the sound pressure level of the ambient sound/loudspeaker sound in the user's location in venue 100, subject to any adjustment a user might make using control 512. Thus an automatic volume control feature may be provided so that the level of audio reproduced by headphones 520 is increased and decreased automatically as the level of the ambient sound increases and decreases, thereby to reduce the likelihood of local noise interfering with enjoyment of the event. So as to naturally blend in the wireless transmitted program sound and binaural (local sound) with the sound emitting from said loudspeakers for listener of personal receiver.

User control 512 may also be employed to adjust, if desired, the basic dynamics of binaural microphones 530 and signals from microphones 530 may be blended by mixer 650 into the left & right stereo summer 655 output of the left & right wireless audio broadcast, if desired, and may control recording of binaural microphone 530 signals, wireless program audio, and optional video, to audio/video storage device 640, including storing program audio as individual audio tracks for re-mixing, re-recording and playback at a later time, might be desired, e.g., for receiver 500, 500' serve as a Karaoke device.

The video output from digital audio/video mixer 650, if available and authorized may be provided to digital video amplifier 670 which amplifies and conditions the video signals as required for display on display 514 or on a separate LCD video monitor playback screen. Thus the performance/program may be viewed on display 514 in time alignment with the program audio sound as reproduced by loudspeakers 210, 212, by headphones 520, and/or by portable speakers 520'.

Mixer 650 and digital storage device 640 are interconnected so that audio data (wireless program audio, plural track audio, and/or binaural microphone 530 audio) and optionally video program data produced by mixer 650 may, if authorized, be recorded on storage device 640. Further, audio data (wireless program audio, plural track audio, and/or binaural microphone 530 audio) and video program data stored on storage device 640 may, if authorized, be played back from storage device 640 via audio/video mixer 650. Played back audio and/or video may be reproduced via headphones 520, portable speakers 520' and display 514, as applicable, and/or exported via interface 645 to a suitable external device, such as a stereo or other system, video display, computer, video player, and the like, to the extent such is authorized. Thus the performance/program may be heard and/or viewed on an external device as may be convenient and desirable.

Typically, the function of recording program audio and/or video must be enabled by an event operator or broadcaster and be programmed into personal receiver 500, 500', usually in advance of a concert or event, e.g., by the operator or broadcaster thereof transmitting authorization data to systems controller 620 via USB interface 645 or by wireless transmission via receiver 605. Typically, authorizations are verified by controller 620 checking the authorization data against receiver 500, 500' data stored in memory cache 635, e.g., an IP address or ESN confirmation, before program audio and/or video can be recorded by receiver 500, 500', e.g., on storage device 640. Moreover, the wireless transmitter at the program, e.g., concert or event, preferably broadcasts digital data packets to personal receivers 500, 500' in real time at the concert or event to enable the properly authorized personal receivers 500, 500' to record an event, a particular song and/or an entire program, in accordance with the authorization, and other receivers 500, 500' without proper authorization data stored therein will be unable to record.

Upon the approval by an operator or broadcaster of one or more authorizations of rights granted for a personal receiver 500, 500' to record a performance, the record program function of circuitry 600 will be enabled by system controller 620, and a user must then select the approved record program function by selecting the appropriate audio and/or video channels and/or data/tracks that will be produced by mixer 650 for recording by digital storage device 640. Thereafter, a user may recall and/or reproduce the recorded audio/video data and/or tracks for re-mixing, reproduction and playback and re-recording at a later time, or may download same via USB interface 645.

Various recording options may be provided for recording program audio and/or video, e.g., in storage device 640, responsive to user inputs via control 512 and/or to authorization data whether pre-loaded via interface 645 or received wirelessly via receiver 605. For example, receiver 500, 500' may record the stereo program audio (preferably delayed for time alignment), plural track program audio (preferably delayed for time alignment), stereo ambient sound from binaural microphones 530, text, and/or program video (preferably delayed for time alignment). Each can be recorded as separate tracks, e.g., stereo audio as two tracks, plural track audio as a like number of tracks, binaural natural sound as two tracks, which would allow the user to later create, reproduce and record re-mixes and custom mixes in accordance with any applicable authorizations, and each of the foregoing may be recorded in its original form, as modified by user inputs, and/or as mixed in real time in response to user inputs.

In the foregoing circuit 600, data and instructions are communicated via digital data bus 630 among programmable digital audio/video delay circuit 615, digital system controller 620, system memory 635, digital storage device 640, USB or other user interface (connector) 645, digital audio/video mixer 650, digital/analog stereo audio amplifier 660, and digital automatic spatial audio correction circuit 680, and each of the foregoing includes appropriate input/output (I/O) circuitry as needed. The functions controllable by instructions and/or data communicated via data bus 630 may include any or all of audio volume, automatic volume control, stereo balance, audio track combination and weighting, audio program mixing, tone, binaural microphone 530 feed through, video display, audio recording and playback, video recording and playback, and the like.

Figures 4, 4B:
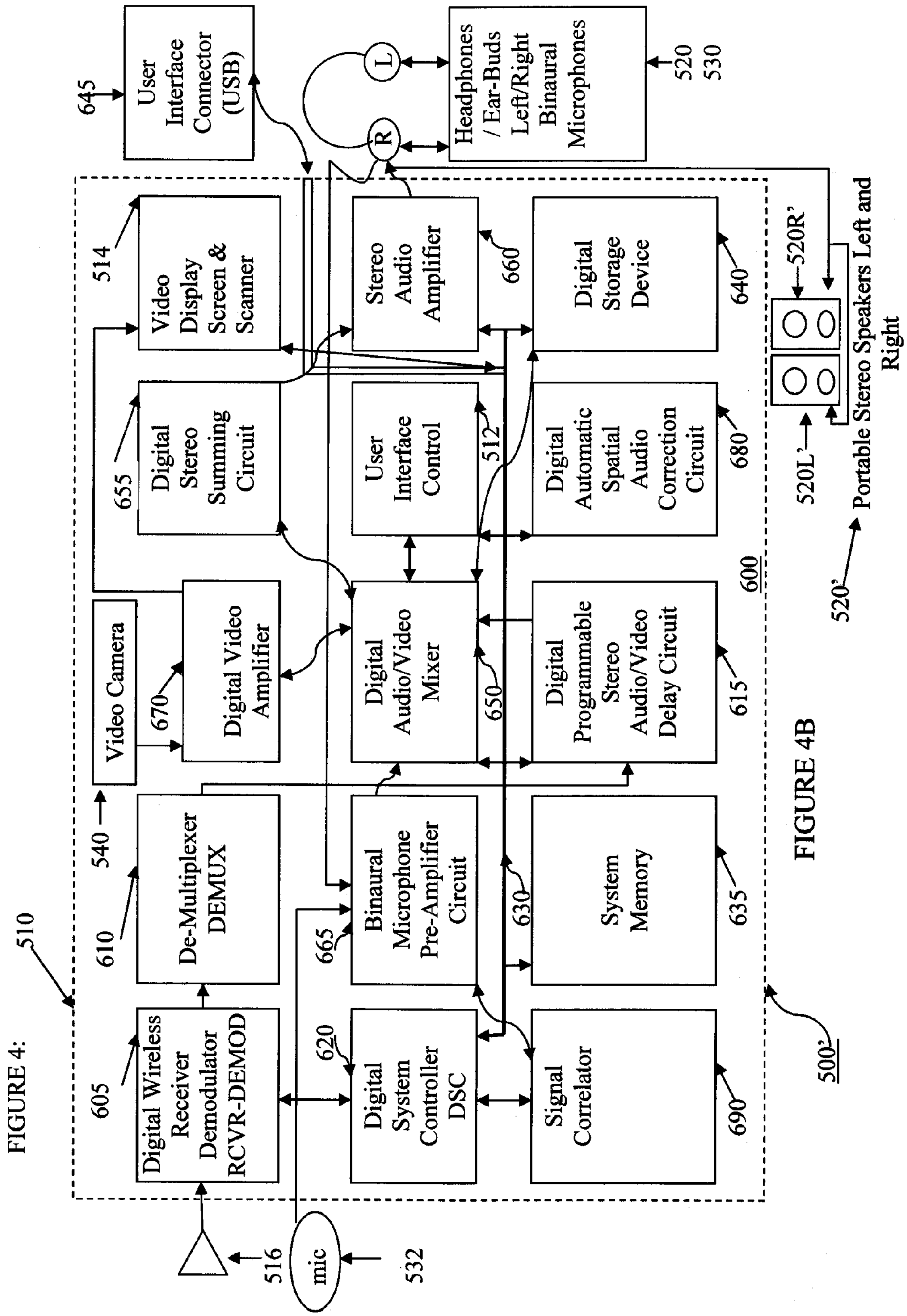

Referring to FIG. 4B, personal device 500' operates substantially as described in relation to device 500 of FIG. 4A with certain differences and features. One difference is in the manner in which personal device 500' determines its location and the delay time to be applied to delay the video program data. Once the time delay for the video program data is determined and the video data is delayed to substantially time align with the natural sound, the audio program data (and other data, e.g., text, local video images and the like) may be selected and/or delayed so as to be in substantial time alignment with the video data.

Natural sound carried in the air from the source to the location of device 500' is captured by an audio transducer 530, 532 associated with device 500', e.g., either binaural microphones 530 or a microphone 532 which may be an external microphone associated with personal device 500' or be a microphone that is part of personal device 500'. Natural sound picked up by microphones 530 and/or microphone 532, which is already delayed from the natural sound produced at its source by the actual speed of sound in the atmosphere under the atmospheric conditions then present at the venue, is amplified, e.g., in a preamplifier, such as preamplifier 665, which applies the amplified natural sound to signal correlator 690.

Video and/or audio program data received by receiver/demodulator 605 via antenna 516, is demultiplexed 610 and is applied via digital controller 620 to signal correlator 690. Signal correlator 690 determines by time correlation the time difference between the program audio data and the delayed natural sound and the difference in time determined by correlating the times thereof is substantially the delay in time experienced by the natural sound in traveling from its source to the location of personal device 500' via the atmosphere, and is the substantially delay corresponding to a number of video frames of delay to be applied to the program video data for displaying the program video data substantially in synchronization with the natural sound. Correlator 690 may initiate correlation and/or may correlate in response to: receiving of a wireless transmission, natural sound level, a change in natural sound level, frequency content of the received natural sound, a change in the frequency content of the received natural sound, a location of said wireless device, a change in location of said wireless device, a time, a time interval, an accelerometer, a motion detector, a compass, a manual actuation, an electronic actuation, or a combination thereof.

Signal correlator 690 may employ various correlation processes for determining the correlation in time between the delayed natural sound from the program source and the program audio data received via RF and/or optical transmission. The received natural sound is sampled so as to provide time sampled natural sound segments for being correlated with (e.g., compared with and matched to) time sampled segments of the audio program data to find the sampled time segments that match. The matched time segments are utilized for determining from the time difference between the arrival times of the matched time segments the time difference. The time difference therebetween is then processed by processor 620 to determine an integer number of video frames by which to time delay the video program data so that it will be substantially in time alignment (substantially synchronized) with the received natural sound at the location of wireless device 500, 500', which is possible because the timing data of the video and audio data is embedded therein or other wise known. For example, signal correlation circuit 690 may perform a comparison to find a match between the two related audio signals and/or data signals (and/or of samples thereof) employing digital clocking and comparison such as least mean squares (LMS) processing, dynamic time warping, hidden Markev modules, and/or combinatorially hashed time-frequency constellations, and/or other signal correlation processes, and/or a combination thereof.

The difference in the arrival times of the samples of program audio data received via RF transmission at antenna 516 and receiver 605 and the samples of delayed natural sound received via the atmosphere at microphone 630, 632 determined by correlator 690 is provided to digital processor 620 which determines therefrom the time, or the number of frames, that the video program data should be delayed so as to be substantially in time alignment with the delayed natural sound. In some instances, probably a minority of instances, the correlated delay time will be equivalent in time to an integer number of video frames, however, in most instances, the difference in time will be equivalent to an integer number of frames plus a partial or fractional frame time. Digital processor 620 determines from the time difference an equivalent number of video frames (which is in most instances a non-integer number of frames) the appropriate integer number of frames that the program video data is to be delayed so as to be substantially in synchronization (time alignment) with the natural sound arriving via the atmosphere.

This determination of the number of video frames of delay may comprise a calculation using the video frame rate and the difference in time determined from the correlated samples, or may comprise selecting from the synchronization data embedded in the program video data the video frame corresponding to the program audio sample that correlates with the natural sound sample using the time synchronization data encoded in the program audio sample, or may comprise another method.

Various processes may be employed by processor 620 for selecting the integer number of video frames by which to delay the program video data. One process is to simply round off the number of frames equivalent to the delay time to the closest integer value, e.g., so that if the partial frame is less than one-half frame, the number of frames is rounded down to the closest integer value, and if the partial frame is greater or equal to one-half frame, the number of frames is rounded up to the next highest integer value. Another process is to truncate the number of frames equivalent to the delay time to the next lowest integer value, e.g., so that if the partial frame is 0.01 to 0.99 frame, it is discarded (ignored). Where a high video frame rate is employed, the error introduced by the foregoing processes may not be noticeable to the average listener and the synchronization of the video and audio programs with the natural sound may be satisfactory. For example, with a 60 frames per second frame rate, the frame time is about 16.7 milliseconds and a difference in video synchronization with natural sound of about 8-16 milliseconds may still provide a satisfactory viewing experience to the viewer.

However, with lower frame rates, e.g., 24 or 30 frames per second, a sound to visual misalignment of up to about 20 or about 33 milliseconds may be noticeable, if not objectionable. Another process is to select the partial frame value between rounding down and rounding up to not be balanced, but to favor rounding down, which tends to slightly advance in time the program video data relative to the natural sound. For example, the number of frames could be rounded down if the partial frame value is 0.6 frame, or 0.75 frame, or another suitable value, so that the program video tends to slightly precede the delayed natural sound. Note that this accords with everyday experience, even when one person calls to another across a street or across a room, wherein the visual perception always precedes the aural perception because the speed of sound is much slower than the speed of light, and so reproducing program video data slightly earlier in time than an exact match produces a discrepancy that tends to be less noticeable and/or less objectionable.

Where device 500-500' is a personal device 500, 500', it may further include an on-board video imager 540 which may be capable of capturing still images and/or video images, e.g., a sequence of multiple images per second during a time period when it is enabled. Imager or camera 540 may be a high or low resolution imager and the images captured thereby a processed by video amplifier 670 and passed to video mixer 650 from where they may be displayed on playback screen 514 and/or stored in digital storage device 640 for later playback. Images captured by camera 540 may be stored instead of program video data and/or may be stored in addition to program video data depending upon the functional capability of device 500-500', the available capacity of storage 635, 640, and/or the authorizations received by device 500-500' for a particular program, e.g., concert or event, and/or location therein, and/or time period. The functionality of personal receiver 500-500' to enable and/or disable functions and/or features based upon location, time and/or authorizations obtained may be employed for controlling features of device 500-500' apart from its being utilized as a personal receiver at a program. Images captured by imager 540 may be utilized in verifying identity and/or for security, e.g., as a photographic ID device or by facial recognition or other processes.

Where device 500, 500' is a receiver employed with an auxiliary video display, e.g., a large screen display such as a JUMBOTRON® screen, a video wall, a video truck, a television, a monitor, a projection TV, or another large display, at which the program video is to be delayed before being reproduced, the selection of the number of frames of video delay may consider at least an additional factor. Because the size of the local viewing area in which persons will watch the video display thereon is itself large enough (e.g., may be several hundreds of feet) to produce a noticeable audio delay in the natural sound relative to the delay therein at the location of the video display, the time delay over that area may also be compensated for. Such receiver 500, 500' not only determines a delay time for its location in venue 100 and the venue source of natural sound, but would add additional delay time to account for the delay caused by the local speed of sound between a loudspeaker located with the large display and a predetermined location within the local viewing area.

Receiver 500, 500' determines the number of frames of video delay to be applied to the program video, including the determined delay time to the screen location as described above plus an additional delay time for the local viewing area delay before determining the number of video frames of delay to apply. The number of frames of video delay may be determined as described above. Processor 620 then applies such delay to delay circuit 615 so that the video produced by the auxiliary large screen display is delayed to correspond at a generally central location within the local viewing area in time alignment with the natural sound from a loudspeaker source 210 in venue 100, and then selects the audio program data that is time synchronized with the displayed delayed video program data to be reproduced by the associated auxiliary loudspeaker at the location.

It is noted that the delay applied to the video program data and to the audio program data need not be identical, but may be different so as to provide a more natural and acceptable viewing and listening experience to persons in the local viewing area of a large screen display. Alternatively, such receiver 500, 500' associated with a large screen display could include an external microphone 532 that is located in a desired relatively central location within the local viewing area for the large display screen in which case circuitry 600 would perform the video frame delay as described above for a personal device 500, 500'.

In any event, digital processor 620 processes the determined delay time to determine an integer number of frames by which to delay the program video data. This determined video delay is applied to delay circuit 615 so that the video reproduced at display 14 is delayed by the integer number of frames determined by processor 620. Because the video program data and the audio program data are always synchronized to each other, the audio program data is delayed by the same delay as the video program data, and not by the actual delay time as determined by correlator 690 and processor 620. This may be accomplished by delay circuit 615 actually delaying the audio program data or by digital audio/video mixer 650 simply selecting the proper audio program data based on the synchronization information thereof that corresponds to the synchronization information of the video program data.

The program data received via RF transmission includes both audio program data and video program data that are in a known time synchronized relationship with each other. Time synchronization can be provided by a composite video-audio signal in which the audio data is embedded and/or modulated in time alignment with the video data, and so the time synchronization thereof is inherent. Time synchronization can also be provided by a composite modulated signal in which the audio data is modulated in time alignment with the video data on the same carrier, and so the time synchronization thereof is inherent, as is the case with NTSC, PAL and other common television signal formats. Alternatively, program video data and program audio data could be transmitted and received separately, e.g., via separate carriers, each of which has embedded therein timing and/or synchronization data by which the audio and video program data can be time synchronized with each other. Alternatively, program video data and program audio data could be transmitted and received separately, e.g., via separate carrier signals, and the timing and/or synchronization data by which the audio and video program data can be time synchronized with each other could also be transmitted separately, e.g., via another carrier signal, wherein the three received signals are processed for timing and synchronization. Alternatively, synchronization may also be effected by using information retrieved from one or more Internet (IP) addresses, and/or by using a combination of any or all the described synchronization processes.

By way of example, if wireless device 500-500' is a personal wireless device 500-500', e.g., a smart phone, so that the user and personal device 500-500' are essentially co-located (e.g., less than about 3 feet (about 0.9 meter) apart), then the total delay applied to the program video data and/or program audio data is preferably an integer number of frames principally determined by the distance between the location of personal wireless device 500-500' from the predominating source of natural sound, irrespective of which of the described methods for determining the time delay of the natural sound may be employed. If that distance is, e.g., about 200 feet (about 61 meters), the delay may typically be in the range of about 4-8 video frames (depending upon the video frame rate) to be generally in satisfactory time alignment (synchronization).

By way of further example, if wireless device 500-500' is a wireless device 500-500' associated with a large screen video display that has a sound reproduction device, e.g., loudspeaker, therewith, then the video screen and the viewers thereof are not co-located and may be, e.g., on average, about 40-80 feet (about 12-24 meters) apart, then the delay applied to the program video data and/or program audio data relative to the location of the large video screen is preferably an integer number of frames, e.g., about 1-2 video frames. Where the large video screen is in addition a substantial distance from the program source, then device 500-500' will preferably introduce a delay of an integer number of video frames to the video program data, and that delay is approximately the delay determined by the combined distances of the large screen from the origin of the program plus a delay for the average distance between the viewers of that large video screen and that screen, irrespective of which of the described methods for determining the time delay of the natural sound may be employed. Taking the foregoing two examples together, if the program source to large video screen distance is, e.g., about 200 feet (about 61 meters), and the video screen and the viewers thereof are, e.g., on average, about 40-80 feet (about 12-24 meters) apart, then the total delay may typically be in the range of about 4-8 video frames plus 1-2 video frames, for a total delay of about 5-10 video frames (depending upon the video frame rate) to be generally in satisfactory time alignment (synchronization). In all these examples, it is preferred that the displayed delayed video program data and the natural sound arriving from a sound source be aligned to within less than 1-2 video frames at the respective locations of most, if not all, of the viewers.

Figure 4C:
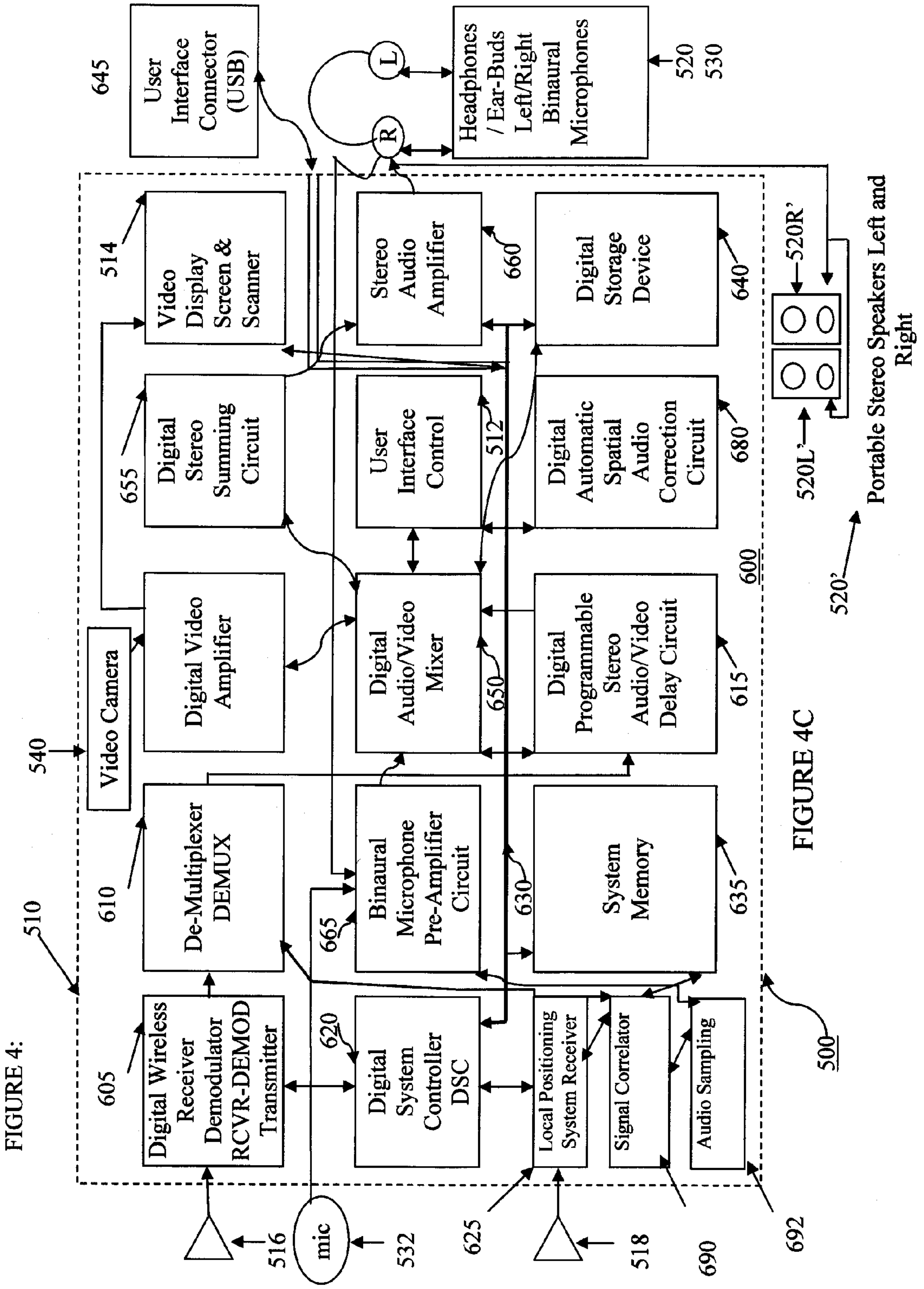

Referring to FIG. 4C, device 500-500' operates substantially as described in relation to device 500 of FIG. 4A and device 500' of FIG. 4B, any one or all of which may be a personal device 500, 500', 500-500', with certain differences and features. One difference is that device 500-500' includes both the positional locating 635 and time delay determining processing 620 functionality as employed in personal device 500 of FIG. 4A and the audio signal correlating 690 and delay time processing 620 functionality of personal device 500' of FIG. 4B in the same device 500-500'. Accordingly, either or both functionalities may be utilized in a particular instance and/or program, and the functionality may be selected by user control 512, or may be automatically selected based, e.g., by processor 620 running an application, wherein selection may be based upon the location of device 500-500' in venue 100, 10', 100", or by signals included in the received program data and/or authorizations, and/or by other criteria.

Regarding the audio data correlation circuit 690 and functionality, which operates as described, audio sampling 692 which may be performed in whole or in part by demultiplexer 610, system controller 620 and/or delay circuit 615, is illustrated as being separate therefrom for sampling the audio program data from demultiplexer 610 and the received natural sound data from microphone 530, 532 via preamplifier 665, and storing the samples thereof for processing by signal correlator 690. Memory and storage capacity may be provided and/or apportioned in a particular device 500, 500', 500-500', to provide the memory required to store samples of the received audio program data and the received delayed natural sound by system memory 635, by delay circuit 615 and/or by signal correlator 690, as may be controlled in a particular device.

Personal device 500-500' may further include an on-board video imager 540 which may be capable of capturing still images and/or video images, e.g., a sequence of multiple images per second during a time period when it is enabled. Imager or camera 540 may be a high or low resolution imager and the images captured thereby a processed by video amplifier 670 and passed to video mixer 650 from where they may be displayed on playback screen 514 and/or stored in digital storage device 640 for later playback. Images captured by camera 540 may be stored instead of program video data and/or may be stored in addition to program video data depending upon the functional capability of device 500-500', the available capacity of storage 635, 640, and/or the authorizations received by device 500-500' for a particular program, e.g., concert or event, and/or location therein, and/or time period. The functionality of personal receiver 500-500' to enable and/or disable functions and/or features based upon location, time and/or authorizations obtained may be employed for controlling features of device 500-500' apart from its being utilized as a personal receiver at a program. Images captured by imager 540 may be utilized in verifying identity and/or for security, e.g., as a photographic ID device or by facial recognition or other processes, and may be edited, transmitted and/or exported by wireless device 500, 500' 500-500' and preferably, subject to having an authorization therefor.

Where wireless device 500, 500', 500-500' includes a microphone 530, 532 that picks up the natural sound from the air, a natural sound actuated security feature may be provided. For example, the volume (e.g., sound pressure level) of the natural sound and/or the frequency content and distribution of the natural sound may be determined, e.g., by processor 620, and may be utilized, e.g., compared to a threshold level, to determine whether device 500, 500', 500-500' is or is not within the boundaries of the venue, thereby to provide an additional security feature for disabling wireless device 500, 500', 500-500' from processing and/or reproducing program data if it is determined to be outside of the venue, where, e.g., the sound level would typically be substantially lower than within the venue. This natural sound activated security feature may operate from sound level and/or frequency alone, or may operate in conjunction with the time delay determining function which synchronizes the program video and/or audio program data so as to be in substantial time alignment with the natural sound as received through the atmosphere. For example, if the delay time determined is longer than a predetermined time, e.g., a time generally corresponding to the time required for natural sound to reach the farthest boundary of the venue, then it is highly probable that device 500, 500', 500-500' is not within the venue. This predetermined time may be a fixed time, e.g., 500 milliseconds, or may be determined in conjunction with the device 500, 500' 500-500' locating system.

This natural sound activated security feature may operate from natural sound level and/or frequency alone, and/or may also operate in conjunction with the locating function provide in device 500, 500', 500-500', irrespective of whether the locating is determined by transmitted locating data, GPS and/or another locating arrangement. Where the sound pressure and location are employed cooperatively, the venue map transmitted to or stored in device 500, 500', 500-500' may include representations of sound pressure levels at locations within the venue and optionally at locations outside the venue, which is intended to more accurately represent the venue and provide more accurate sound pressure comparison. The predetermined sound levels may be determined in the venue in advance of a program or event, or may be determined from sound level data included in the transmitted program data.

Sound level comparison may be performed by an audio signal noise-gate and/or another dynamically controlled audio device circuit, and may process a relatively broad band of sound frequencies or one or more relatively narrow bands of frequencies, and may employ continuous monitoring or periodic sampling of sound pressure level, and further may operate in conjunction with and/or cooperatively with the sampling of received natural sound via the atmosphere being processed for correlation with audio program data. Moreover, the location monitoring function, the time delay determining function, the synchronizing of video and/or audio program data, the natural sound audio correlating function, ticket verification, rights and/or authorization verification, and/or the sound pressure level monitoring security function may be operated continuously, periodically and/or in response to a change of condition of device 500, 500', 500-500', as may be determined by the locating function, or by a function included in device 500, 500', 500-500', e.g., a GPS locator, compass, accelerometer, a motion detector, imager, and/or other physical motion detecting feature, and may employ a threshold so as to detect movement exceeding, e.g., a predetermined distance.

As a result, the operation of device 500, 500', 500-500' may be updated continuously and/or periodically in accordance with the actual condition under which it is being operated, so as to operate in accordance with the verified ticketing and/or authorizations obtained. Further, any or all of the information determined by device 500, 500', 500-500' may be transmitted to the venue operator who may utilize such information, e.g., to assist in conducting the program and operating the venue, e.g., for monitoring and/or controlling the users thereof.

Such security features are intended to reduce, if not eliminate, eavesdropping and piracy of the transmitted audio and/or video program data, e.g., by persons who did not properly acquire a ticket and/or authorization for the program, and so will enable the proprietor of the program or event to receive the compensation they are entitled to receive, thereby providing incentive to create and produce such programs and events to the benefit of the public as well as private interests.

It is noted that all or a substantial part of the function of receiver 500, 500', 500-500' including that of circuitry 600 thereof may be provided by a personal electronic device, such as a personal digital assistant (PDA), a mobile phone, a Blackberry® device, an MP3 player, an iPod® device, a smart phone device, e.g., of which an iPhone® device, an ANDROID device and/or a GALAXY device are examples, a satellite radio receiver, a tablet computer, a netbook computer, a notebook computer, and/or a personal computer, and the like, with in some instances the remainder of circuitry 600 being provided in a housing 510 that serves as a docking station for the personal electronic device, so that the combination of the docking station and the personal electronic device comprise personal receiver 500, 500', 500-500'. The features described, e.g., internal or external microphones 532 and/or an imager 540, as well as other features, may be provided with and utilized by any of devices 500, 500', 500-500', as may be desired.

In addition, input devices 512, 514, 540 of such devices 500, 500', 500-500' may be employed in capturing physical data for verifying the physical characteristic of a person, and therefore the identity of the person, such as utilizing images produced by an imager 540 for photo identification and/or facial recognition and fingerprints captured by a touch sensitive screen 514 and/or scanner 515 for fingerprint comparison These representations of physical characteristic may be associated with a ticket and/or authorization, e.g., electronically embedded therein or associated therewith. Thus, physical characteristic verification may be employed to detect tickets and/or authorizations that have been copied and/or been transferred where such is not permitted, e.g., where a ticket and/or authorization is non-transferable or where ticket scalping is suspected.

The operation of correlator 690 cooperates with delay circuit 615 and/or a separate storage device, e.g., system memory 635, for storing one or more time segments of the received program video data and one or more time segments of the received program audio data over a period of time period, preferably a time period that is about the longest expected delay of the atmospheric natural sound in the venue, e.g., about 3 seconds or less for a very large venue, and substantially less for smaller venues. Memory 635 is preferably a high speed memory such as RAM or other memory that has fast access and retrieval times. Correlator 690 correlates one or more stored segments of the received program audio data and one or more segments of the received delayed natural sound to determine a segment of the received program audio data that corresponds, e.g., in time, to a segment of the received delayed natural sound, that correspondence essentially representing a time difference between the program video data and the atmospherically delayed natural sound. Processor 620 is coupled to correlator 690 for determining from the segment of the received program audio data that corresponds to a segment of the received delayed natural sound a number of video frames of delay by which the received program video data that corresponds in time to the segment of the received program audio data that corresponds to a segment of the received delayed natural sound is delayed from the received delayed natural sound, which provides the number of frames that the program video data should be delayed so as to be substantially in time alignment (synchronization) with the received delayed natural sound. Display 514 is coupled to delay circuit 615 and/or storage device 635 for retrieving and reproducing in human perceivable form program video data that is delayed by the number of video frames determined by processor 620, whereby the received video reproduced by the display of wireless device 500, 500', 500-500' is substantially in time alignment with ambient natural sound from the sound reproducing transducer of the venue.

Figure 5A:
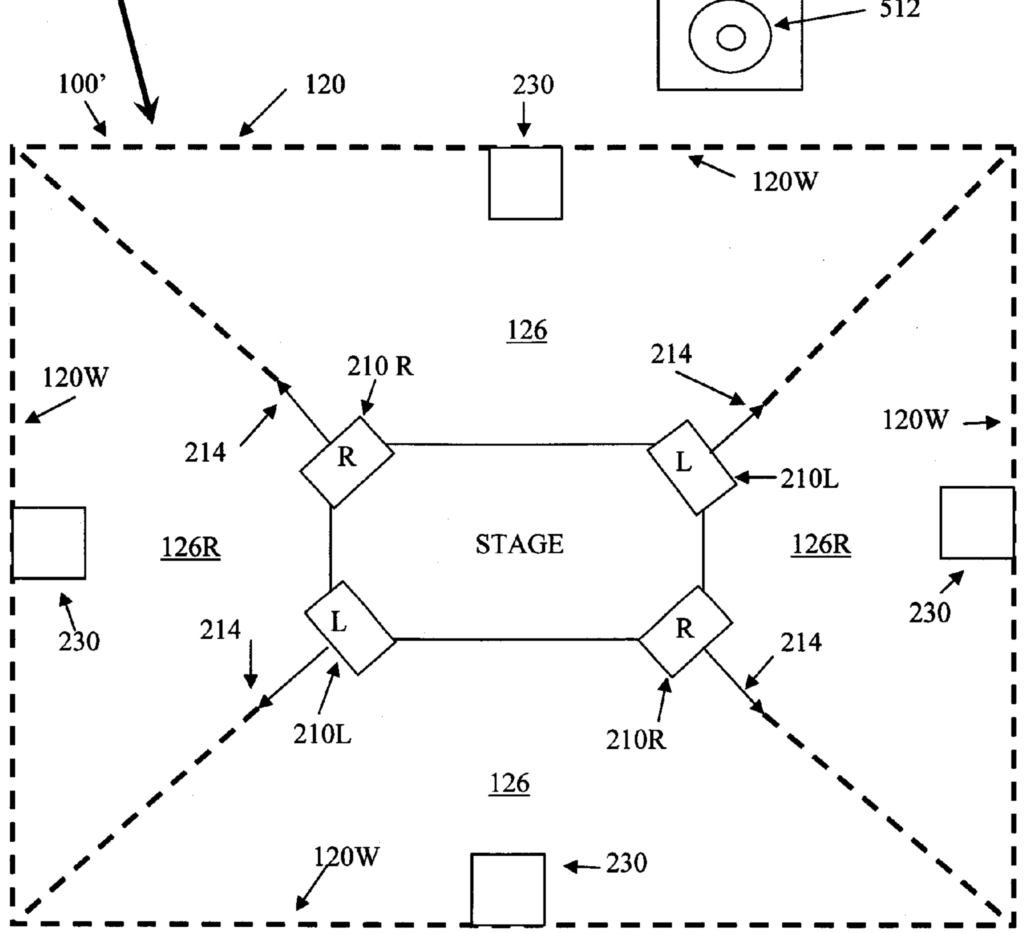
FIGS. 5A and 5B are schematic diagrams of plan and elevation views, respectively, of an example arena venue wherein sound is propagated from plural audio sources to a reception region.
Figure 5B:
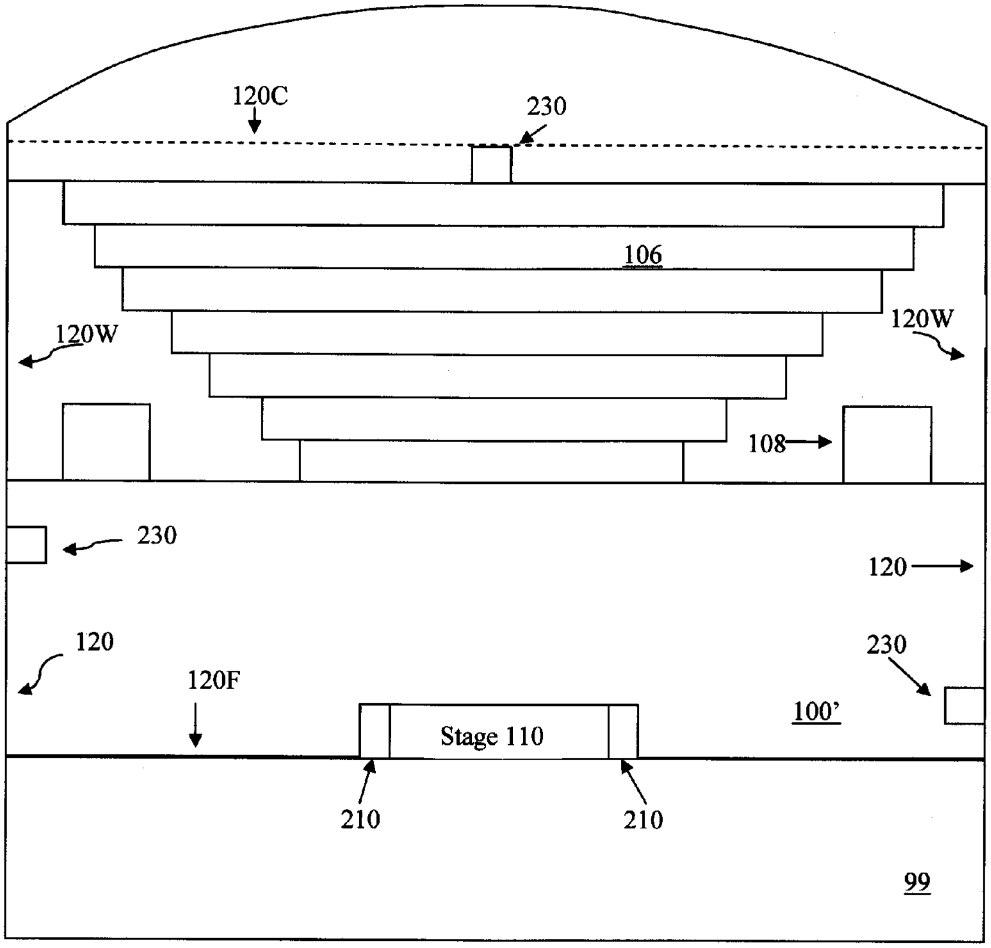

FIGS. 5A and 5B are schematic diagrams of plan and elevation views, respectively, of an example arena venue 100' wherein sound is propagated from plural audio sources 210 to a reception region 120. Boundary 120 defines the space 120 within which the performance on stage 110 may be viewed and/or listened to using a personal receiver 500, 500' as described above. Particular boundaries of space 120 are defined by floor 120F, four walls 120W and ceiling 120C, and admission into space 120 would typically be ticketed and controlled at a limited number of gates and/or access locations. Below venue 100' is space 99 in which personal receivers 500, 500' should not be operated, e.g., either because access is not ticketed and controlled or because another event is being held there. While venue 100' is illustrated as being generally symmetrical, and with stage 110 relatively centrally located, neither is necessary for the description following.

At each corner of stage 110 is a loudspeaker 210 arranged to project sound about an axis extending therefrom in directions indicated by the diagonal arrows and dashed lines 214. Such speakers typically have an about 135° dispersion so as to cover venue 100' with audio from, e.g., the performance on stage 110. Alternate ones 210L of speakers 210 reproduce left channel audio and the others 210R reproduce right channel audio. As a result, the audience in areas 126 facing stage 110 receive amplified left channel audio from loudspeaker 210L to their left front and receive amplified right channel audio from loudspeaker 210R to their right front, and so the stereo phasing is correct and reproduction is normal. However, the audience in areas 126R facing stage 110 receive amplified left channel audio from loudspeaker 210L to their right front and receive amplified right channel audio from loudspeaker 210R to their left front, and so the stereo phasing is and its reproduction are reversed.

While this phase reversal in area 126R may be tolerable to some, it can become quite unsatisfactory when a wireless receiver (not personal receiver 500, 500') is utilized for listening to wirelessly transmitted program audio, because the left and right wireless audio is in correct phasing and so when combined at a listener's ear with natural sound which is reverse stereo, the two tend to cancel each other and monaural sound is heard.

Personal receiver 500, 500' includes a function that tends to avoid such cancellation and loss of stereo effect. Because receiver 500, 500' determines its location within venue 100' from locating signals transmitted by plural transmitters 230, and/or from received natural sound, it can detect when it is in a reverse stereo area 126R and can reverse the phasing of the wireless audio program it reproduces in the left and right speakers of headphone 520. The locating signal transmitted by each transmitter is unique to that transmitter 230, e.g., by frequency or by data therein, so that which signal originated at which transmitter 230 is known so that the location of receiver 500, 500' within area 120 of venue 100' may be uniquely determined. Receiver 500, 500' typically may select the three (or four, as appropriate) from the nearest transmitters 220, 230 from which to determine its location, which may be within boundary 120 or may be outside of boundary 120. Optionally, receiver 500, 500' may be programmed, e.g., by authorization data, including location authorization data, for disabling some or all of its functions if it determines its location to be outside of boundary 120.

In venue 100' transmitters 230 are located around the periphery of space 120, e.g., on walls 120W. Preferably at least four transmitters 230 are employed and are located so that all are not in the same plane. For example, two or three of transmitters 230 may be on walls 120W at the same or different elevations, and the remainder of transmitters 230 may be located in an elevated location, such as in balcony or upper deck 106. Receiver 500, 500' receives locating signals from transmitters 230 and therefrom may determine its location within boundary 120 of venue 100'. The arrangement wherein receiver 500, 500' stores drawings and/or plans of venue 100', e.g., in a 2-D or 3-D CAD format, is useful for determining the location of receiver 500, 500' in two dimensions (2-D) or in three dimensions (3-D), so that elevation of receiver 500, 500' is determined as well as its north-east-south-west (NEWS) location, and the distances to the nearest left and right loudspeakers 210L, 210R. Therein the drawing/map data preferably includes an acoustical layout for all of loudspeakers 210, 212 so that the distance to the nearest loudspeaker 210, 212 is to one directing sound towards that location and not one directing sound away from that location.

The NEWS location data for receiver 500, 500' may be employed to enable a receiver 500, 500' only when it is within the walls 120W, so that it is enabled within space 120 and is disabled when outside thereof, e.g., outside of the walls 120W of the building. The location elevation data for receiver 500, 500' may be employed to enable a receiver 500, 500' only when it is between the elevations of floor 120F and ceiling 120C, so that it is enabled within space 120 and is disabled when outside thereof, e.g., in space 99 below venue 100', thereby avoiding eavesdropping and surreptitious listening, viewing and/or recording. Using both NEWS and elevation location data, receiver 500, 500' may or may not be enabled in corridor 108 depending upon whether corridor 108 is defined to be within space 120 or outside thereof.

When the location of receiver 500, 500' is determined to be in a reverse stereo area 126R, e.g., by positioning system receiver 625 and processor 620 or by correlation of received natural sound, automatic spatial audio correction circuit 680 of circuitry 600 of FIG. 4 operates to reverse (interchange) the left and right stereo audio channels received by wireless transmission so that the wireless program audio reproduced by headphones 520 and/or speakers 520' so that it is of like phasing with the natural audio sound from loudspeakers 210R, 210L, albeit with reverse stereo phasing. In the simplest case wherein transmitter 230 is located a relatively symmetric central location in an area wherein the stereo phasing is known, e.g., at the rear center of area 126 or 126R, the stereo phasing can be represented by data in the signals transmitted thereby, and that stereo phasing data may be used by spatial correction circuit 680 of receiver 500, 500' for correcting the stereo phasing when receiver 500, 500' is in area 126R.

Spatial audio correction circuit 680 may interoperate with any of several other elements of circuitry 600 to properly reverse the phasing of the wireless program audio when receiver 500, 500' is located in a reverse stereo area 126R. For example, correction circuit 680 may receive the de-multiplexed audio channels and/or tracks data from de-multiplexer 610 and adjust the spatial audio image thereof to match that being heard in the user's listening field from loudspeakers 210, then returning the corrected audio channels and/or tracks to delay circuit 615. Alternatively, spatial correction circuit 680 could receive delayed program audio from delay circuit 615 and apply the appropriate correction thereto before sending it on to mixer 650. Alternatively, spatial correction circuit could control demultiplexer 610, delay circuit 615, mixer 650, or any combination thereof to perform the correction on the program audio data as such data is processed by one or more of those elements 610, 615, 650. It is noted that spatial correction should be made prior to the mixing of wirelessly broadcast program audio with ambient sound, e.g., from binaural microphone 530, so as to maintain the stereo effect.

In venue 100', each wireless transmitter 230 transmits locating data and all are synchronized for accuracy in receivers 500, 500' determining their respective locations, however, not all of wireless transmitters 230 need transmit program audio and/or video data, atmospheric data, and/or authorization data, so long as coverage within space 120 is complete. In addition, one or more wireless transmitters may be co-located with loudspeakers 210 in similar manner to that described above in relation to venue 100', as described below. Further, additional and auxiliary loudspeakers 212 may be employed in venue 100' to be taken into account in determining the locations of receivers 500, 500' and the appropriate delay times for time aligning the wireless program audio with the natural sound from the nearest loudspeaker or loudspeakers.

Alternatively, e.g., in the case where venue 100' is generally symmetrical, or is at least not irregular, the locating process for receivers 500, 500' may be simplified in that the described comparison with detail drawings and/or maps may not be necessary. Because the locations of normal stereo phasing areas 126 and of reverse stereo phasing areas 126R are known in advance, as are the locations of transmitters 230, the ones of transmitters 230 that are located in normal stereo areas 126 may transmit signals including an indication that stereo phasing is normal and the ones of transmitters 230 that are located in reverse stereo areas 126R may transmit signals including an indication that stereo phasing is reversed, so that proximity to a given transmitter 230 would be sufficient to determine whether spatial audio correction circuit 680 should or should not reverse the stereo phasing within receiver 500, 500'. In such case, location positioning system receiver 625 and/or controller 620 may determine location from locating signal timing and/or phasing or other suitable means.

Figure 6:
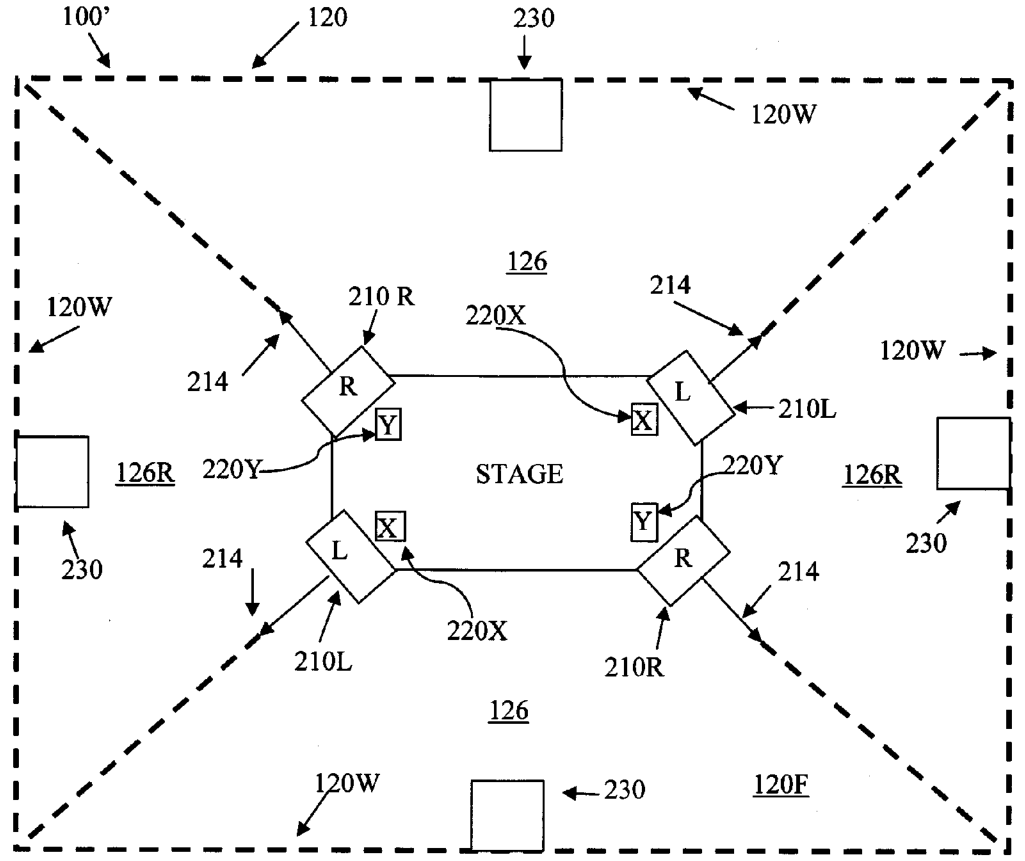
FIG. 6 is a schematic diagram plan view of an example arena venue wherein sound is propagated from plural audio sources to a reception region employing an alternative wireless transmitter arrangement.

FIG. 6 is a schematic diagram of example arena venue 100' wherein sound is propagated from plural audio sources 210 to a reception region 120 wherein an alternative arrangement of wireless transmitters 220X, 220Y, 230 are employed. Venue 100' is as described above except that an additional wireless transmitter 220X is co-located with each left channel loudspeaker 220L and an additional wireless transmitter 220Y is co-located with each right channel loudspeaker 220R.

Each of wireless transmitters 220X, 220Y, 230 may be controlled so as to transmit a relatively weaker signal so as to cover only a portion or zone of venue 100', in which case, sets of wireless transmitters 220X, 220Y, 230 may sufficiently cover respective portions of the space within boundary 120. For example, the wireless transmitters 220X, 220Y located at adjacent corners of one edge of stage 110 may be associated with the wireless transmitter 230 mounted on the wall 120W closest that edge of stage 110 and operate as a set for providing signals for locating receivers 500, 500' in that portion of space 120 and for providing other functions of receivers 500, 500' therein. Typically, wireless transmitters 220X, 220Y, 230 could be associated into four sets in the example venue 100' that generally correspond to the four edges of stage 110 and the four stereo zones 126, 126R adjacent such edges, with each set providing coverage that extends beyond its associated stereo zone 126, 126R. This overlap in the respective coverage regions of adjacent sets of wireless transmitters 220X, 220Y, 230 may be utilized by receivers 500, 500' which determine which of the plural wireless transmitter signals to utilize in determining location, in selecting the loudspeakers 210 that are closest, in correcting stereo phasing, and in enabling and/or disabling other features of receivers 500, 500'.

In this arrangement for venue 100', the operation of wireless transmitters 220, 230 and of the locating of receivers 500, 500' may be similar to that described above in relation to venue 100 and/or venue 100', and automatic correction of reversed stereo phasing may also be provided as described above. Thus, personal receivers 500, 500' may be utilized in different venues 100, 100' wherein different features, such as receiver locating, selective authorizations for recording and the like, and/or automatic correction of stereo phase reversal may be included or not as may be desired.

Figures 7A, 7B:
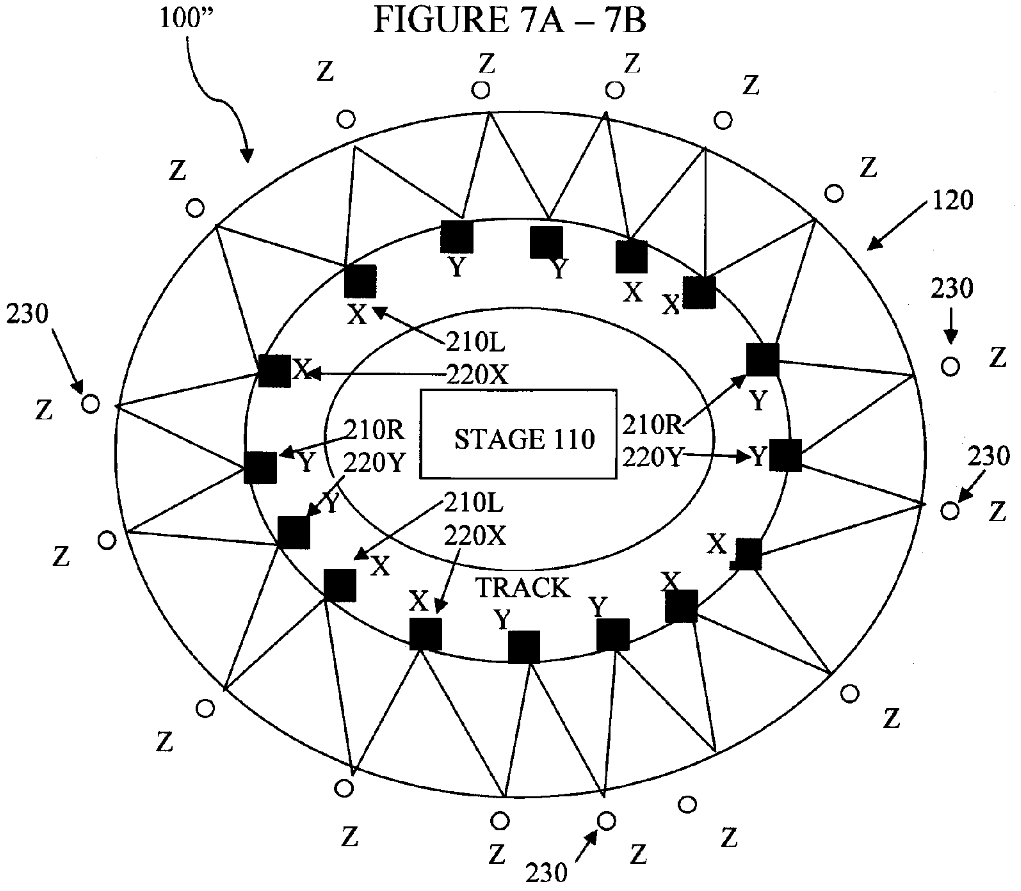
FIG. 7A is a schematic diagram plan view of a different example arena venue wherein sound is propagated from plural audio sources to a reception region.
FIG. 7B is a schematic diagram of a portion of the example arena venue of FIG. 6.
Figure 7B:
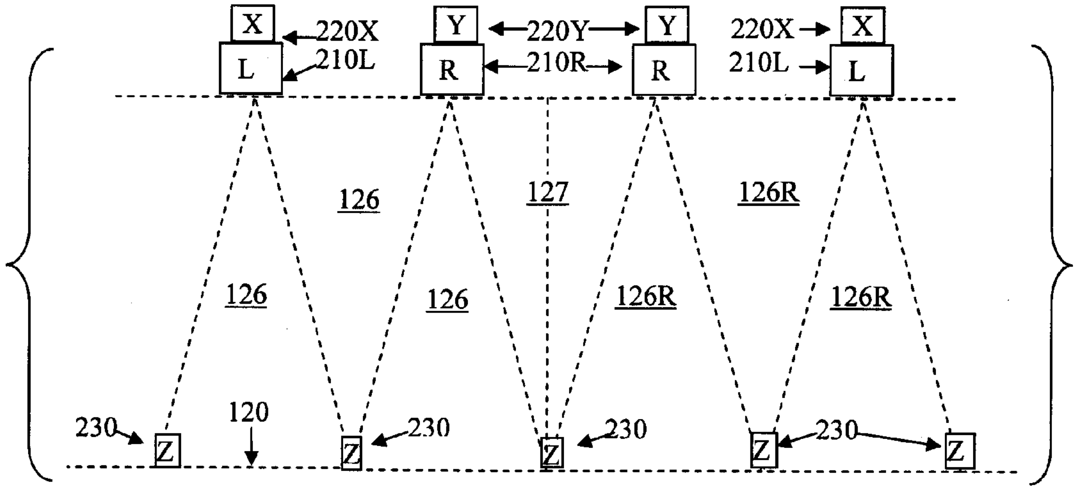

FIG. 7A is a schematic diagram plan view of another example arena venue 100" wherein sound is propagated from plural audio sources 210L, 210R to a reception region 120, and FIG. 7B is a schematic diagram of a portion of the example arena venue 100" of FIG. 7A. Venue 100" represents a large arena-type or stadium-type venue wherein many sets of loudspeakers 210 surround a generally centrally located stage 110 or an off-center stage 110. Loudspeakers 210 therein alternate between those 210L reproducing left channel stereo sound and those 210R reproducing right channel stereo sound. For better coverage of loudspeaker sound, loudspeakers 210L and 210R may be grouped in pairs as illustrates so as to have a wider angle of sound projection than is provided by a single loudspeaker 210L, 210R. Pairs of loudspeakers 210L and 210R are generally relatively close together with greater spacing between adjacent left and right channel speakers 210L, 210R.

Typically, wireless transmitters 220X, 220Y are co-located with associated left and right channel loudspeakers 210L, 210R, respectively, and other wireless transmitters 230, 230Z are located around the periphery 120 of venue 100". Preferably transmitters 230 are located near the rear of the space 120 and relatively symmetrically with respect to left and right loudspeakers 220L, 220R, so as to facilitate the determination of location and stereo phasing by receivers 500, 500'. Typically, wireless transmitters 220X, 220Y,230Z, or sets thereof, cooperate for providing synchronized locating signals for personal receivers 500, 500' within space 120 to utilize for determining their respective locations therein, for appropriately delaying wirelessly broadcast program audio, for automatically correcting for reversed stereo phase, and for enabling/disabling various features of receivers 500, 500', all as described above.

As best seen in FIG. 7A, the arrangement of loudspeakers 210L, 210R results in areas 126 of space 120 wherein the phasing of the natural stereo audio sound is normal and areas 126R of space 120 wherein the phasing of the natural stereo audio sound is reversed. When a personal receiver 500, 500' determines that it is located in an area 126, the wirelessly transmitted left and right program audio is reproduced in the left and right speakers 520L, 520R of headphones 520 with normal phasing. When a personal receiver 500, 500' determines that it is located in an area 126R of reverse stereo phasing, the wirelessly transmitted left and right program audio is reproduced in the left and right speakers 520L, 520R of headphones 520 with reversed phasing, so that a stereo effect is maintained.

Areas 127, however, provide a somewhat different natural sound situation in that proximity to two right channel loudspeakers 210R will cause the right channel natural sound to predominate over the left channel natural sound from more distant left channel loudspeakers 210L, and so the stereo effect may be diminished. Because receiver 500, 500' may include an automatic volume control feature responsive to the natural ambient sound as picked up by left and right binaural microphones 530L, 530R as described above, the respective volumes of the ambient natural sound from the left and right microphones 530L, 530R may be automatically adjusted, e.g., to increase the volume in left speaker 520L thereof and to decrease the volume in right speaker 520R thereof, so that the levels of the left and right reproduced ambient natural sound tend to be more in balance and tend to offset any imbalance in the left and right channel natural sound that may be perceived around headphones 520. Thus, that perception of stereo audio may be improved.

Alternatively, the respective volumes of the wirelessly broadcast left and right channel program audio as reproduced in left and right speakers 520L, 520R, respectively, of headphones 520 may be automatically adjusted, e.g., to increase the volume in left speaker 520L thereof and to decrease the volume in right speaker 520R thereof, so that the levels of the left and right reproduced program audio tend to compensate for the imbalance in the left and right channel natural sound, and that perception of stereo audio may be improved.

In any case, the wireless program audio is delayed to be in time alignment with the natural sound from the nearest loudspeaker 210 based upon actual atmospheric conditions and the actual speed of sound, and the left and right channels thereof may advantageously be delayed by different times so that the left channel program audio is in time alignment with the left channel natural sound from loudspeaker 210L and the right channel program audio is in time alignment with the right channel natural sound from loudspeaker 210R. If receiver 500, 500' determines that it is located in area 127 relatively closer to area 126, the wirelessly broadcast program audio is reproduced in headphones 520 with normal stereo phasing, and if receiver 500, 500' determines that it is located in area 127 relatively closer to area 126R, the wirelessly broadcast program audio is reproduced in headphones 520 with reversed stereo phasing, as described above.

Figure 7C:
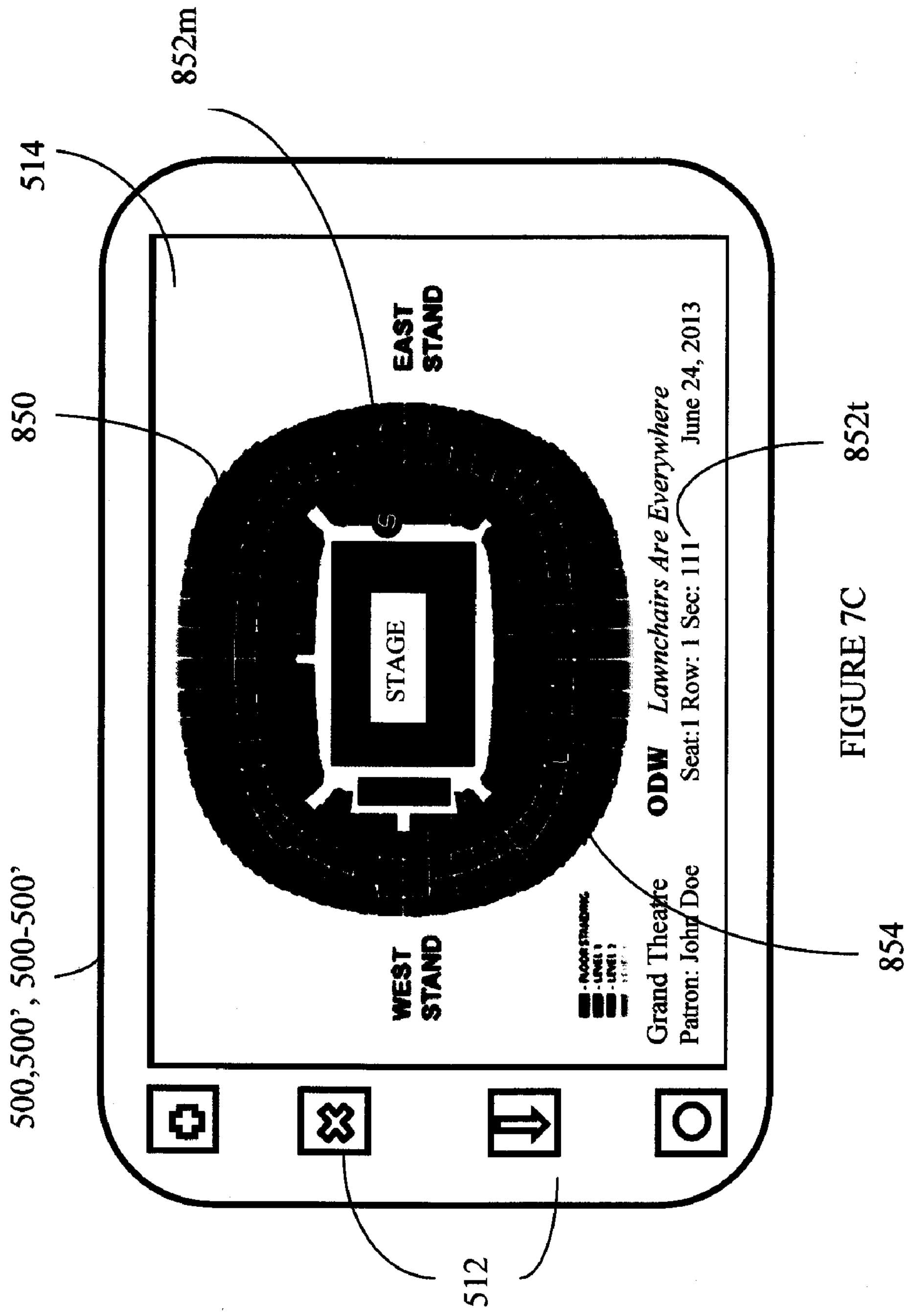
FIG. 7C is an illustration of a wireless device displaying a venue diagram.

Referring to FIG. 7C, which is an illustration of a wireless device 500, 500', 500-500' displaying a venue diagram 850, personal device 500, 500', 500-500' operates substantially as described above and further provides a locating feature to assist a user in navigating within a venue, e.g., venue 100" in relation to the location of device 500, 500', 500-500'. Personal device 500, 500', 500-500' includes locating functionality as described that determines the location thereof within a venue, and the locating functionality may include a map or other representation of the venue. The display 514 of personal device 500, 500', 500-500' here displays the map 850 of venue 100" and optionally information relating to the program and ticketing, e.g., date, venue, seat, and the like 852*t*. From the stored venue map data device 500, 500', 500-500' determines the location of the ticketed seat or area and displays an overlay of that location 852 on the map 850 of the venue, e.g., as an icon 852 such as an "S" (for seat) in a circle, and from the determined location of device 500, 500', 500-500' and displays an overlay of that location 854 on the map 850 of the venue, e.g., as an icon 854 such as an "L" (for location) in a circle.

Figures 8, 8A, 8B:
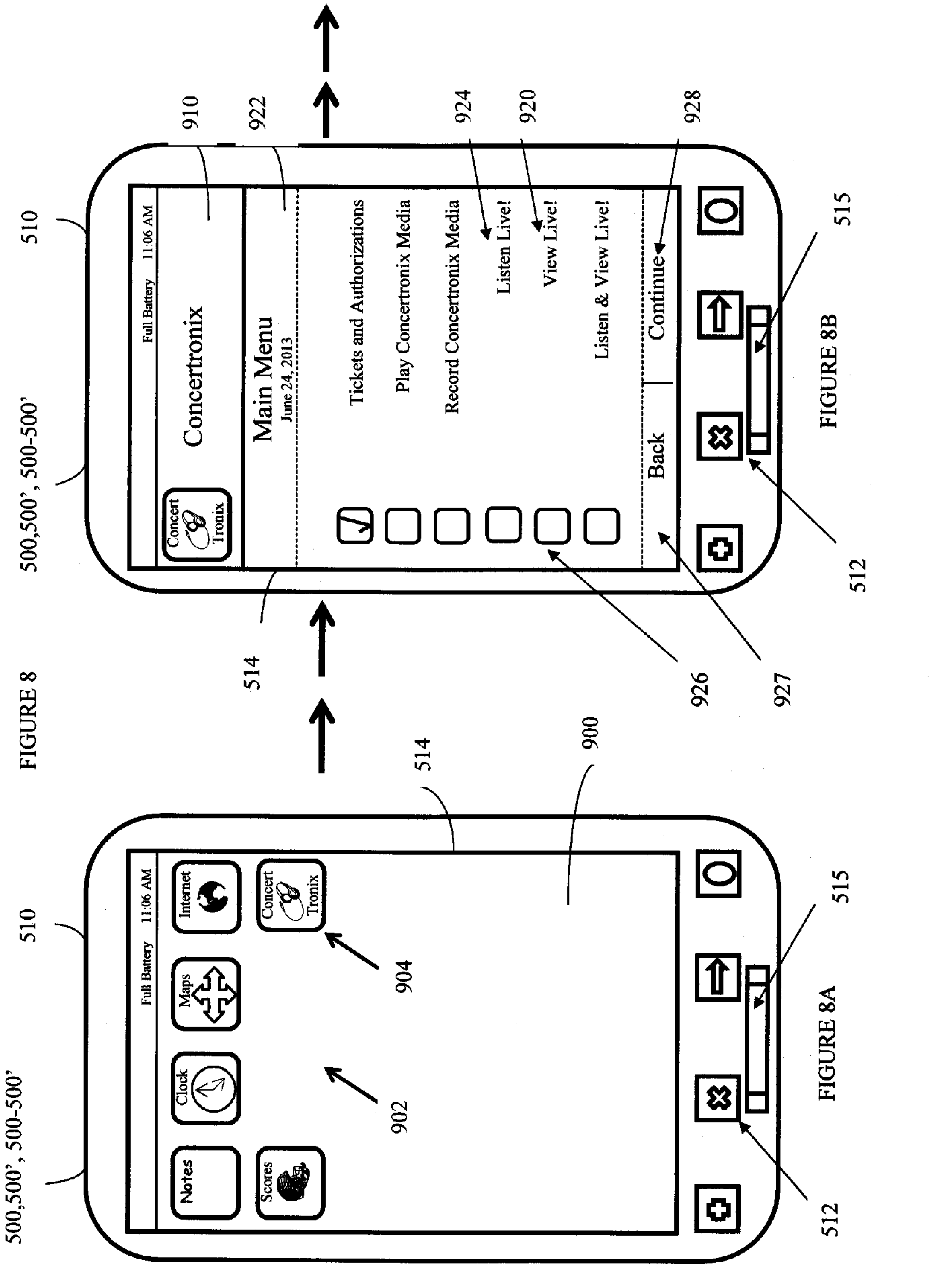
FIG. 8 includes FIGS. 8A through 8H illustrating a sequence of example screen displays relating to the obtaining of ticketing and/or authorizations utilizing an example personal wireless device.

FIG. 8 includes FIGS. 8A through 8H illustrating a sequence of example screen displays 900-960 relating to the obtaining of ticketing and/or authorizations utilizing an example personal wireless device 500, 500', 500-500'. As above, wireless device 500, 500', 500-500' includes a housing 510 containing, e.g., circuitry as described, and having a display 514 and user controls 512 thereon. Display 514 may be a touch screen display 514 wherein a user may enter information and/or initiate an action by touching an appropriate place on the screen of display 514. User control 512 may include plural buttons and/or other actuators which may be located on housing 510 adjacent to display 514 and where display 514 is a touch screen display, may also include actuators that are displayed as icons on display 514. Wireless device 500, 500', 500-500' may also include a scanner or sensor 515 for sensing, e.g., a fingerprint or vein pattern, of a finger that is placed on and/or drawn across scanner or sensor 515.

FIG. 8A illustrates wireless device 500, 500', 500-500' having a screen 900 displayed on display 514 that may be considered a top level or "home screen" 900, similar to a "desktop" screen on a computer, on which are displayed a plurality of icons 902 or symbols 902 representing functions and/or applications that may be selected to be performed ("run"). Optionally, housekeeping information, e.g., battery condition, date and time, may be displayed on screen 900 and subsequent screens. Examples of icons 902 might include one for launching an application for obtaining sports scores, one for an application for entering notes, one for an application for accessing maps or a mapping web site, one for accessing the Internet, and an icon 904 for accessing an example application for obtaining ticketing and/or authorizations relating to a program, e.g., a concert or other event. Touching icon 904 launches the ticketing application and displays the first screen 910, 920 thereof.

FIG. 8B illustrates a screen display 910, 920 of the example application for obtaining ticketing and/or authorizations relating to a program, e.g., a concert or other event. Screen 920 includes a header 910 which may be provided to display the identification of the application, promoter, and/or ticketing agency, and may include an icon representing such entity. Screen 920 may include a screen heading or screen title 922 indicating, e.g., the title and/or purpose of the screen, e.g., a "Main Menu" screen, and a main region wherein selections 924 are identified and icons 926 are provided for selecting one or more of the presented selections. In example screen 920, example selections 924 listed along the right side of screen 920 include "Tickets and Authorizations" by which ticketing transactions may be entered and wherein rights and/or authorizations relating to a ticketed program may be obtained, "Play Media" by which authorized program data may be played, e.g., reproduced, "Record Media" by which authorized recording of program data may be controlled, "Listen Live!" by which authorized rights to listen to program data, e.g., audio program data, may be controlled, "View Live!" by which authorized rights to view program data, e.g., video program data, may be controlled, and "Listen & View Live!" by which authorized rights to listen to audio program data and to view video program data may be controlled. Along the left side of example screen 920 are a plurality of active regions 926, e.g., boxes 926, one corresponding to each of the listed selections, by which a touching action on touch screen 514 may be utilized to select the corresponding listed selection, and to transition to the next screen 930. In the example illustrated, one selection icon 926 may be selected and the icon 926 corresponding to the "Tickets and Authorizations" selection has been touched as indicated by the check mark (e.g., a "✔" or an "✗" mark) displayed therein. A "Continue" selection 928 is provided at the bottom of screen 930 to confirm the selections made and to transition to the next screen 930, and a "Back" selection 927 is provided to return to the previous screen 900.

Figure 8D:
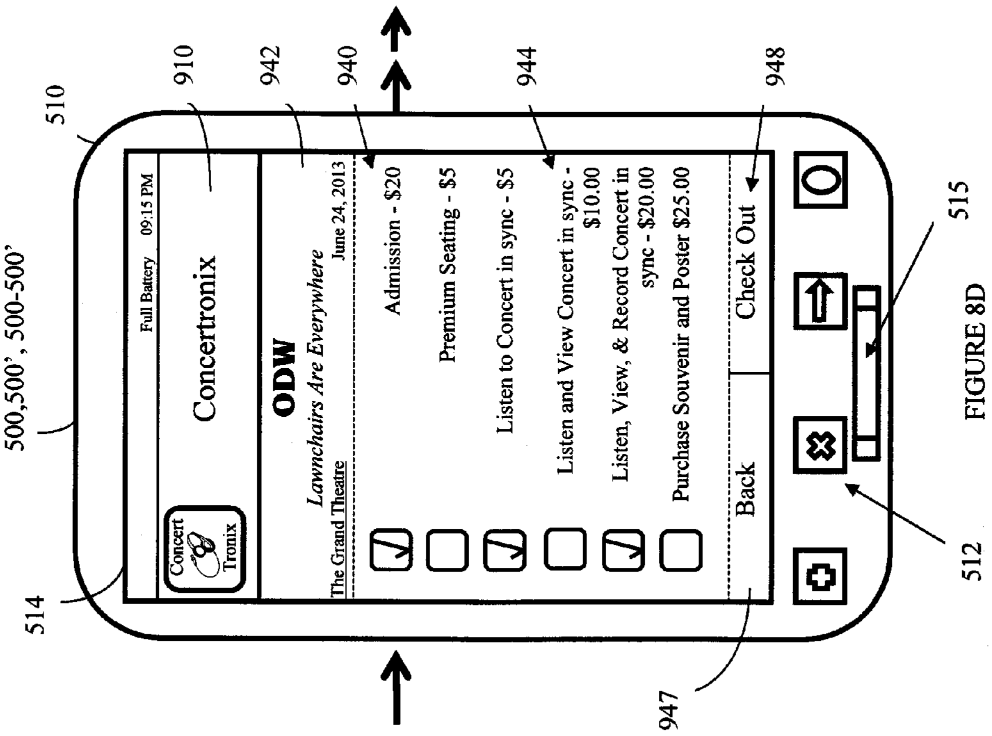
Figure 8C:
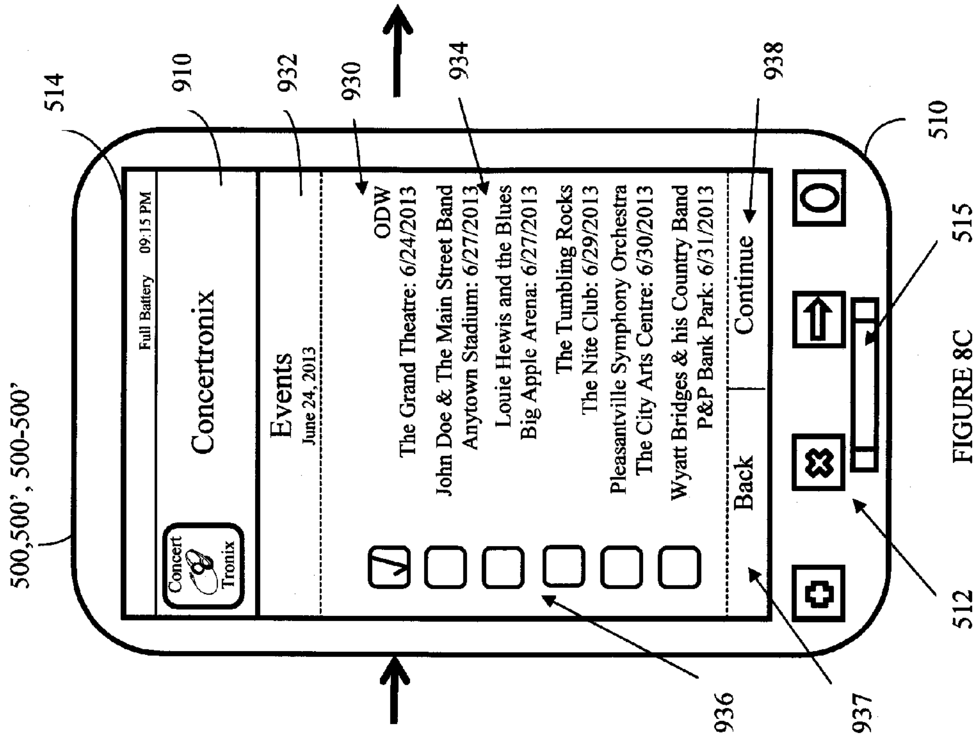

FIG. 8C illustrates a screen display 930 of the example application for obtaining ticketing and/or authorizations relating to a program. Screen 930 includes header 910 as described, a screen heading or screen title 932 indicating, e.g., the purpose of the screen, e.g., an "Events" screen indicating the events that are available for ticketing, and a main region 934 wherein selections 934 are identified and icons 936 are provided for selecting one or more of the presented selections. In example screen 930, example selections 934 listed along the right side of screen 930 include an "ODW" event at "The Grand Theater," a "John Doe & the Main Street Band" event at "Anytown Stadium," and so forth. Along the left side of example screen 930 are a plurality of active regions 936, e.g., boxes 936, one corresponding to each of the listed selections, by which a touching action on touch screen 514 may be utilized to select the one or more of the corresponding listed selections, and to transition to the next screen 940. In the example illustrated, one event icon 926 may be selected and the icon 926 corresponding to the ""ODW" event" selection has been touched as indicated by the check mark (e.g., a "✔" or an "✗" mark) displayed therein. A "Continue" selection 938 is provided at the bottom of screen 930 to confirm the selections made and to transition to the next screen 940, and a "Back" selection 937 is provided to return to the previous screen 920.

FIG. 8D illustrates a screen display 940 of the example application for obtaining ticketing and/or authorizations relating to a program. Screen 940 includes header 910 as described, a screen heading or screen title 942 indicating, e.g., the purpose of the screen, e.g., that an "ODW Lawn Chairs Are Everywhere" event has been selected for ticketing, and a main region 944 wherein selections 944 are identified and icons 946 are provided for selecting one or more of the presented selections. In example screen 940, example selections 944 listed along the right side of screen 940 include an "Admission" selection for obtaining (herein "obtaining" may include purchasing, as is the case in the example described) a ticket merely providing for admission to the event at the venue, a "Premium Seating" selection for obtaining a ticket for a seat in a preferred location and an additional charge therefor, a "Listen to Concert in sync" selection for obtaining an authorization to receive and listen to the audio program data at the event and an additional charge therefor, a "Listen and View Concert in sync" selection for obtaining an authorization to listen to the audio program data at the event and to view the video program data at the event and an additional charge therefor, a "Listen, View & Record Concert in sync" selection for obtaining an authorization to listen to audio program data at the event, to view video program data at the event and to record both audio and video program data for playback during and/or after the event and an additional charge therefor, and finally a "Listen & Record Audio and Video w/ MixLive! Option" selection for obtaining an authorization to listen to audio program data at the event, to view video program data at the event, to mix and record received natural sound and/or video captured by a camera of device 500, 500', 500-500', and to record any or all of audio and video program data and live mixed audio and/or video for playback during and/or after the event, and the additional charge therefor. One selection 944 "Purchase Souvenir and Poster" is provided to purchase various goods, such as a posters, programs and/or souvenirs, and other merchandise as the may be offered in relation to the program or event, or otherwise. Along the left side of example screen 940 are a plurality of active regions 946, e.g., boxes 946, one corresponding to each of the listed selections, by which a touching action on touch screen 514 may be utilized to select the corresponding listed selection. In the example illustrated, more than one icon 946 may be selected and the icons 946 corresponding to the "Admission," "Listen to Concert in sync" and "Listen, View & Record Concert in sync" selections have been touched as indicated by the respective check mark (e.g., a "✔" or an "✗" mark)s displayed therein. A "Check Out" selection 948 is provided at the bottom of screen 940 to confirm the selections made and to transition to the next screen 950 and a "Back" selection 947 is provided to return to the previous screen 930.

Figure 8F:
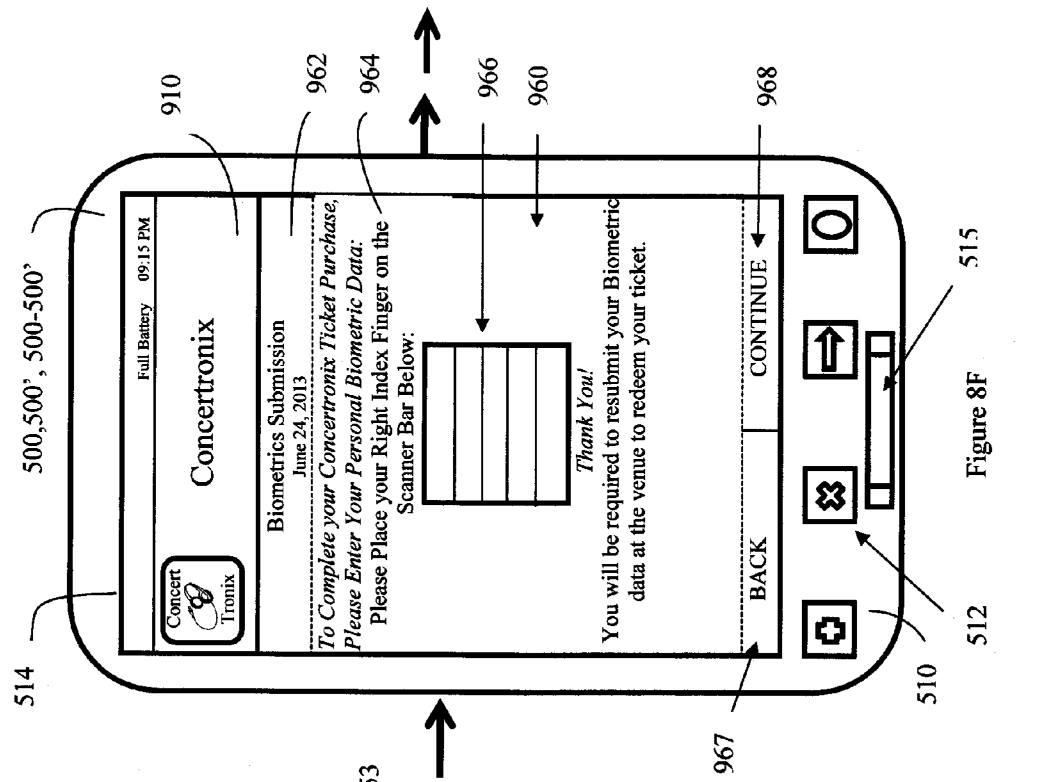
Figure 8E:
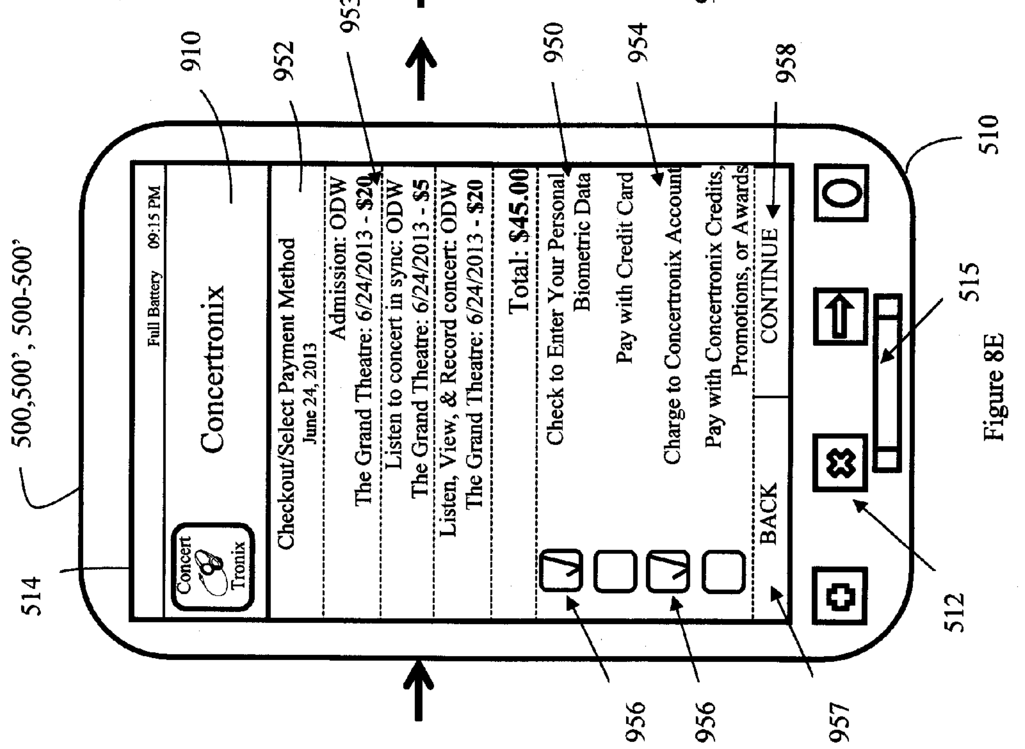

FIG. 8E illustrates a screen display 950 of the example application for obtaining ticketing and/or authorizations relating to a program. Screen 950 includes header 910 as described, a screen heading or screen title 952 indicating, e.g., the purpose of the screen, e.g., a "Checkout/Select Payment Method" screen indicating the selected event and authorizations, and a main region 954 wherein messages and selections are presented. Selections 953 made on a previous screen or screens are identified on this "Checkout" screen, including the individual charges for each selected event and/or authorization and the total of the charges for the events and/or authorizations selected is displayed. Selections 954 corresponding to alternative methods of payment therefor are provided. Plural icons 956 are provided for selecting one of the presented selections of payment options 954. In example screen 950, example selections 954 listed along the right side of screen 950 include "Check to Enter Your Personal Biometric Data" which solicits entry of physical body data that can be utilized as a security feature, e.g., to identify the user (purchaser) and to be associated with the ticket to detect fraud, unauthorized substitutions and ticket scalping. Other example selections include payment selections such as "Pay with Credit Card" which may be a pre-designated credit card or may be a credit card for which information is entered via a subsequent screen, "Charge to [Entity] Account" where the user has established such account with the entity, e.g., the promoter, sponsor and/or ticketing agency, and "Pay with [Entity] Credits, Promotions or Awards" where such are available from the entity, as are conventional and so are not illustrated. Along the left side of example screen 950 are a plurality of active regions 956, e.g., boxes 956, one corresponding to each of the listed payment option selections, by which a touching action on touch screen 514 may be utilized to select the corresponding listed selection, prior to the transition to the next screen 960. In the example illustrated, more than one icon 946 may be selected and the icons 956 corresponding to the "Check to Enter Your Personal Biometric Data" and the "Charge to [Entity] Account" selections have been touched as indicated by the check mark (e.g., a "✔" or an "✗" mark) displayed therein. Active area 958 is provided to "Continue" to initiate the next screen display 960 upon that area being touched, and active area 957 is provided to change "Back" to the previous screen 940.

Submission of biometric data may be optional or mandatory as the proprietor of the program, e.g., concert or other event, may determine. For example, submission of physical body data may be an optional feature of the application, e.g., it may or may not be presented, or may be optional with a user regarding a particular transaction, e.g., the transaction may proceed with or without submission of biometric data, however, the arrangement thought to be preferred in most instances requires submission of physical body data as a condition for proceeding with and completing a transaction, and may also be required for a person to exercise the rights provided by a ticket and/or other authorization. Preferably, the physical body data is associated with the ticket and/or authorization, and may be embedded therein, e.g., in the electronic form and/or record thereof.

FIG. 8F illustrates a screen display 960 of the example application for obtaining ticketing and/or authorizations relating to a program. Screen 960 is a screen that includes header 910 as described, a screen heading or screen title 962 indicating, e.g., the purpose of the screen, e.g., a "Biometric Submission" screen indicating that physical body data is to be collected and a main region 964 wherein messages are presented. Where display 514 is a touch screen 514 and has sufficient sensitivity to detect a fine pattern such as a fingerprint, an active region 966 may be presented at which body data, e.g., a fingerprint, finger scan or vein scan, may be entered by placing a specified finger against the active region 966. Where display 514 lacks sufficient sensitivity, a separate scanner 515 or sensor 515 may be utilized for capturing fine data such as fingerprint data, a finger scan and/or a vein scan. Biometric data, e.g., an image of a body part, a facial image, a facial recognition image, and/or an iris scan, may be captured using imager 540 of device 500, 500', 500-500'. Active area 968 is provided to initiate movement to the next screen display, e.g., to "Continue" to a checkout screen, upon that area being touched, and area 967 is provided to return to the previous screen 950.

Personal data, e.g., name, address, driver's license number, a user identifier and/or password, or other identifying information, and the like, may be collected in addition to and/or in place of "biometric data" and may be similarly utilized to verify identity and authorizations when the ticket is presented at the program or other event, whereby unauthorized uses may be detected and appropriate action taken, e.g., to avoid access and/or use of a wireless device other than in accordance with the rights associated with the ticket and/or authorization.

In particular, the authorization entered into wireless device 500, 500', 500-500', whether entered at purchase of a ticket and/or authorization or by receiving a transmitted authorization at a program or other event, may supercede user control 512 to thereby take control of certain features of that device 500, 500', 500-500', although such control is preferably limited to locations in the venue and at the time of the program or other event. Examples of such superceding control may include, e.g., the imager by which still and video images may be captured, the microphone by which audio sound may be captured, the memory and/or storage devices by which video and audio information may be stored or recorded, data stored in its memory and/or storage devices by which video and audio information may be played back, the controls and/or receiver by which communication (e.g., the ability to make and receive cell phone calls) may be initiated and/or received, and/or the use and/or volume of external speakers to reproduce audio information, although such control is preferably limited to locations in the venue and at the time of the program or other event. Further, superceding such control may not be complete or absolute, but may, e.g., limit the use of certain features in a way that may be acceptable to the proprietor of the program, e.g., the event operator or producer, a performer or artist, and the like, such as by limiting the number of still images, limiting the duration of a video clip, limiting how often the imager may be used, limiting the duration of telephone calls, and/or allowing only certain telephone calls such as calls to a "911" or other emergency number.

Figure 8H:
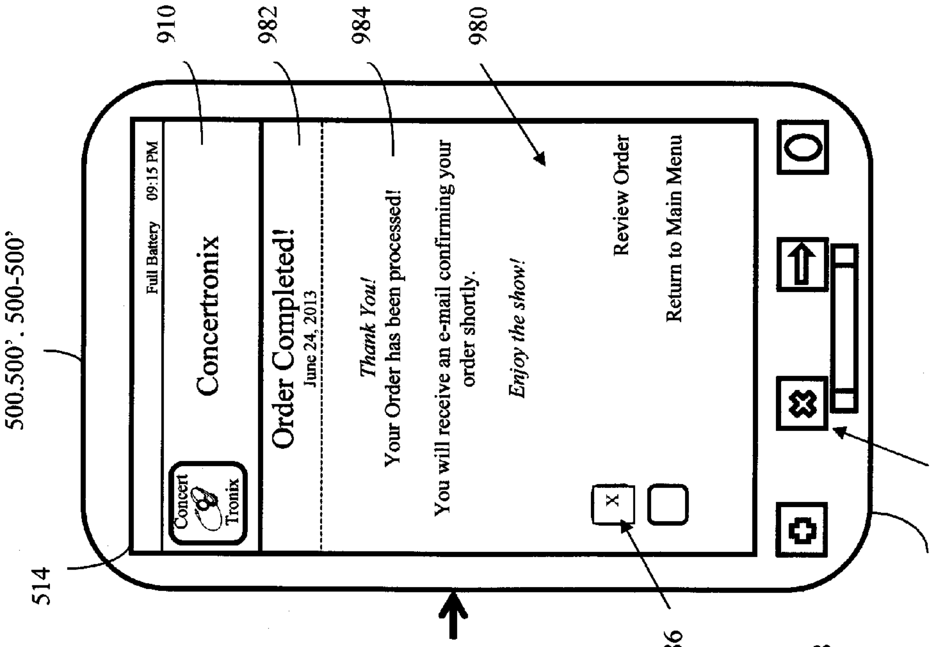
Figure 8G:
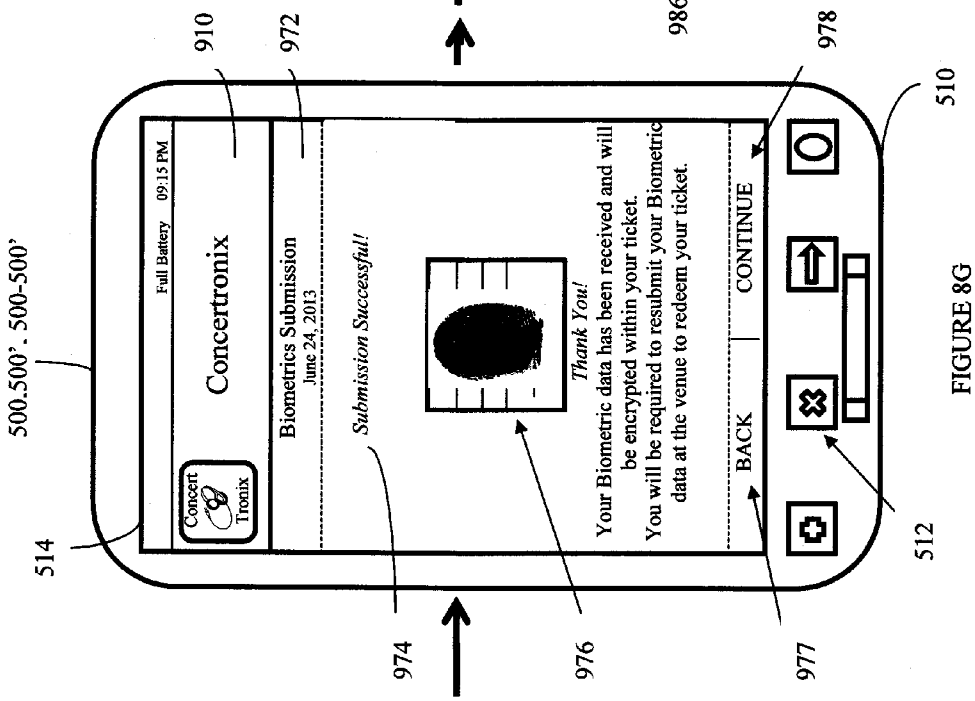

FIG. 8G illustrates a screen display 970 of the example application for obtaining ticketing and/or authorizations relating to a program. Screen 970 is a screen that includes header 910 as described, a screen heading or screen title 972 indicating, e.g., the purpose of the screen, e.g., an "Biometric Submission" screen indicating continuation of the collection of physical body data, and a main region 974 wherein messages are presented and selections may be identified and icons 966 may be provided. The messages of screen portion 974 indicate, e.g., successful submission of physical body data. A region 976 may be provided to display an icon or an actual fingerprint image to indicate that fingerprint data and/or other physical body data has been successfully entered and recorded. Active area 978 is provided to "Continue" to the next screen display, e.g., to an order completed screen 980, upon that area being touched, and area 977 is provided to return "Back" to the previous screen 960.

FIG. 8H illustrates a screen display 980 of the example application for obtaining ticketing and/or authorizations relating to a program. Screen 980 is a final screen that includes header 910 as described, a screen heading or screen title 982 indicating, e.g., the purpose of the screen, e.g., an "Order Completed!" screen indicating the events and/or authorizations selected have been ordered, processed and paid for, and a main region 984 wherein messages are presented, e.g., that an order or transaction has been processed and/or completed, and wherein selections 984 are identified and icons 986 are provided for selecting one or more of the presented selections. In example screen 980, example selections 984 listed along the right side of screen 980 include options as to where the user would like to proceed to, e.g., to "Review Order" to display a summary of the tickets and/or authorizations ordered for review, and "Main Menu" to return to the Main Menu screen 920, e.g., to select and order regarding different events and/or rights and authorizations. Other selections 984 may be presented, e.g., a "Return to Events Store" to return to an "Events" screen 930 whereat additional tickets can be ordered and purchased. Along the left side of example screen 980 are a plurality of active regions 986, e.g., boxes 986, one corresponding to each of the listed selections, by which a touching action on touch screen 514 may be utilized to select the corresponding listed selection, and to transition to the selected next screen. In the example illustrated, one icon 986 may be selected and the icon 986 corresponding to the "Return to Main Menu" selection has been touched as indicated by the check mark (e.g., a "✔" or an "✗" mark) displayed therein. The "Review Order" and "Main Menu" selections effectively serve as "Continue" and "Back" selections of screen 980.

Where wireless device 500, 500', 500-500' is embodied in a special purpose or custom device, the application programs that create and control the screens utilized to define and conduct a transaction may be pre-loaded therein or may be downloaded, as may be convenient and desired. Where wireless device 500, 500', 500-500' is a generally available device, e.g., a smart phone, the application program is typically downloaded from an "applications store" or other web site, most often by the user. Further, it is noted that the electronic ticket and/or authorizations may be transmitted to wireless device 500, 500', 500-500' by the same wireless communications through which the described transaction is conducted, or wireless device 500, 500', 500-500' may later communicate wirelessly and/or via a cable with another device at the venue and/or program event to receive the electronic ticket and/or authorization. When a ticketing and/or authorization transaction is done at the venue and/or event, and/or if the presence of wireless device 500, 500', 500-500' thereat is detected, wireless device 500, 500', 500-500' may receive an In Attendance Ticket Number whereby the venue/event operator or proprietor has a record that the device 500, 500', 500-500' is indeed present and within the venue thereof.

Figure 9:
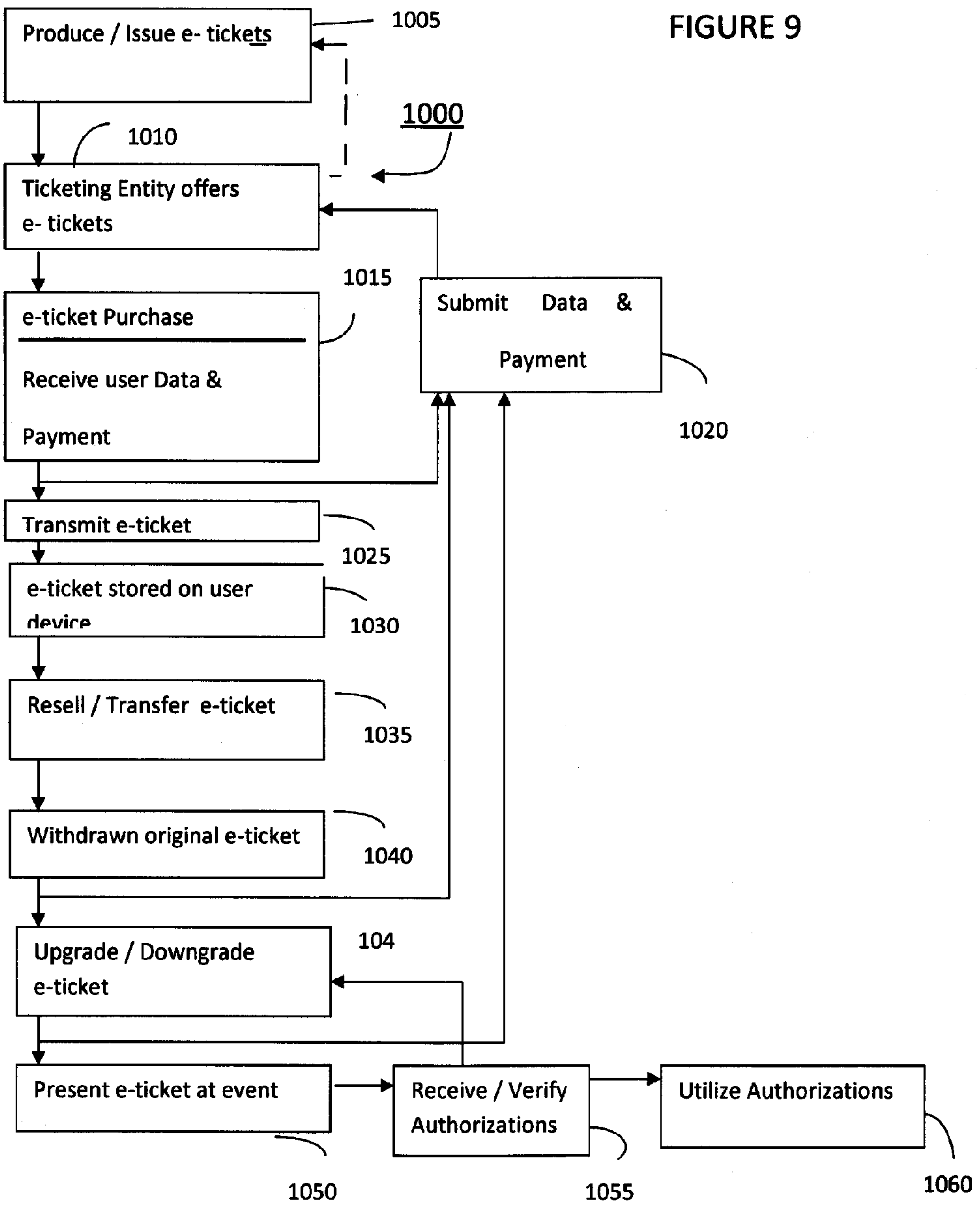
FIG. 9 is a block diagram flow chart representing an embodiment of such process for obtaining, changing, transferring and utilizing rights in tickets and/or authorizations.

FIG. 9 is a block diagram flow chart representing an embodiment of a process 1000 for obtaining, changing, transferring and utilizing rights in tickets and/or authorizations. The reselling of tickets to programs, concerts and other events, is a significant problem that distorts the revenue received by promoters, proprietors and performers, among others that may include venue operators and governmental taxing authorities, and may involve illegal activities. The wireless device 500, 500', 500-500' and the ticketing and/or authorization process described can be employed to address such problem, e.g., by providing tracking and transparency of such transactions.

In ticketing and authorizing process 1000, an event proprietor, e.g., an organizer, producer, operator and/or promoter, organizes the event and prepares 1005 electronic tickets (e.g., e-tickets) and if not selling the tickets directly, issues 1005 the e-tickets to one or more ticketing entities, e.g., to one or more ticket sellers, resellers, venue operators, ticket vendors, agents, box offices, websites, organizers, producers, promoters, performers, artists, or a combination thereof, as the case may be. The e-tickets are typically prepared on a computer and are issued thereby as electronic files, typically including a graphic image of the ticket, in conjunction with a data base, spreadsheet or other data organizing software and are distributed via wire and/or wireless communication, typically including the Internet or another network.

The e-ticket can contain any or all of the information pertaining to the ticket, to the event and/or to the authorizations relating thereto, and may the data vase or other data file maintained by the ticketing entity. Examples of such information may include the name of the event, the name of an artist and/or performer, the date and/or time of the event, a seat identifier, a section and/or area identifier, the date and/or time of ticket issuance, a ticket transaction history, ticket transfers, ticket upgrades and downgrades, gate opening times, seating available time, ticket redemption and/or exchange times and conditions, the venue name and/or address, a customer service and/or other telephone number, a customer service and/or other e-mail address, a ticket number, a barcode and/or barcode number, a scannable barcode and/or QR code, a request for body part and/or other biometric data, the authorizations available and/or purchased or otherwise granted, the date of distribution, a ticket proprietor and/or manufacturer, an event proprietor, ticket price (optionally stating taxes and other fees, if any), promotional offers available, system identifiers, transaction numbers, tracking numbers, and the like as may be desired in a particular instance.

Electronically transmitted e-tickets and data relating thereto, including authorizations and data provided by a purchaser, are preferably communicated via secured, e.g., encrypted, communications, for security and privacy, at all steps of process 1000. In particular, such security serves the dual function of protecting the event proprietor and the ticketing entity from pirated and/or counterfeit tickets, as well as protecting the purchaser's data, e.g., name, address, telephone, e-mail address, credit and debit card numbers, account numbers, photo images, body part and other biometric data, and other personal data. Electronically transmitted data to be secured is typically produced in connection with the e-tickets, sales and other transfers thereof, changes such as upgrades and downgrades thereto, utilizing the ticket to access an event, transmitting and verifying rights and authorizations, accounting and other record keeping among entities involved in an event, and the like. It is understood that any or all of the data and information identified, as well as other information and data, may be provided and/or transmitted and/or received in connection with any part of the transaction performed as part of process 1000, and so is deemed included by reference and need not be expressly mentioned regarding any part or portion or step of process 1000.

Each ticketing entity then offers and/or promotes the e-tickets for distribution and/or sale 1010 by any suitable means, e.g., direct sales, advertising, websites, posters and bill boards, and the like, but very usually via a website and an application ("app") downloaded from a website.

An interested party, e.g., a purchaser (referred to herein as a user and/or purchaser irrespective of the price charged, if any), may then purchase an e-ticket 1015 from the ticketing entity, typically via wire and/or wireless communication between the purchaser, e.g., using a computer and/or a wireless device 500, 500', 500-500'. As part of the purchase transaction 1015 (the transaction is referred to as a purchase irrespective of the price and fees, if any, that maybe charged), the purchaser is typically requested to provide certain identifying information, e.g., personal data, payment data, body part data, and the like, so that a record is created of the transaction and the parties to the transaction. Data provided by the purchaser (user) including personal data and payment data is received and is submitted 1020 to and received by the ticketing entity 1010 which then has a complete record of the ticketing transaction, e.g., in its database or other data file, which when verified, is utilized to cause an e-ticket to be transmitted 1025 to the purchaser and stored 1030 on the purchaser's computer or device, e.g., to the computer and/or device 500, 500', 500-500' device being used to conduct the ticketing transaction.

A tangible (physical) ticket, e.g., a paper or plastic sheet with ticketing information printed thereon, may be provided in addition to the e-ticket, if desired, and may be delivered by mail or another shipping method, or may be held for pick up by the e-ticket holder at a box office, will call window, and the like. In addition, an e-ticket may include an authorization for the purchaser to print a physical ticket that represents the e-ticket and the physical ticket may contain the same data and authorizations that are contained in the e-ticket; the physical ticket may be presented 1050 for admission to the venue either with or without the e-ticket as the proprietor may determine.

It is noted that the e-ticket transmitted 1025 to the user's device and stored 1030 therein may include any or all of the e-ticket information and/or purchaser information identified herein, but need not include all of that information, and similarly the proprietor's and/or ticketing entity's record of the transaction may include any or all of the e-ticket information and/or submitted 1020 purchaser information identified herein, but need not include all of that information.

In the event that the ticketing entity issues an e-ticket that includes an authorization that permits the purchaser to transfer the e-ticket, if the purchaser elects to resell and/or otherwise transfer 1035 the e-ticket stored 1030 in user device 500, 500', 500-500' to another party, that sale and/or transfer transaction may be conducted from the user's computer and or device 500, 500', 500-500' in communication with the ticketing entity in similar manner to the original purchase of an e-ticket as described. In the case of a resale and/or other transfer 1035 of the e-ticket, the transferee (e.g., subsequent purchaser) must enter personal data, biometric data and payment data as was required to conduct the original transaction 1010-1030 and that data for the subsequent purchaser is submitted 1020 and received by the ticketing entity 1010 which, if all of the necessary data is provided to effect the transfer, causes a new e-ticket to be issued and transmitted 1025 and stored on the subsequent purchaser's electronic device 500, 500', 500-500' and stored 1030 therein, and the originally issued e-ticket is "withdrawn" 1040 in the sense that the information of the original purchaser is replaced by the information of the subsequent purchaser and the original e-ticket is marked as a resold ticket, and the original ticket is not openly available for sale either during or after the transfer transaction.

Withdrawing 1040 an e-ticket may and preferably does include deleting the e-ticket and all information relating thereto, including authorizations, if any, from the original purchaser's wireless device 500, 500', 500-500', and the storing 1030 of the e-ticket and the information relating thereto on the subsequent purchaser's computer or wireless device 500, 500', 500-500', and preferably includes storing 1030 information relating to the original e-ticket thereon as well. All data relating to a withdrawn e-ticket is retained on the ticketing entity computer and so a withdrawn 1040 ticket is available for resale. Because information relating to prior e-tickets is stored on the subsequent purchaser's wireless device 500, 500', 500-500' as well as by the ticketing entity, each e-ticket can be tracked and traced and verified to facilitate the detection of copied and/or counterfeit e-tickets and/or of improperly transferred e-tickets, and to prevent their being improperly utilized. Preferably information and data other than public information, e.g., the event name, venue, performer, date and time of an event, section and seat, should be encrypted for privacy and security.

Because the e-ticket reselling and/or transferring transaction is structured to require involvement of, e.g., participation by, the ticketing entity and the submission of the subsequent purchaser's data to the ticketing entity, the ticketing entity maintains control over the e-ticket which prevents scalping of the e-ticket and further provides for any premium price that may be paid above the ticketing entity's established price for the ticket to be distributed between the original purchaser reselling the e-ticket and the ticketing entity which may then distribute any such additional revenue among other parties to the event, e.g., the proprietor, artists, performers and the like, as may have been arranged in organizing and arranging for the event and the selling of tickets by the ticketing entity. The ticketing entity may authorize ticket resellers to auction or otherwise resell e-tickets to the highest bidder.

In effect, this e-ticket transfer transaction is structured to include or to not include the equivalent of returning of the original e-ticket to the ticketing entity and the sale of a new e-ticket to the subsequent purchaser, plus the distribution of any additional revenue among the interested parties. The ticketing entity may permit transfers 1035 without charge, e.g., as a gift, and may or may not charge a fee for processing that transfer or any other transfer and/or for granting an authorization to make a transfer, and may or may not impose limitations and/or conditions on transfers of the e-ticket. If an e-ticket is resold for less than the ticket price established by the ticketing entity including any transaction fee, the party reselling that e-ticket will receive only the price that the e-ticket was resold for less any transaction fees and service charges. Typically an e-ticket includes an authorization for a purchaser thereof to transfer 1045 the e-ticket to another device owned by him using the process therefor as described without fee or service charge, such as transferring an e-ticket purchased on a personal computer from the computer to his smart phone. Where the transfer of an e-ticket involves the purchaser returning the e-ticket to the ticketing entity for a refund, less transactions fees and service charges, the ticketing entity may resell that e-ticket without paying any part of the resale price to the previous purchaser.

In the event that the ticketing entity issues an e-ticket that includes an authorization that permits the purchaser to upgrade (e.g., to change to premium seating or a premium location and/or to add authorizations) and/or downgrade the e-ticket (e.g., to change to lower cost seating or a lower cost location and/or to remove authorizations), if the purchaser elects to exercise 1045 such authorization, the purchaser enters appropriate identifying information and payment data which is submitted 1020 to the ticketing entity 1010 in similar manner to that for originally purchasing 1015 and/or transferring 1035 the e-ticket. If the e-ticket is upgraded 1045, the ticketing entity has the record of the additional fees charges for distribution and accounting among interested parties. If downgrading is permitted and if an e-ticket is downgraded 1045, then there may be a fee charged and/or refund made to be accounted and distributed among interested parties. Examples of upgrades may include premium seating, the right to receive program video and/or program audio during the event, the right to store and subsequently playback program video and/or program audio, and promotions and/or deals on tickets, season tickets, rewards and/or merchandise, and the available upgrades may be changed at any time by the ticketing entity, either before, during or after an event.

Similarly to the transferring 1035 of an e-ticket as described, the original e-ticket is withdrawn 1040 and the upgraded or downgraded e-ticket is transmitted 1025 and stored 1030 on the user's computer or device 500, 500', 500-500'. Also similarly thereto, the upgrading or downgrading transaction is structured to include or to not include the equivalent of returning of the original e-ticket to the ticketing entity and the sale of a new e-ticket to the same purchaser, plus the distribution of any change in revenue among the interested parties. Preferably, also as in a transfer transaction 1035, the records of the ticketing entity and the user device 500, 500', 500-500' contain the information relating to the original e-ticket as well as to the upgraded or downgraded e-ticket for tracking, tracing, accounting and security purposes.

On the occasion of the ticketed event, within established times for admission, seating and/or conduct of the event, the e-ticket is presented 1050 by the user to gain access to the event venue. With an e-ticket this may be accomplished by presenting the wireless device 500, 500', 500-500' containing the e-ticket with the e-ticket displayed on display 514 thereof and the scanning of the displayed e-ticket to gain admission. Scanning may be done by the user or by venue personnel, e.g., at a kiosk, ticket window, gate, turnstile, box office, or other entrance, or at a section, level, row and/or seat by personnel there having an e-ticket scanner. Presentation of an e-ticket may also be accomplished by wireless communication connection between an admission control and ticket validation system and the device 500, 500', 500-500' containing the e-ticket or be connected by a wired connection to be programmed by event personnel to verify and validate the e-ticket. The user may be required to submit, e.g., personal data and/or body part data, for identification, verification and/or security purposes, in order to complete the entry process 1050.

Presenters of e-tickets representing different rights and authorizations need not be processed identically upon presentation 1050 of their e-ticket for admission. For example, a lesser level of data collection, verification and security may be appropriate for established patrons holding e-tickets for more premium services, e.g., for "VIP" patrons, or conversely a greater level of data collection, verification and security may be appropriate in view of the relatively higher value of such e-tickets and the accesses and authorizations conferred thereby. Data may be submitted using device 500, 500', 500-500' and/or using an imager or scanner provided at the entrance and, as is the case throughout process 1000, information and all data collected is preferably stored in the e-ticket as well as in the records of at least the database, spreadsheet of other data file maintained by the ticketing entity. A tangible (physical) ticket, e.g., a paper or plastic sheet with ticketing information printed thereon, and/or with e-ticket and personal data stored in a barcode or another encodable feature thereof, may be provided to the e-ticket holder when the e-ticket is verified, as may be desirable, e.g., for controlling admission to the venue or to locations therein, such as premium seating areas.

If the presented e-ticket is verified, then any authorizations previously stored in wireless device 500, 500', 500-500' may be activated and/or authorizations previously purchased may be transmitted to device 500, 500', 500-500', whereupon the authorizations may be utilized 1060. It is noted that such authorizations may not be enabled to be utilized 1060 unless and until wireless device 500, 500', 500-500' is located in an authorized location in the venue, as may be determined by the locating features of device 500, 500', 500-500' as described. In the event the user desires to upgrade or downgrade any right or authorization, if downgrading is permitted after presented 1050, the e-ticket may be upgraded or downgraded 1045 as described above, and the changed authorizations may be transmitted 1055 to device 500, 500', 500-500' and thereafter utilized 1060.

It is noted that wireless device 500, 500', 500-500' may have to be in a predetermined location relating to a particular authorization before that authorization can be utilized 1060, and/or may have to enter personal and/or biometric data to utilize 1060 an authorization. It is further noted that as described, the received and stored 1055 authorizations preferably control wireless device 500, 500', 500-500' while it is in the venue during the time of the event, and so the functions of device 500, 500', 500-500' that are authorized by the authorizations to be utilized 1060, e.g., an imager, recording video and/or audio, are enabled by the authorization, but other functions of device 500, 500', 500-500' not authorized to be utilized by the authorization may be disabled and/or limited in function.

Thus, if only an authorization to listen to program audio is purchased, the reproduction of program audio in a speaker or headset will be enabled, but the recording thereof and other functions of device 500, 500', 500-500', e.g., the display of program video, will be disabled. Likewise, if an authorization to use an imager is not purchased, the imager function of device 500, 500', 500-500' may be completely disabled or may be limited as to use, e.g., regarding the number of images that may be captured and/or the interval therebetween, and/or regarding limiting the length of video images and/or intervals therebetween. This feature will beneficially reduce piracy of images, video and audio records of the event which deprive the proprietor, performers, artists and the like of full reward for their efforts and often result in poor quality images and recordings that do not reflect well on the artists and performers, while limiting the return possible from the piracy, e.g., to the persons making the images and recordings and to the websites and others that gain income from pirated images and recordings.

Further, because transactions relating to e-tickets typically involve a web browsing application which produces and stores "cookies" and other data items, and because all e-ticket transactions must involve the ticketing entity which preferably makes and retains complete records of each transaction for each e-ticket including all of the information and data relating thereto, from sellers, resellers, purchasers, transferees and the like, the ticketing entity may accumulate in its database, spreadsheet and/or other data files, a substantial collection of demographic and browsing information that may be mined and/or sold to interested parties.

A wireless personal receiver 500, 500' for reproducing program data including stereo audio data originating from a source in a venue 100, 100', 100" having a boundary 120 and plural sound reproducing transducers 210, 212 therein, may comprise: a receiver 605 for receiving wireless transmissions and demodulating data contained therein, wherein the data includes at least the program data and locating data; a storage device 635, 640 storing a representation of the venue 100, 100', 100" including locations of the plural sound reproducing transducers of the venue 100, 100', 100" therein; a processor 620 coupled to the receiver 605 and to the storage device 635, 640 for determining from the locating data and from the stored representation of the venue 100, 100', 100" the present location of the personal receiver 500, 500' and distances to respective ones of the sound reproducing transducers of the venue 100, 100', 100"; a programmable delay circuit 615 responsive to the processor 620 for delaying the received program data by a predetermined delay time relating to the determined distances from one or more of the sound reproducing transducers of the venue 100, 100', 100''; a personal sound transducer 520, 520' coupled to the programmable delay circuit 615 for reproducing the delayed received stereo audio data in a human perceivable form; whereby the received stereo audio reproduced by the personal sound transducer 520, 520' is substantially in time alignment with ambient sound from the sound reproducing transducers 210, 212 of the venue 100, 100', 100'' in the location of the personal receiver 500, 500'. The data received by the receiver 605 may include authorization data, and the processor 620 may process the received authorization data for enabling and disabling reproduction of sound by the personal sound transducer 520, 520'. The reproduction of sound by the personal sound transducer 520, 520' is disabled when the determined location is outside of the boundary 120 of the venue 100, 100', 100'' and/or wherein the received authorization data does not correspond with a predetermined condition. The predetermined condition may include the determined location, a unique identifier, an IP address, an electronic serial number, a stored access authorization, a stored ticket access authorization, an admission authorization, a feature authorization, or a combination thereof, stored in the personal receiver. Program data may include video and/or text data, and the personal receiver 500, 500' may further include a display 514, a text display 514, a video display 514, an LCD display 514, an OLED display 514, an AMOLED display 514, and LED display 514, a super AMOLED display 514, a touch screen 514, a transparent display screen 514, or any combination of the foregoing, for reproducing the video and/or text data, and the processor 620 may process the received authorization data for enabling and disabling reproduction of the video and/or text data. A user control 512 may be provided for controlling the stereo audio data reproduced by the personal sound transducer 520, 520' for reproducing the delayed received stereo audio data, and the user control 512 may control reproduction of stereo audio data, reproduction of plural track audio data, reproduction of selected tracks of plural track audio data, reproduction of quadraphonic sound data, reproduction of surround sound data, reproduction of ambient stereo sound, mixing of stereo audio data and ambient stereo sound, reproduction of text data, reproduction of video data, or any combination thereof, if the processor 620 enables such reproduction responsive to the authorization data. Receiver 500, 500' may further comprise a storage device 635, 640, wherein the user control 512 may control recording of stereo audio data, recording of plural track audio data, recording of selected tracks of plural track audio data, recording of quadraphonic sound data, recording of surround sound data, recording of ambient stereo sound, recording of mixed stereo audio data and ambient stereo sound, recording of text data, recording of video data, or any combination thereof, by the storage device 635, 640. The representation of the venue 100, 100', 100'' may include locations of the plural sound reproducing transducers 210, 212 of the venue 100, 100', 100'' therein and may include: a digital map, a digital plan, a two dimensional CAD drawing, a three dimensional CAD drawing, or a combination there of and the representation of the venue 100, 100', 100'' may include locations of the plural sound reproducing transducers 210, 212 of the venue 100, 100', 100'' therein may optionally include: a representation of acoustical properties of the venue 100, 100', 100'' and/or of the plural sound reproducing transducers 210, 212 therein. The predetermined delay time may be determined by the processor 620 responsive to atmospheric data including temperature, or relative humidity, or barometric pressure, or any combination of temperature, relative humidity and barometric pressure. The personal sound reproducing transducer 520, 520' may include a pair of personal sound transducers 520L, 520L' 520R, 520R' suitable for being respectively located one proximate each of the ears of a user. Personal receiver 500, 500' may further comprise: binaural microphones 530 including a microphone 530L, 530R proximate each of the respective personal sound transducers 520L, 520R for producing respective signals representative of ambient stereo sound thereat; a mixer 650 to which the binaural microphones and the programmable delay circuit 615 may be coupled for receiving and combining the respective signals from the binaural microphones 530 and the delayed received stereo audio data, wherein the combined ambient sound signals and the delayed received stereo audio data from the mixer 650 may be coupled to the personal sound reproducing transducer 520, 520' wherein the ambient stereo sound reproduced thereby is in phase with the ambient stereo sound at the respective ones of the binaural microphones 530. The stereo audio data may include plural track audio data, quadraphonic sound data, surround sound data, or any combination thereof. The present location of the personal receiver 500, 500' determined by the processor 620 may include a distance from the source of the stereo 210, 212 audio data, a distance from the nearest source 210, 212 of stereo audio data, a distance from the nearest source 210, 212, 210L, 210R, 212L, 212R of left and right stereo audio data, or a combination thereof. The representation of the venue 100, 100', 100'' may include locations of the plural sound reproducing transducers 210, 212 of the venue 100, 100', 100'' and may be a three dimensional representation, wherein at least three different locating data may be received, and the present location of the personal receiver 500, 500' and the distances to respective ones of the sound reproducing transducers 210, 212 of the venue 100, 100', 100'' may be determined in three dimensions.

A wireless personal receiver 500, 500' for reproducing program data originating from a source, the personal receiver 500, 500' may comprise: a receiver 605 for receiving wireless transmissions and demodulating data contained therein, wherein the data includes at least the program data and locating data; a processor 620 coupled to the receiver 605 for determining the present location of the personal receiver 500, 500' from the locating data, for determining the actual speed of sound from current local atmospheric data, and for determining from the determined location and the determined speed of sound a delay time representative of the difference in time between the program data received via wireless transmission and program data received as sound via the atmosphere; a programmable delay circuit 615 responsive to the processor 620 for delaying the received program data by the determined delay time; and a device 520, 520' coupled to the programmable delay circuit 615 for reproducing the delayed received program data in a human perceivable form, whereby the reproduced program data and sound received via the atmosphere are in substantial time alignment. The current local atmospheric data may include temperature, or relative humidity, or barometric pressure, or any combination of temperature, relative humidity and barometric pressure. The device 520, 520' for reproducing the delayed received program data may include a pair of sound reproducing devices 520L, 520R suitable for being respectively located one proximate each of the ears of a user, and the personal receiver 500, 500' may further comprise: binaural microphones 530 including a microphone 530L, 530R proximate each of the respective sound reproducing devices 520L, 520R for producing an output representative of ambient sound thereat; a mixer 650 to which the binaural microphones 530 and the programmable delay circuit 615 are coupled for receiving and combining the respective outputs of the binaural microphones 530 and delayed received program data, wherein the combined ambient sound outputs and the delayed received program data from the mixer 650 are coupled to the device 520 for reproducing the delayed received the program data. The device 520 for reproducing the delayed received program data may include a loudspeaker 520, 520', a headphone 520, an ear bud 520, an ear mold 520, a display 514, a text display 514, a video display 514, an LCD display 514, an OLED display 514, an AMOLED display 514, an LED display 514, a super AMOLED display 514, a touch screen 514, a transparent display screen 514, or any combination of the foregoing. The program data may include audio data, stereo audio data, plural track audio data, quadraphonic sound data, surround sound data, text data, video data, or any combination thereof. Personal receiver 500, 500' may further include a user control 512 for controlling the program data reproduced by the device 520, 520' for reproducing the delayed received program data, wherein the user control 512 may control reproduction of audio data, reproduction of stereo audio data, reproduction of plural track audio data, reproduction of selected tracks of plural track audio data, reproduction of quadraphonic sound data, reproduction of surround sound data, reproduction of text data, reproduction of video data, or any combination thereof. Personal receiver 500, 500' may further comprise a storage device 635, 640, wherein the user control 512 may control recording of audio data, recording of stereo audio data, recording of plural track audio data, recording of selected tracks of plural track audio data, recording of quadraphonic sound data, recording of surround sound data, recording of text data, recording of video data, or any combination thereof, by the storage device 635, 640. The present location of the personal receiver 500, 500' determined by the processor 620 may include a distance from the source 210, 212 of the program data, a distance from the nearest source 210, 212 of program data where the program data includes audio data, a distance from the nearest source 210L, 210R, 212L, 212R of left and right program data where the program data includes stereo audio data, or a combination thereof. Personal receiver 500, 500' may be in combination with at least three wireless transmitters 220, 222, 230, wherein each of the three wireless transmitters 220, 222, 230 may transmit the locating data, and at least one of the three wireless transmitters 220, 222, 230 may transmit the program data, and at least one of the three wireless transmitters 220, 222, 230 may optionally transmit the atmospheric data. Personal receiver 500, 500' may be in combination with at least four wireless transmitters 220, 222, 230, wherein each of the four wireless transmitters 220, 222, 230 may transmit the locating data, whereby the personal receiver 500, 500' may be located in three dimensions, and at least one of the four wireless transmitters 220, 222, 230 may transmit the program data, and at least one of the four wireless transmitters 220, 222, 230 may optionally transmit the atmospheric data.

A method for reproducing in a wireless personal receiver 500, 500' program data originating from a source, may comprise: receiving 605 wireless transmissions and demodulating data contained therein, wherein the data includes at least the program data and locating data; determining 620 the present location of the personal receiver 500, 500' from the locating data; receiving 605 current local atmospheric data; determining 620 the actual speed of sound from the current local atmospheric data; determining 620 from the determined location and the determined speed of sound a delay time representative of the difference in time between the program data received via wireless transmission and program data received as sound via the atmosphere; delaying 615 the received program data by the determined delay time; and reproducing 520, 520' the delayed received program data in a human perceivable form, whereby the reproduced program data and sound received via the atmosphere are in substantial time alignment. The current local atmospheric data includes temperature, or relative humidity, or barometric pressure, or any combination of temperature, relative humidity and barometric pressure. Reproducing 520, 520' the delayed received program may data include reproducing the delayed received program data by a pair of sound reproducing devices 520L, 520R suitable for being respectively located one proximate each of the ears of a user, receiving from binaural microphones 530 including a microphone 530L, 530R proximate each of the respective sound reproducing devices 520L, 520R, an output representative of ambient sound thereat; combining 650 the respective outputs of the binaural microphones 530 and the delayed received program data; and reproducing 520, 520' the combined ambient sound outputs and the delayed received the program data. Reproducing 520, 520', 514 the delayed received program data employs a loudspeaker 520, 520', a headphone 520, an ear bud 520, an ear mold 520, a display 514, a text display 514, a video display 514, an LCD display 514, an OLED display 514, an AMOLED display 514, an LED display 514, a super AMOLED display 514, a touch screen 514, a transparent display screen 514, or any combination of the foregoing. The program data may include audio data, stereo audio data, plural track audio data, quadraphonic sound data, surround sound data, text data, video data, or any combination thereof. The method may further include controlling 512 reproduction of audio data, reproduction of stereo audio data, reproduction of plural track audio data, reproduction of selected tracks of plural track audio data, reproduction of quadraphonic sound data, reproduction of surround sound data, reproduction of text data, reproduction of video data, or any combination thereof, and may further comprise recording of audio data, recording of stereo audio data, recording of plural track audio data, recording of selected tracks of plural track audio data, recording of quadraphonic sound data, recording of surround sound data, recording of text data, recording of video data, or any combination thereof. Determining the present location of the personal receiver 500, 500' from the locating data may include determining a time difference between received wireless transmissions, determining a phase difference between received wireless transmissions, triangulating between received wireless transmissions, or a combination thereof. The determining 620 the present location of the personal receiver 500, 500' may include determining 620 a distance from the source 210, 212 of the program data, determining 620 a distance from the nearest source 210, 212 of program data where the program data includes audio data, determining 620 a distance from the nearest source 210L, 210R, 212L, 212R of left and right program data where the program data includes stereo audio data, or a combination thereof. The method may further comprise: receiving 605 locating data from at least three wireless transmitters 220, 222, 230; receiving 605 the program data from at least one of the three wireless transmitters 220, 222, 230; and receiving 605 the current local atmospheric data from at least one of the three wireless transmitters 220, 222, 230. The method may further comprise: receiving 605 locating data from at least four wireless transmitters 220, 222, 230; receiving 605 the program data from at least one of the four wireless transmitters 220, 222,

230; and receiving 605 the current local atmospheric data from at least one of the four wireless transmitters 220, 222, 230.

A method for reproducing in a wireless personal receiver 500, 500' stereo program data originating from a source, may comprise: receiving 605 wireless transmissions and demodulating data contained therein, wherein the data includes at least the stereo program data and locating data; determining 620 the present location of the personal receiver 500, 500' from the locating data; receiving 605 current local atmospheric data; determining 620 the actual speed of sound from the current local atmospheric data; determining 620 from the determined location and the determined speed of sound a delay time representative of the difference in time between the stereo program data received 605 via wireless transmission and stereo program data received as sound via the atmosphere; delaying 615 the received stereo program data by the determined delay time; receiving 665 from binaural microphones 530 including a microphone 530L, 530R locatable proximate each of the respective ears of a user signals representative of ambient sound thereat; combining 650 the respective signals of the binaural microphones 530 and the delayed received stereo program data; and reproducing 520, 520' the combined ambient sound signals and the delayed received stereo program data using a pair of sound reproducing transducers 520L, 520R locatable proximate each of the respective ears of a user, whereby the reproduced stereo program data and ambient sound received via the atmosphere and the binaural microphones 530 are reproduced in substantial time alignment. The method may further comprise recording 635, 640 the combined ambient sound signals and the delayed received stereo program data which are in substantial time alignment, and/or recording 635, 640 the received stereo program data. The stereo program data may include stereo audio data, plural track audio data, selected tracks of plural track audio data, quadraphonic sound data, surround sound data, text data, video data, or any combination thereof. Reproducing the combined ambient sound signals and the delayed received stereo program data may employ a loudspeaker 520, 520', a headphone 520, an ear bud 520, an ear mold 520, a display 514, a text display 514, a video display 514, an LCD display 514, an LED display 514, an OLED display 514, an AMOLED display 514, a super AMOLED display 514, a touch screen 514, a transparent display screen 514, or any combination of the foregoing. The program data may include audio data, stereo audio data, plural track audio data, quadraphonic sound data, surround sound data, text data, video data, or any combination thereof. The method may further include controlling 512 reproduction of audio data, reproduction of stereo audio data, reproduction of plural track audio data, reproduction of selected tracks of plural track audio data, reproduction of text data, reproduction of video data, or any combination thereof.

A wireless personal receiver 500, 500' for reproducing stereo program data originating from a source, may comprise: a receiver 605 for receiving wireless transmissions and demodulating data contained therein, wherein the data includes at least the stereo program data and locating data; a processor 620 coupled to the receiver 605 for determining the present location of the personal receiver 500, 500' from the locating data, for determining a delay time representative of the difference in time between the stereo program data received via wireless transmission and stereo program data received as sound via the atmosphere; a programmable delay circuit 615 responsive to the processor 620 for delaying the received stereo program data by the determined delay time; a headphone 520 having left and right sound reproducing devices 520L, 520R for reproducing stereo audio in a human perceivable form; a binaural microphone 630 having left and right microphones 530L, 530R proximate the left and right sound reproducing devices 520L, 520R of the headphones 520 for producing respective signals representative of ambient stereo sound proximate the left and right sound reproducing devices 520L, 520R, respectively; and a mixer 650 coupled to the programmable delay circuit 615 for receiving delayed received stereo program data therefrom and coupled to the binaural microphone 630 for receiving respective signals representative of the ambient stereo sound, wherein the mixer 650 combines the delayed received stereo program data and the respective signals representative of the ambient stereo sound for producing a combined stereo audio signal; and wherein the mixer 650 is coupled to the headphones 520 for providing the combined stereo audio signal thereto, wherein the ambient stereo sound thereon reproduced by the headphones 520 is in phase with the ambient stereo sound at the respective ones of the binaural microphones 530, whereby stereo audio sound containing both the delayed stereo program and the ambient stereo sound is reproduced by the headphones 520. The determined delay time may be determined by the processor 620 responsive to atmospheric data including temperature, or relative humidity, or barometric pressure, or any combination of temperature, relative humidity and barometric pressure. Headphones 520 may include a pair of sound reproducing devices 520L, 520R suitable for being respectively located one proximate each of the ears of a user, and the personal receiver 500, 500' may further comprise: binaural microphones 530 including a microphone 530L, 530R proximate each of the respective sound reproducing devices 520L, 520R for producing respective signals representative of ambient stereo sound thereat; a mixer 650 to which the binaural microphones 530 and the programmable delay circuit 615 are coupled for receiving and combining the respective signals from the binaural microphones 530 and the delayed received stereo program data, wherein the combined ambient sound signals and the delayed received stereo program data from the mixer 650 are coupled to the headphones 520 wherein the ambient stereo sound reproduced by the headphones 520 is in phase with the ambient stereo sound at the respective ones of the binaural microphones 530. Headphones 520 may include a loudspeaker 520, 520', a headphone 520, an ear bud 520, an ear mold 520, or any combination of the foregoing. The stereo program data may include audio data, stereo audio data, plural track audio data, quadraphonic sound data, surround sound data, text data, video data, or any combination thereof. Receiver 500, 500' may further include a user control 512 for controlling the stereo program data reproduced by the headphones 520, wherein the user control 512 may control reproduction of audio data, reproduction of stereo audio data, reproduction of plural track audio data, reproduction of selected tracks of plural track audio data, reproduction of quadraphonic sound data, reproduction of surround sound data, reproduction of ambient stereo sound, mixing of stereo program data and ambient stereo sound, reproduction of text data, reproduction of video data, or any combination thereof. Receiver 500, 500' may further comprise a storage device 635, 640, wherein the user control 512 may control recording of audio data, recording of stereo audio data, recording of plural track audio data, recording of selected tracks of plural track audio data, recording of quadraphonic sound data, recording of surround sound data, recording of ambient stereo sound, recording of mixed stereo program data and ambient stereo sound, recording of text data, recording of video data, or any combination thereof, by the storage device 635, 640. The present location of the personal receiver 500, 500' determined by the processor 620 and may include a distance from the source 210, 212 of the stereo program data, a distance from the nearest source 210, 212, of stereo program data where the stereo program data includes stereo audio data, a distance from the nearest source 210L, 210R, 212L, 212R of left and right program data where the program data includes stereo audio data, or a combination thereof. Personal receiver 500, 500' may be in combination with at least three wireless transmitters 220, 222, 230, wherein each of the three wireless transmitters 220, 222, 230 may transmit the locating data, and wherein at least one of the three wireless transmitters 220, 222, 230 may transmit the stereo program data, and wherein at least one of the three wireless transmitters 220, 222, 230 may optionally transmit atmospheric data. Personal receiver 500, 500' may be in combination with at least four wireless transmitters 220, 222, 230, wherein each of the four wireless transmitters 220, 222, 230 may transmit the locating data, whereby the personal receiver 500, 500' may be located in two dimensions and/or in three dimensions, and wherein at least one of the four wireless transmitters 220, 222, 230 may transmit the stereo program data, and wherein at least one of the four wireless transmitters 220, 222, 230 may optionally transmit atmospheric data.

A wireless personal receiver 500, 500' for reproducing stereo program data originating from a source, wherein stereo program data received via the atmosphere may have normal stereo phasing in certain locations and have reversed stereo phasing in other locations, may comprise: a receiver 605 for receiving wireless transmissions and demodulating data contained therein, wherein the data includes at least the stereo program data and locating data; a processor 620 coupled to the receiver 605 for determining the present location of the personal receiver 500, 500' from the locating data, and for determining from the determined location whether the stereo program data at the determined location has normal stereo phasing or has reversed stereo phasing; a programmable delay circuit 615 responsive to the processor 620 for delaying the received stereo program data by a predetermined delay time; a device 520, 520' coupled to the programmable delay circuit 615 for reproducing the delayed received stereo program data in a human perceivable form; and a spatial correction device 680 coupled to the processor 620 and to at least one of the programmable delay circuit 615 and the reproducing device 520, 520', for reversing the phasing of the delayed received stereo program data reproduced by the reproducing device 520, 520' when the processor 620 determines that the stereo program data at the determined location has reversed stereo phasing, whereby the received stereo program sound produced by the device 520, 520' for reproducing is in phase with ambient sound in the location of the personal receiver 500, 500'. The predetermined delay time may be determined by the processor 620 responsive to atmospheric data including temperature, or relative humidity, or barometric pressure, or any combination of temperature, relative humidity and barometric pressure. The device 520, 520' for reproducing the delayed received stereo program data may include a pair of sound reproducing devices 520L, 520R, 520L', 520R' suitable for being respectively located one proximate each of the ears of a user, the personal receiver 500, 500' may further comprise: binaural microphones 530 including a microphone 530L, 530R proximate each of the respective sound reproducing devices 520L, 520R for producing respective signals representative of ambient stereo sound thereat; a mixer 650 to which the binaural microphones 530 and the programmable delay circuit 615 are coupled for receiving and combining the respective signals from the binaural microphones 530 and the delayed received stereo program data, wherein the combined ambient sound signals and the delayed received stereo program data from the mixer 650 are coupled to the device 520, 520' for reproducing the delayed received stereo program data wherein the ambient stereo sound reproduced by the device 520, 520' is in phase with the ambient stereo sound at the respective ones of the binaural microphones 530. The personal receiver 500, 500' may further include a user control 512 for controlling the stereo program data reproduced by the device 520, 520' for reproducing the delayed received stereo program data, wherein the user control 512 may control reproduction of audio data, reproduction of stereo audio data, reproduction of plural track audio data, reproduction of selected tracks of plural track audio data, reproduction of quadraphonic sound data, reproduction of surround sound data, reproduction of ambient stereo sound, mixing of stereo program data and ambient stereo sound, reproduction of text data, reproduction of video data, or any combination thereof. The personal receiver 500, 500' may further comprise a storage device 635, 640, wherein the user control 512 may control recording of audio data, recording of stereo audio data, recording of plural track audio data, recording of selected tracks of plural track audio data, recording of quadraphonic sound data, recording of surround sound data, recording of ambient stereo sound, recording of mixed stereo program data and ambient stereo sound, recording of text data, recording of video data, or any combination thereof, by the storage device 635, 640.

A wireless personal receiver 500, 500' for reproducing left and right channel stereo program data wherein stereo program data received via the atmosphere includes left and right channel stereo sound produced by left and right channel stereo transducers 210L, 210R, 212L, 212R, may comprise: a receiver 605 for receiving wireless transmissions and demodulating data contained therein, wherein the data includes at least the left and right channel stereo program data and locating data; a processor 620 coupled to the receiver 605 for determining the present location of the personal receiver 500, 500' from the locating data, and for determining respective distances from the determined location to the respective left and right channel stereo transducers 210L, 210R, 212L, 212R; a programmable delay circuit 615 responsive to the processor 620 for delaying the received left and right channel stereo program data by respective predetermined delay times representative of sound transmission through the atmosphere to the determined location from the respective left and right channel stereo transducers 210L, 210R, 212L, 212R; a personal sound transducer 520, 520' coupled to the programmable delay circuit 615 for reproducing the delayed received stereo program data in a human perceivable form; and whereby the received stereo program sound produced by the personal sound transducer 520, 520' is substantially in phase with ambient sound from left and right channel stereo transducers 210L, 210R, 212L, 212R in the location of the personal receiver. The respective predetermined delay times may be determined by the processor 620 responsive to atmospheric data including temperature, or relative humidity, or barometric pressure, or any combination of temperature, relative humidity and barometric pressure. The personal sound transducer 520, 520' may include a pair of sound reproducing devices 520L, 520R, 520L', 520R' suitable for being respectively located one proximate each of the ears of a user, the personal receiver 500, 500' may further comprise: binaural microphones 530 including a microphone 530L, 530R proximate each of the respective sound reproducing devices 520L, 520R for producing respective signals representative of ambient left and right channel stereo sound thereat; a mixer 650 to which the binaural microphones 530 and the programmable delay circuit 615 are coupled for receiving and combining the respective signals from the binaural microphones 530 and the delayed received left and right channel stereo program data, wherein the combined ambient left and right channel sound signals and the delayed received left and right channel stereo program data from the mixer 650 are coupled to the personal sound transducer 520, 520' wherein the ambient left and right channel stereo sound reproduced by the personal sound transducer 520, 520' is in phase with the ambient stereo sound at the respective ones of the binaural microphones 530. The personal sound transducer 520, 520' includes a loudspeaker 520, 520', a headphone 520, an ear bud 520, an ear mold 520, a display 514, a text display 514, a video display 514, an LCD display 514, an LED display 514, an OLED display 514, an AMOLED display 514, a super AMOLED display 514, a touch screen 514, a transparent display screen 514, or any combination of the foregoing. The stereo program data may include left and right channel stereo audio data, plural track audio data, quadraphonic sound data, surround sound data, text data, video data, or any combination thereof. The personal receiver 500, 500' may further include a user control 512 for controlling the left and right channel stereo program data reproduced by the personal sound transducer 520, 520', wherein the user control 512 may control reproduction of left and right channel stereo audio data, reproduction of plural track audio data, reproduction of selected tracks of plural track audio data, reproduction of quadraphonic sound data, reproduction of surround sound data, reproduction of ambient left and right channel stereo sound, mixing of left and right channel stereo program data and left and right channel ambient stereo sound, reproduction of text data, reproduction of video data, or any combination thereof. The user control 512 may control recording of left and right channel stereo audio data, recording of plural track audio data, recording of selected tracks of plural track audio data, recording of quadraphonic sound data, recording of surround sound data, recording of ambient left and right channel stereo sound, recording of mixed left and right channel stereo program data and ambient left and right channel stereo sound, recording of text data, recording of video data, or any combination thereof, by the storage device 635, 640.

A wireless device for selectively reproducing program data including program video data and program audio data in known time synchronization and originating from a source in a venue having a boundary and at least one sound reproducing transducer therein, may comprise: a receiver for receiving wireless transmissions and demodulating program data contained therein, wherein the program data includes at least program video data, program audio data, and time synchronization data for the program video data and the program audio data; a storage device for storing a time segment of the received program video data and a time segment of the received program audio data; at least one sound transducer receiving natural sound via the atmosphere from the at least one sound reproducing transducer, the received natural sound being delayed by the speed of sound in the atmosphere; a correlator correlating one or more stored segments of the received program audio data and one or more segments of the received delayed natural sound to determine a segment of the received program audio data that corresponds to a segment of the received delayed natural sound; a processor coupled to said correlator for determining from the segment of the received program audio data that corresponds to a segment of the received delayed natural sound a number of video frames of delay by which the received program video data that corresponds in time to the segment of the received program audio data that corresponds to a segment of the received delayed natural sound is delayed from the received delayed natural sound; and a display coupled to said storage device for reproducing in human perceivable form the program video data delayed by the number of video frames determined by said processor, whereby the received video reproduced by the display of said wireless device is substantially in time alignment with ambient natural sound from the sound reproducing transducer of the venue. The determined number of video frames may be an integer number selected by: rounding the determined number of video frames to the integer value closest thereto; or rounding the determined number of video frames down if the determined number of video frames is less than a predetermined portion of a video frame and rounding the determined number of video frames up if the number of video frames is greater than the predetermined portion of a video frame; or rounding the determined number of video frames down to the next lowest integer value. The wireless device may further comprise: a sound transducer coupled to said delay circuit for reproducing the received program audio data in a human perceivable form in time synchronization with the reproduced delayed program video data; whereby the received audio data reproduced by the sound transducer is substantially in time alignment with the reproduced program video data and with ambient natural sound from the sound reproducing transducers of the venue in the location of said wireless device. The program video data and the program audio data may be received in a composite signal in which the time synchronization data is inherent therein; or the program video data and the program audio data may be received in separate signals each of which includes respective time synchronization data therein; or the program video data and the program audio data may be received in separate signals and the time synchronization data therefor is received in a separate signal. The program video data and the program audio data may be re received in a composite signal in which the time synchronization data is inherent therein and are demodulated and/or demultiplexed from the composite signal. The wireless device may comprise: a personal digital assistant (PDA), a mobile phone, a Blackberry® device, an MP3 player, an iPod® device, a smart phone device, an iPhone® device, an ANDROID device, a GALAXY device, a satellite radio receiver, a tablet computer, a netbook computer, a notebook computer, and/or a personal computer, with or without a docking station therefor. The display may comprise: a video screen, an LCD display, an OLED display, an AMOLED display, an LED display, a super AMOLED display, a touch screen, a transparent display screen, a large screen display, a JUMBOTRON® screen, a video wall, a video truck, a television, a monitor, and/or a projection TV. The correlator may correlate in response to: receiving of a wireless transmission, natural sound level, a change in natural sound level, frequency content of the received natural sound, a change in the frequency content of the received natural sound, a location of said wireless device, a change in location of said wireless device, a time, a time interval, an accelerometer, a motion detector, a compass, a manual actuation, an electronic actuation, or a combination thereof. The program data may further include locating data, and said wireless device may further comprise: said storage device storing a representation of the venue including locations of the at least one sound reproducing transducer of the venue therein; wherein said processor is coupled to said receiver and to said storage device for determining from the locating data and from the stored representation of the venue the present location of said wireless device in the venue and a distance to the at least one sound reproducing transducer of the venue; wherein said processor controls said correlator to correlate in response to the determined location of said wireless device in the venue and/or a change of the determined location of said wireless device in the venue. The program data may further include locating data, and said wireless device may further comprise: said storage device storing a representation of the venue including locations of the at least one sound reproducing transducer of the venue therein; wherein said processor is coupled to said receiver and to said storage device for determining from the locating data and from the stored representation of the venue the present location of said wireless device in the venue; wherein said processor causes a representation of the venue to be displayed on said display and further causes an indicator of the determined location of said wireless device and/or an indicator of a predetermined location in the venue to be displayed on the displayed representation of the venue. The at least one sound transducer may include: a microphone that is part of said wireless device; an external microphone that is connected to said wireless device; an external binaural microphone that is connected to said wireless device; or a combination thereof. The wireless device may further comprise an imager for capturing still images, video images, or both, wherein captured images may be displayed on said display, stored in a storage device of said wireless device, edited by said wireless device, transmitted by a transmitter of said wireless device, exported by said wireless device, or a combination thereof. The captured images stored in the storage device of said wireless device may be synchronized to the delayed program video data delayed by the number of video frames determined by said processor. The wireless device may further comprise a transmitter, wherein said transmitter connects via AM, FM, phase modulation, CDMA, TDMA, spread spectrum, WiFi, Bluetooth, Zigbee, 3G, 4G, LPS, a radio frequency link, a wireless network, and/or a combination thereof, and wherein said receiver connects via AM, FM, phase modulation, CDMA, TDMA, spread spectrum, WiFi, Bluetooth, Zigbee, 3G, 4G, LPS, a radio frequency link, a wireless network, and/or a combination thereof; and wherein said wireless device may further connect via said transmitter and said receiver to a network, a wired network, a cable, a USB cable, and/or the Internet. An authorization may be stored in said storage device, wherein said processor is responsive to the stored authorization for enabling the reproducing of program video data by said display. An authorization may be stored in said storage device, wherein said processor is responsive to the stored authorization for enabling the reproducing of program video data by said display and the reproducing of program audio data by said sound transducer of said wireless device. An authorization may be stored in said storage device, wherein the authorization is representative of rights to control a function of said wireless device selected from the group consisting of: reproducing program video data, reproducing program audio data, storing and playing back video program data, storing and playing back program audio data, mixing program video data with image data provided by an imager of said wireless device, recording and playing back the mixed video data, mixing program audio data with audio data provided by said microphone, recording and playing back the mixed audio data, or a combination of any of the foregoing; wherein said processor is responsive to the stored authorization for enabling the selected function or functions of said wireless device represented by the rights of the stored authorization. The processor may be responsive to the stored authorization for disabling the function or functions of said wireless device not enabled responsive to the stored authorization. Each of the rights to control a function of said wireless device represented by the authorization may have a predetermined fee payment associated therewith. Electronic ticket data may be stored in said storage device, the electronic ticket data including data representative of: a name of an event, a name of an artist and/or performer, the date and/or time of the event, a seat identifier, a section and/or area identifier, a date and/or time of ticket issuance, a ticket transaction history, ticket transfers, ticket upgrades and downgrades, gate opening times, seating available time, ticket redemption and/or exchange times and conditions, a venue name and/or address, a customer service telephone number, a telephone number, a customer service e-mail address, an e-mail address, a ticket number, a barcode and/or barcode number, a scannable barcode and/or QR code, a request for body part and/or other biometric data, authorizations available and/or purchased and/or otherwise granted, a date of distribution, a ticket proprietor and/or manufacturer, an event proprietor, a ticket price, tax and fee data, promotional offers available, system identifiers, transaction numbers, tracking numbers, a name, address, telephone, e-mail address, credit and debit card numbers, account numbers, photo images, body part images, biometric data, personal data, photo identification data, facial recognition data, fingerprint data, or any combination thereof. At least a portion of the electronic ticket data may be stored in said storage device in connection with a transaction to obtain the electronic ticket, and wherein at presentation of the electronic ticket, a physical ticket corresponding thereto, or both, ticket data corresponding to at least a portion of the stored electronic ticket data is collected and compared to the stored electronic ticket data for determining whether the collected ticket data matches the stored electronic ticket data to validate the electronic ticket, the physical ticket corresponding thereto, or both.

A wireless device for selectively reproducing program data including program video data and/or program audio data in known time synchronization and originating from a source in a venue having a boundary and at least one sound reproducing transducer therein, said wireless device may comprise: a receiver for receiving wireless transmissions and demodulating program data contained therein, wherein the program data includes at least program video data and program audio data; at least one sound transducer receiving natural sound via the atmosphere from the at least one sound reproducing transducer, the received natural sound being delayed by the speed of sound in the atmosphere; means for substantially aligning the received program video data, the received program audio data, or both, in time synchronization with the received delayed natural sound; a reproducing device for reproducing in human perceivable form the received program video data, the received program audio data, or both, in time synchronization with the received delayed natural sound; wherein said means for substantially aligning performs the substantially aligning the received program video data, the received program audio data, or both, in time synchronization with the received delayed natural sound in response to: receiving a wireless transmission, a natural sound level, a location of said wireless device, a change in location of said wireless device, or both; whereby the received program data reproduced by the reproducing device of said wireless device is substantially in time alignment with ambient natural sound from the sound reproducing transducer of the venue. The means for substantially aligning may further perform the substantially aligning the received program video data, the received program audio data, or both, in time synchronization with the received delayed natural sound in response to: receiving a wireless transmission, a natural sound level, a change in natural sound level, a frequency content of the received natural sound, a change in the frequency content of the received natural sound, a time, a time interval, an accelerometer, a motion detector, a compass, an imager, a manual actuation, an electronic actuation, or a combination thereof. The means for substantially aligning the received program data may comprise: a storage device for storing at least segments of the received program video data and the received program audio data; at least one sound transducer receiving natural sound via the atmosphere from the at least one sound reproducing transducer, the received natural sound being delayed by the speed of sound in the atmosphere; a correlator correlating one or more stored segments of the received program audio data and one or more segments of the received delayed natural sound to determine a segment of the received program audio data that corresponds to a segment of the received delayed natural sound; wherein said processor is coupled to said correlator for determining from the segment of the received program audio data that corresponds to a segment of the received delayed natural sound a delay by which the received program data that corresponds in time to the segment of the received program audio data that corresponds to a segment of the received delayed natural sound is delayed from the received delayed natural sound; wherein said reproducing device is coupled to said storage device for reproducing the program data delayed by the delay determined by said processor. The correlator may correlate in response to: receiving a wireless transmission, a natural sound level, a change in natural sound level, a frequency content of the received natural sound, a change in the frequency content of the received natural sound, a time, a time interval, an accelerometer, a motion detector, a compass, an imager, a manual actuation, an electronic actuation, or a combination thereof. The delay applied to program video data may be a number of video frames. The reproducing device may include: a display for reproducing delayed program video data; or a sound transducer for reproducing the received program audio data; or a display for reproducing delayed program video data and a sound transducer for reproducing the received program audio data. The program data may further include locating data, said wireless device further comprising: said storage device storing a representation of the venue including locations of the at least one sound reproducing transducer of the venue therein; wherein said processor is coupled to said receiver and to said storage device for determining from the locating data and from the stored representation of the venue the present location of said wireless device in the venue and a distance to the at least one sound reproducing transducer of the venue; wherein said processor controls said correlator to correlate in response to the determined location of said wireless device in the venue, a change of the determined location of said wireless device in the venue and/or a change in the distance to the at least one sound reproducing transducer. The representation of the venue including locations of the at least one sound reproducing transducer of the venue therein may include: a digital map, a digital plan, a two dimensional CAD drawing, a three dimensional CAD drawing, or a combination there of; and wherein the representation of the venue including locations of the plural sound reproducing transducers of the venue therein may optionally include: a representation of acoustical properties of the venue and/or of the plural sound reproducing transducers therein. The wireless device may further comprise: a locating device, said locating device including a GPS locator, a compass, an accelerometer, a motion detector, an imager, and/or a physical motion detecting device, wherein said correlator correlates in response to location data, a change in location data, or both, produced by said locating device.

A wireless device for selectively reproducing transmitted program data relating to audio data originating as natural sound from a source in a venue having at least one sound reproducing transducer therein, said wireless device may comprise: a receiver and a transmitter for receiving and transmitting wireless transmissions, including receiving program data related to the audio data; at least one sound transducer receiving natural sound via the atmosphere from the at least one sound reproducing transducer, the received natural sound being delayed by the speed of sound in the atmosphere; means for correlating one or more segments of received data and one or more segments of the received delayed natural sound to identify the received program data that corresponds to a segment of the received delayed natural sound; wherein said means for correlating correlates in response to: receiving a wireless transmission, or a location of said wireless device, or a change in location of said wireless device, or a combination thereof; wherein said receiver receives remotely originated data related to the identified received program data; a reproducing device for reproducing in human perceivable form the received program data, the received remotely originated data, or both; whereby the received program data and/or the remotely originated data is reproduced by the reproducing device of said wireless device. The transmitter may transmit one or more segments of the received program data or of the received delayed natural sound, or both, and said receiver may receive the received remotely originated data. The correlator may correlate the received program data and the delayed natural sound for determining a time difference therebetween; and wherein said reproducing device reproducing the received program data, the received remotely originated data, or both, in time synchronization with the received delayed natural sound; whereby the received program data and/or the remotely originated data is reproduced by the reproducing device substantially in time alignment with ambient natural sound from the sound reproducing transducer of the venue. The wireless device may comprise: a personal digital assistant (PDA), a mobile phone, a Blackberry® device, an MP3 player, an iPod® device, a smart phone device, an iPhone® device, an ANDROID device, a GALAXY device, a satellite radio receiver, a tablet computer, a netbook computer, a notebook computer, and/or a personal computer, with or without a docking station therefor.

A wireless device for reproducing when authorized program data including program data generally corresponding to natural sound originating from one or more sound reproducing transducers within a venue, said wireless device may comprise: a receiver for receiving wireless transmissions and demodulating data contained therein, wherein the data includes at least locating data and authorization data and the program data, the authorization data including authorized location data, and optionally biometric data; a storage device optionally storing a representation of the venue including predetermined locations therein and locations of the one or more sound reproducing transducers within the venue; a processor coupled to said receiver for determining from the locating data and optionally from the stored representation of the venue the location of said wireless device; a reproducing device coupled to the storage device for reproducing the received program data in a human perceivable form; an input device optionally for providing user biometric data; and said processor determining from the authorization data an authorization for reproducing the received program data and/or the delayed received program data if the determined location of said wireless device is a location defined by the authorized location data, and optionally if the user biometric data matches the authorization biometric data; wherein said processor enables said reproducing device to reproduce received program data in accordance with the authorization if the determined location of said wireless device is a location defined by the authorized location data, and optionally if the user biometric data matches the authorization biometric data, whereby program data is reproduced only if reproduction thereof is authorized by the authorization data. The processor may determine from the determined location of said wireless device and from the stored representation of the venue the location of said wireless device a delay representative of the difference in time between program data received via wireless transmission and program data received via the atmosphere as natural sound originating from the one or more sound reproducing transducers; said processor controlling said storage device to delay said reproducing device reproducing the received program data by the determined delay. The processor may disable reproduction and use of the program data if the determined location of said wireless device is not a location defined by the authorization location data, or if the user biometric data does not match the authorization biometric data, if the determined location of said wireless device is not within the venue, or if the location of said wireless device is not within a predetermined boundary, or if the time is not within a predetermined time period, or if the authorization does not correspond with a predetermined condition, or if a ticket number is not a predetermined ticket number, or a combination thereof. The authorization data may define the predetermined condition to include: a location, or a location, space, section and/or seat within the venue, or a map including a location, or an Internet Protocol (IP) address, or an electronic serial number (ESN), or unique identifying data associated with said wireless device, or a stored access authorization, or a stored ticket access authorization, or an admission authorization, or an in attendance ticket authorization, or a combination thereof. The biometric data may include: an image of a body part, a facial image, a facial recognition image, an iris scan, a finger scan, a vein scan, a fingerprint, or a combination thereof. An authorization may be stored in said storage device, wherein the authorization may be representative of rights to control a function of said wireless device selected from the group consisting of: reproducing program video data, reproducing program audio data, storing and playing back video program data, storing and playing back program audio data, capturing image data provided by an imager of said wireless device, mixing program video data with image data provided by the imager of said wireless device, recording and playing back the mixed video data, mixing program audio data with audio data provided by said microphone, recording and playing back the mixed audio data, or a combination of any of the foregoing; wherein said processor is responsive to the stored authorization for enabling the selected function or functions of said wireless device represented by the rights of the stored authorization. The processor may be responsive to the stored authorization for disabling a function or functions of said wireless device not enabled responsive to the stored authorization. The wireless device may further comprise a transmitter for communication wirelessly, wherein said transmitter and said receiver of said wireless device communicate wirelessly with a ticketing entity for conducting a transaction, the transaction including: obtaining a ticket, obtaining an authorization, changing a ticket, changing an authorization, transferring a ticket, transferring an authorization, upgrading and/or downgrading a ticket, upgrading and/or downgrading an authorization, optionally making payment for any of the foregoing, or a combination thereof. Information relating to the transaction may be stored by the ticketing entity for tracking a ticket, for transferring a ticket for conducting a transaction, the transaction including: issuing a ticket, for issuing an authorization, for changing a ticket, for changing an authorization, for transferring a ticket, for transferring an authorization, for upgrading and/or downgrading a ticket, for upgrading and/or downgrading an authorization, optionally making payment for any of the foregoing, or a combination thereof. The determined location of said wireless device may be utilized for tracking said wireless device within the venue, for auditing authorizations for said wireless device, or for auditing authorizations for said wireless device relative to the location thereof, or for a combination thereof.

A method for obtaining ticket and/or an authorization from a ticketing entity may comprise: communicating an offer to obtain a ticket, an authorization or both, wherein both the ticket and the authorization relate to a certain event; receiving response data related to obtaining a ticket and/or an authorization for the certain event, the received data including event identifying data, authorization identifying data, personal data, payment data, remote device identifying data, and optionally biometric data; storing the received event identifying data, authorization identifying data, personal data, payment data, remote device identifying data, and optionally biometric data; storing ticket data representing a ticket, authorization data representing an authorization, or both, corresponding to the received response data; and transmitting the ticket data, the authorization data, or both, corresponding to the received response data, to a remote device; wherein the ticket data, the authorization data, or both, control the remote device in accordance with the ticket data, authorization data, or both; receiving at least ticket data, personal data and remote device identifying data when a ticket including the ticket data is presented for using the ticket, the authorization, or both, verifying the received at least ticket data, personal data and remote device identifying data by comparison with the stored ticket data, personal data and remote device identifying data; and if the ticket data, personal data and remote device identifying data are verified, then issuing a verification enabling admission to the certain event and use of the remote device including the ticket data, the authorization data, or both, the remote device being thereby enabled in accordance with the ticket data, the authorization data, or both, if the ticket data, personal data and remote device identifying data are not verified, then not issuing a verification and denying admission to the certain event and denying use of the remote device thereat, whereby the ticketing entity maintains control of the issued ticket and of the authorization associated therewith. The verification issued: may enable functions of the remote device that are authorized by the authorization data; or may disable functions of the remote device that are not authorized by the authorization data; or may enable functions of the remote device that are authorized by the authorization data and disables functions of the remote device that are not authorized thereby. The method may further comprise: utilizing the stored ticket data, the stored personal data, and stored biometric data received and stored prior to issuing the ticket for controlling the ticket. The method may further comprise: receiving a request to transfer an issued ticket including request data related to transferring the issued ticket, the request data including issued ticket identifying data, authorization identifying data, personal data for a transferee, payment data, and optionally biometric data for a transferee; storing the received personal data for a transferee, event identifying data, payment data, and optionally biometric data for a transferee; storing replacement ticket data representing a replacement ticket, authorization data representing an authorization relating to the replacement ticket, or both, corresponding to the requested data; and transmitting the replacement ticket data, the authorization data relating thereto, or both, corresponding to the request data, to a different remote device; wherein the replacement ticket data, the authorization data relating thereto, or both, control the different remote device in accordance with the replacement ticket data, the authorization data relating thereto, or both; and transmitting data to the remote device to deactivate and/or delete the ticket data, authorization data, or both, previously transmitted thereto, whereby the ticketing entity maintains control of the issued ticket and of the transfer thereof. The method may further comprise: receiving with the request to transfer an issued ticket issued ticket identifying data and personal data for a transferor, and optionally biometric data for a transferor; and storing the issued ticket identifying data, the personal data for a transferor, and optionally the biometric data for a transferor; and verifying the stored issued ticket identifying data, the stored personal data for a transferor, and optionally the stored biometric data for a transferor, with the ticket data, received personal data, and the optional biometric data received and stored prior to issuing the issued ticket. The method may further comprise: utilizing the stored issued ticket identifying data, the stored personal data for a transferor, the optional stored biometric data for a transferor, and the stored ticket data, the stored personal data, and the optional stored biometric data received and stored prior to issuing the issued ticket for controlling the issued ticket, the replacement ticket, or both. The method may further comprise: receiving a request to upgrade, downgrade, or both, authorizations relating to an issued ticket including change data related to authorizations to be upgraded, authorizations to be downgraded, or both, the change data including issued ticket identifying data, identifying data for the authorizations to be upgraded, downgraded, or both, personal data for a requester, payment data, and optionally biometric data; storing the received change data including issued ticket identifying data, identifying data for the authorizations to be upgraded, downgraded, or both, personal data for a requester, payment data, and optionally biometric data; storing changed authorization data representing the authorizations to be upgraded, the authorizations to be downgraded, or both, corresponding to the change data; and transmitting the changed authorization data representing the authorizations to be upgraded, the authorizations to be downgraded, or both, to the remote device.

A wireless device for reproducing when authorized program data relating to an event at a venue, the program data generally corresponding to natural sound originating from one or more sound reproducing transducers within the venue, the natural sound having a sound pressure level and a frequency spectrum at locations in the venue that differs from the sound pressure level and the frequency spectrum thereof at locations outside the venue, said wireless device may comprise: a receiver for receiving wireless transmissions, wherein the data therein includes at least the program data; at least one sound transducer receiving natural sound via the atmosphere from the at least one sound reproducing transducer, the received natural sound being delayed by the speed of sound in the atmosphere; a processor coupled to said sound transducer for determining from the received natural sound the sound pressure level thereof, the frequency content thereof, or both, said processor comparing the sound pressure level of the received natural sound to a predetermined sound pressure level, or comparing the frequency content of the received natural sound to a predetermined frequency content or spectrum, or both, said processor disabling the processing of received program data if, at the venue during a time for the event, the sound pressure level of the received natural sound is less than the predetermined sound pressure level or if the frequency content of the received natural sound is not within the predetermined frequency content or spectrum, or both, thereby indicating that said wireless device is not in the venue, and said processor enabling the processing of received program data if, at the venue during a time for the event, the sound pressure level of the received natural sound is greater than the predetermined sound pressure level or if the frequency content of the received natural sound is within the predetermined frequency content or spectrum, or both, thereby indicating that said wireless device is in the venue at the time of the event; whereby program data is reproduced only if the sound pressure level and/or frequency content or spectrum of the natural sound is consistent with a location in the venue during an event. The wireless device may further comprise: a reproducing device for reproducing the received program data in a human perceivable form when enabled by said processor; whereby program data is reproduced only if the sound pressure level and/or frequency content or spectrum of the natural sound is consistent with a location in the venue during an event. Authorization data may be stored in said wireless device, said processor determining from the authorization data an authorization for processing the received program data if said wireless device is in the venue during the time of the event, and wherein said processor enables the processing of the received program data in accordance with the authorization if said wireless device is at a location defined by the authorization data. The wireless device may further comprise: a storage device having a representation of the venue stored therein, the stored representation having received natural sound pressure levels at a boundary of the venue, natural sound frequency content or spectrum at the boundary of the venue, or both, therein, wherein the stored representation defines the predetermined sound pressure level, the predetermined frequency content or spectrum, or both.

A method for controlling a remote wireless device utilizing ticket data, an authorization, or both, from a ticketing entity, may comprise: communicating with a remote device for providing thereto a ticket and an authorization relating to a certain event and for receiving remote device identifying data; transmitting ticket data, authorization data, or both, corresponding to the certain event to the remote device; storing the ticket data, authorization data, or both, and the received remote device identifying data; wherein the ticket data, the authorization data, or both, control the remote device in accordance with the ticket data, authorization data, or both, during the certain event; receiving at least ticket data and remote device identifying data when a ticket including the ticket data is presented for using the ticket, the authorization, or both, verifying the received at least ticket data, and remote device identifying data by comparison with stored ticket data and remote device identifying data; and if the ticket data remote device identifying data are verified, then enabling admission to the certain event and use of the remote device at the certain event including the ticket data, the authorization data, or both, the remote device being thereby enabled in accordance with the ticket data, the authorization data, or both, if the ticket data and remote device identifying data are not verified, then disabling functions of the remote device at the certain event, whereby the ticketing entity maintains control of the remote device during the certain event in accordance with issued ticket and of the authorization associated therewith. The enabling and disabling may include: enabling functions of the remote device that are authorized by the authorization data; or disabling functions of the remote device that are not authorized by the authorization data; or enabling functions of the remote device that are authorized by the authorization data and disabling functions of the remote device that are not authorized thereby. The method may further comprise: transmitting to the remote device a representation of the venue including received natural sound pressure levels at a boundary of the venue, natural sound frequency content or spectrum at the boundary of the venue, or both, therein, wherein the transmitted representation defines the predetermined sound pressure level, the predetermined frequency content or spectrum, or both.

As used herein, a location is considered to be distant from a sound source, e.g., a live performer or a loudspeaker, if any perceivable time difference were to exist between the sound as received naturally from the source via the atmosphere (natural sound) and the sound as received via transmission to such location by radio, optical or another wireless arrangement, i.e without any time delay in the wireless transmission to compensate for the slower speed of sound propagation through the atmosphere as compared to the higher speed of propagation of radio or optical signals (e.g., at close to the speed of light). Ambient sound at a given location generally includes natural sound at that location plus sound from other sources at a volume sufficient to be perceived at the given location.

As used herein in relation to personal receiver and/or wireless device 500, 500', 500-500' the term “processor” includes controller 620 and all or parts of receiver-demodulator 605, de-multiplexer 610, digital delay circuit 615, local positioning system 625, digital mixer 650, and/or spatial correction circuit 680, and/or correlator 690 that perform a processing function, such as might be performed by a one or more microprocessors. It is understood that a given electronic device, such as a microprocessor, may perform functions described in relation to the foregoing elements of circuit 600, and so the demarcations between functional elements 605-690 in circuit 600 may or may not correspond to actual devices and components in any particular physical embodiment thereof, and/or that plural functions may be shared among plural microprocessors as may be convenient. It is further understood that certain functions 605-690 may be performed in or by or assisted by a digital processor or microprocessor under the control of software, such as an operating system software and/or application software, and so the various functional boxes 605-690 may or may not correspond to respective physical components.

As used herein, the term “about” means that dimensions, sizes, formulations, parameters, shapes and other quantities and characteristics are not and need not be exact, but may be approximate and/or larger or smaller, as desired, reflecting tolerances, conversion factors, rounding off, measurement error and the like, and other factors known to those of skill in the art. In general, a dimension, size, formulation, parameter, shape or other quantity or characteristic is “about” or “approximate” whether or not expressly stated to be such. It is noted that embodiments of very different sizes, shapes and dimensions may employ the described arrangements.

Atmospheric condition as used herein implies a condition, e.g., temperature, relative humidity, and/or barometric pressure, at a location relatively geographically close to venue 100, 100', 100" at a time relatively close in time to the current time so as to be representative of the actual current atmospheric condition at venue 100, 100', 100". Similarly, audio and sound includes stereo or stereophonic sound and audio, and stereo or stereophonic sound includes at least two channels of audio data, e.g., at least a left channel and a right channel, and also includes plural channel signals such as plural track audio data, quadraphonic audio, 4.1, 5.1, 7.1 and greater surround, pseudo-surround, and quasi-surround sound. In each case, the stereo, quadraphonic and/or surround sound from one or more sound reproduction devices and/or program data may be delayed in time as described herein by the same delay time or may be delayed in time by different amounts of time generally relating to distances from the nearest loudspeakers or other transducers that reproduce such channels of audio/sound.

In the drawing, paths for analog signals and for digital signals having one bit are generally shown as single lines and single line arrows, and paths for digital signals including multiple bits are generally shown as broad arrows, however, single-bit signals, serial information and words may be transmitted over a path shown by either a single line arrow or a broad arrow. A diagonal slash across a single line arrow or a broad arrow accompanied by a number nearby may be used to indicate the number of bits of the digital signals passing along the path indicated thereby.

While the present invention has been described in terms of the foregoing example embodiments, variations within the scope and spirit of the present invention as defined by the claims following will be apparent to those skilled in the art. For example, a receiver 500, 500' may include all of the functions and features described herein or may include only selected ones thereof, and may be utilized in locations and settings other than concert and entertainment venues.

A receiver 500, 500' may be configured to only include the automatic determination of the time delay that is needed to bring the wirelessly broadcast program audio into time alignment with the natural sound, i.e. using a calculated actual speed of sound based upon actual atmospheric conditions.

Similarly, a receiver 500, 500' could be configured to only include the automatic correction of stereo phasing, i.e. when receiver 500, 500' is in an area of reversed stereo phasing of the natural sound.

Further, a receiver 500, 500' could be configured to only include the binaural microphones and automatic volume adjustment so that the user can control the level of natural sound relative to the level of reproduced program audio. As is preferred, the ambient sound from each of binaural microphones 530L, 530R may be separately adjusted in level and reproduced in left and right speakers 520L, 520R of headphones 520 so as best to compensate for the attenuation of the left and right headphones 520L, 520R, however, it may be acceptable to adjust both left and right sound levels based upon an average of the sound levels from microphones 530.

While a receiver in certain venues may receive transmitted signals and the data therein from any number of transmitters 220, 222, 230, receiver 500, 500' typically selects the three (or four, as appropriate) signals from the nearest transmitters from which to determine its location, which may be within boundary 120 or may be outside of boundary 120. Optionally, receiver 500, 500' may or may not be programmed, e.g., by authorization data, including location authorization data, for disabling some or all of its functions if it determines its location to be outside of boundary 120.

Wireless transmitters 220, 222, 230 may be arranged so that both channels of stereo program audio are transmitted by the same transmitter, or by selected ones of the transmitters. Alternatively, left and right transmitters 220X, 220Y may be arranged to transmit the left and right program audio channels, respectively. Similarly, atmospheric data, authorization data, text data and/or video data may be transmitted by all or by selected ones of transmitters 220, 222, 230. Preferably, the temperature sensors and other optional atmospheric sensors may be co-located with the transmitter or transmitters 220, 222, 230 that transmit atmospheric data, or may be located centrally and the data communicated to the transmitter or transmitters 220, 222, 230 that transmit such data.

While it is preferred that the determination of the actual local speed of sound be determined by receivers 500, 500' based upon atmospheric data received from transmitters 220, 222, 230, the local speed of sound may be determined from local atmospheric data and then be transmitted by transmitters 220, 222, 230 to receivers 500, 500'. Further atmospheric sensors may be included in receivers 500, 500', however, this arrangement is thought to be less accurate because of the wide variation in the possible placement and covering of receiver 500, 500' by a particular user.

Receiver 500, 500' typically and preferably receives indications of the actual local atmospheric conditions in the signal transmitted by one or more of wireless transmitters 220, 222, 230, however, receiver 500, 500' could include a temperature sensor for determining the actual local temperature and receiver 500, 500' could utilize that sensed temperature in determining the actual speed of sound in the venue and the appropriate time delay for synchronizing the broadcast program audio with the natural sound.

While temperature is the atmospheric condition that has the most pronounced effect on the speed of sound, and is in many instances sufficient for determining the local actual speed of sound, other atmospheric conditions such as relative humidity and/or barometric pressure do affect the speed of sound and could be included in the atmospheric data transmitted by transmitters 220, 222, 230, e.g., as might be advantageous for more precise time alignment of program audio and natural sound larger venues.

Program data, e.g., program video data, program audio data and/or program text data may include commercial or other messages and/or offers for goods and services relating to the event, venue, artist, performer and the like, or to unrelated goods and services. Such messages may include links or other devices by which a web site or other purchasing entity may be communicated with for the purchase of such offered goods and services.

Similarly to receiver 500, 500' determining its location for selecting broadcast program audio for reproduction via headphones 520, a receiver 500, 500' could be utilized in a commercial setting, such as in a large store, grocery store, supermarket, hypermarket or shopping mall, to select the audio program from a nearby speaker 210 or other source for reproduction in a shopper's or patron's headphones 520 thereby to deliver location specific messages, e.g., sales messages. Further, user inquiries inputted via control 512 may be processed and responded to where receiver 500, 500' is configured for a WiFi or other transmit-capable communication. Communication formats may employ any suitable form of modulation and format, e.g., AM, FM, phase modulation, CDMA, TDMA, spread spectrum, WiFi, Bluetooth, Zigbee, 3G, 4G, LPS, and the like, although a digital signal format is often preferred.

In addition, a receiver 500, 500', 500-500' could be associated and co-located with an auxiliary loudspeaker 212 at which the program audio is to be delayed before being reproduced and/or with an auxiliary video display, e.g., a JUMBOTRON® screen, a video wall, a video truck, a television, a monitor, a projection TV, or another large display, at which the program video is to be delayed before being reproduced. Such receiver 500, 500', 500-500' may determine its location in relation to venue 100 and loudspeaker 210 and/or the auxiliary video display, determines the local speed of sound from local atmospheric data (either received via wireless transmission or sensed directly), and/or correlates natural sound audio from the air with program audio data, and determines therefrom the delay time to be applied to the program video and/or audio, and applies such time delay in delay circuit 615 so that the video reproduced by display 514 is substantially time aligned with the natural sound from a loudspeaker 210 in venue 100, and also so that the sound reproduced by auxiliary loudspeaker 212 is substantially aligned with the video and the natural sound.

It is noted that the terms program and/or event are used interchangeably and equivalently herein to refer to any program and/or event in relation to which the described device and arrangement may be utilized, and may include, e.g., without limitation, any one or more of a concert, a performance, a play, a drama, a sporting event, a contest, a sporting contest, a game, a race, an art or other exhibit, a display, a convention, a festival, an interview, a fund raising, a demonstration, a celebration, a ceremony, and the like, including a combination thereof.

Finally, numerical values stated are typical or example values, are not limiting values, and do not preclude substantially larger and/or substantially smaller values. Values in any given embodiment may be substantially larger and/or may be substantially smaller than the example or typical values stated.

What is claimed is:

1. A wireless device for selectively reproducing program data including program video data and program audio data in known time synchronization and originating from a source in a venue having a boundary and at least one sound reproducing transducer therein, said wireless device comprising:

a receiver for receiving wireless transmissions and demodulating program data contained therein, wherein the program data includes at least program video data, program audio data, and time synchronization data for the program video data and the program audio data;

a storage device for storing a time segment of the received program video data and a time segment of the received program audio data;

at least one sound transducer receiving natural sound via the atmosphere from the at least one sound reproducing transducer, the received natural sound being delayed by the speed of sound in the atmosphere;

a correlator correlating one or more stored segments of the received program audio data and one or more segments of the received delayed natural sound to determine a segment of the received program audio data that corresponds to a segment of the received delayed natural sound;

a processor coupled to said correlator for determining from the segment of the received program audio data that corresponds to a segment of the received delayed natural sound a number of video frames of delay by which the received program video data that corresponds in time to the segment of the received program audio data that corresponds to a segment of the received delayed natural sound is delayed from the received delayed natural sound; and a display coupled to said storage device for reproducing in human perceivable form the program video data delayed by the number of video frames determined by said processor, whereby the received video reproduced by the display of said wireless device is substantially in time alignment with ambient natural sound from the sound reproducing transducer of the venue.

2. The wireless device of claim 1 wherein the determined number of video frames is an integer number selected by:

rounding the determined number of video frames to the integer value closest thereto; or rounding the determined number of video frames down if the determined number of video frames is less than a predetermined portion of a video frame and rounding the determined number of video frames up if the number of video frames is greater than the predetermined portion of a video frame; or rounding the determined number of video frames down to the next lowest integer value.

3. The wireless device of claim 1 further comprising:

a sound transducer coupled to said delay circuit for reproducing the received program audio data in a human perceivable form in time synchronization with the reproduced delayed program video data;

whereby the received audio data reproduced by the sound transducer is substantially in time alignment with the reproduced program video data and with ambient natural sound from the sound reproducing transducers of the venue in the location of said wireless device.

4. The wireless device of claim 1 wherein:

the program video data and the program audio data are received in a composite signal in which the time synchronization data is inherent therein; or the program video data and the program audio data are received in separate signals each of which includes respective time synchronization data therein; or the program video data and the program audio data are received in separate signals and the time synchronization data therefor is received in a separate signal.

5. The wireless device of claim 1 wherein: the program video data and the program audio data are received in a composite signal in which the time synchronization data is inherent therein and are demodulated and/or demultiplexed from the composite signal.

6. The wireless device of claim 1 wherein said wireless device comprises: a personal digital assistant (PDA), a mobile phone, a Blackberry® device, an MP3 player, an iPod® device, a smart phone device, an iPhone® device, an ANDROID device, a GALAXY device, a satellite radio receiver, a tablet computer, a netbook computer, a notebook computer, and/or a personal computer, with or without a docking station therefor.

7. The wireless device of claim 1 wherein said display comprises: a video screen, an LCD display, an OLED display, an AMOLED display, an LED display, a super AMOLED display, a touch screen, a transparent display screen, a large screen display, a JUMBOTRON® screen, a video wall, a video truck, a television, a monitor, and/or a projection TV.

8. The wireless device of claim 1 wherein said correlator correlates in response to: receiving of a wireless transmission, natural sound level, a change in natural sound level, frequency content of the received natural sound, a change in the frequency content of the received natural sound, a location of said wireless device, a change in location of said wireless device, a time, a time interval, an accelerometer, a motion detector, a compass, a manual actuation, an electronic actuation, or a combination thereof.

9. The wireless device of claim 1 wherein the program data further includes locating data, said wireless device further comprising:

said storage device storing a representation of the venue including locations of the at least one sound reproducing transducer of the venue therein;

wherein said processor is coupled to said receiver and to said storage device for determining from the locating data and from the stored representation of the venue the present location of said wireless device in the venue and a distance to the at least one sound reproducing transducer of the venue;

wherein said processor controls said correlator to correlate in response to the determined location of said wireless device in the venue and/or a change of the determined location of said wireless device in the venue.

10. The wireless device of claim 1 wherein the program data further includes locating data, said wireless device further comprising:

said storage device storing a representation of the venue including locations of the at least one sound reproducing transducer of the venue therein;

wherein said processor is coupled to said receiver and to said storage device for determining from the locating data and from the stored representation of the venue the present location of said wireless device in the venue;

wherein said processor causes a representation of the venue to be displayed on said display and further causes an indicator of the determined location of said wireless device and/or an indicator of a predetermined location in the venue to be displayed on the displayed representation of the venue.

11. The wireless device of claim 1 wherein said at least one sound transducer includes:

a microphone that is part of said wireless device;

an external microphone that is connected to said wireless device;

an external binaural microphone that is connected to said wireless device; or a combination thereof.

12. The wireless device of claim 1 further comprising an imager for capturing still images, video images, or both, wherein captured images may be displayed on said display, stored in a storage device of said wireless device, edited by said wireless device, transmitted by a transmitter of said wireless device, exported by said wireless device, or a combination thereof.

13. The wireless device of claim 12 wherein the captured images stored in the storage device of said wireless device are synchronized to the delayed program video data delayed by the number of video frames determined by said processor.

14. The wireless device of claim 1 further comprising a transmitter, wherein said transmitter connects via AM, FM, phase modulation, CDMA, TDMA, spread spectrum, WiFi, Bluetooth, Zigbee, 3G, 4G, LPS, a radio frequency link, a wireless network, and/or a combination thereof, and wherein said receiver connects via AM, FM, phase modulation, CDMA, TDMA, spread spectrum, WiFi, Bluetooth, Zigbee, 3G, 4G, LPS, a radio frequency link, a wireless network, and/or a combination thereof; and wherein said wireless device may further connect via said transmitter and said receiver to a network, a wired network, a cable, a USB cable, and/or the Internet.

15. The wireless device of claim 1 wherein an authorization is stored in said storage device, wherein said processor is responsive to the stored authorization for enabling the reproducing of program video data by said display.

16. The wireless device of claim 2 wherein an authorization is stored in said storage device, wherein said processor is responsive to the stored authorization for enabling the reproducing of program video data by said display and the reproducing of program audio data by said sound transducer of said wireless device.

17. The wireless device of claim 1 wherein an authorization is stored in said storage device, wherein the authorization is representative of rights to control a function of said wireless device selected from the group consisting of: reproducing program video data, reproducing program audio data, storing and playing back video program data, storing and playing back program audio data, mixing program video data with image data provided by an imager of said wireless device, recording and playing back the mixed video data, mixing program audio data with audio data provided by said microphone, recording and playing back the mixed audio data, or a combination of any of the foregoing;

wherein said processor is responsive to the stored authorization for enabling the selected function or functions of said wireless device represented by the rights of the stored authorization.

18. The wireless device of claim 17 wherein said processor is responsive to the stored authorization for disabling the function or functions of said wireless device not enabled responsive to the stored authorization.

19. The wireless device of claim 17 wherein each of the rights to control a function of said wireless device represented by the authorization has a predetermined fee payment associated therewith.

20. The wireless device of claim 1 wherein electronic ticket data is stored in said storage device, the electronic ticket data including data representative of: a name of an event, a name of an artist and/or performer, the date and/or time of the event, a seat identifier, a section and/or area identifier, a date and/or time of ticket issuance, a ticket transaction history, ticket transfers, ticket upgrades and downgrades, gate opening times, seating available time, ticket redemption and/or exchange times and conditions, a venue name and/or address, a customer service telephone number, a telephone number, a customer service e-mail address, an e-mail address, a ticket number, a barcode and/or barcode number, a scannable barcode and/or QR code, a request for body part and/or other biometric data, authorizations available and/or purchased and/or otherwise granted, a date of distribution, a ticket proprietor and/or manufacturer, an event proprietor, a ticket price, tax and fee data, promotional offers available, system identifiers, transaction numbers, tracking numbers, a name, address, telephone, e-mail address, credit and debit card numbers, account numbers, photo images, body part images, biometric data, personal data, photo identification data, facial recognition data, fingerprint data, or any combination thereof.

21. The wireless device of claim 19 wherein at least a portion of the electronic ticket data is stored in said storage device in connection with a transaction to obtain the electronic ticket, and wherein at presentation of the electronic ticket, a physical ticket corresponding thereto, or both, ticket data corresponding to at least a portion of the stored electronic ticket data is collected and compared to the stored electronic ticket data for determining whether the collected ticket data matches the stored electronic ticket data to validate the electronic ticket, the physical ticket corresponding thereto, or both.

22. A wireless device for selectively reproducing program data including program video data and/or program audio data in known time synchronization and originating from a source in a venue having a boundary and at least one sound reproducing transducer therein, said wireless device comprising:

a receiver for receiving wireless transmissions and demodulating program data contained therein, wherein the program data includes at least program video data and program audio data;

at least one sound transducer receiving natural sound via the atmosphere from the at least one sound reproducing transducer, the received natural sound being delayed by the speed of sound in the atmosphere;

means for substantially aligning the received program video data, the received program audio data, or both, in time synchronization with the received delayed natural sound;

a reproducing device for reproducing in human perceivable form the received program video data, the received program audio data, or both, in time synchronization with the received delayed natural sound;

wherein said means for substantially aligning performs the substantially aligning the received program video data, the received program audio data, or both, in time synchronization with the received delayed natural sound in response to: receiving a wireless transmission, a natural sound level, a location of said wireless device, a change in location of said wireless device, or both;

whereby the received program data reproduced by the reproducing device of said wireless device is substantially in time alignment with ambient natural sound from the sound reproducing transducer of the venue.

23. The wireless device of claim 22 wherein said means for substantially aligning further performs the substantially aligning the received program video data, the received program audio data, or both, in time synchronization with the received delayed natural sound in response to: receiving a wireless transmission, a natural sound level, a change in natural sound level, a frequency content of the received natural sound, a change in the frequency content of the received natural sound, a time, a time interval, an accelerometer, a motion detector, a compass, an imager, a manual actuation, an electronic actuation, or a combination thereof.

24. The wireless device of claim 22 wherein said means for substantially aligning the received program data comprises:

a storage device for storing at least segments of the received program video data and the received program audio data;

at least one sound transducer receiving natural sound via the atmosphere from the at least one sound reproducing transducer, the received natural sound being delayed by the speed of sound in the atmosphere;

a correlator correlating one or more stored segments of the received program audio data and one or more segments of the received delayed natural sound to determine a segment of the received program audio data that corresponds to a segment of the received delayed natural sound;

wherein said processor is coupled to said correlator for determining from the segment of the received program audio data that corresponds to a segment of the received delayed natural sound a delay by which the received program data that corresponds in time to the segment of the received program audio data that corresponds to a segment of the received delayed natural sound is delayed from the received delayed natural sound;

wherein said reproducing device is coupled to said storage device for reproducing the program data delayed by the delay determined by said processor.

25. The wireless device of claim 24 wherein said correlator correlates in response to: receiving a wireless transmission, a natural sound level, a change in natural sound level, a frequency content of the received natural sound, a change in the frequency content of the received natural sound, a time, a time interval, an accelerometer, a motion detector, a compass, an imager, a manual actuation, an electronic actuation, or a combination thereof.

26. The wireless device of claim 22 wherein the delay applied to program video data is a number of video frames.

27. The wireless device of claim 22 wherein said reproducing device includes:

a display for reproducing delayed program video data; or a sound transducer for reproducing the received program audio data; or a display for reproducing delayed program video data and a sound transducer for reproducing the received program audio data.

28. The wireless device of claim 1 wherein the program data further includes locating data, said wireless device further comprising:

said storage device storing a representation of the venue including locations of the at least one sound reproducing transducer of the venue therein;

wherein said processor is coupled to said receiver and to said storage device for determining from the locating data and from the stored representation of the venue the present location of said wireless device in the venue and a distance to the at least one sound reproducing transducer of the venue;

wherein said processor controls said correlator to correlate in response to the determined location of said wireless device in the venue, a change of the determined location of said wireless device in the venue and/or a change in the distance to the at least one sound reproducing transducer.

29. The wireless device of claim 28 wherein the representation of the venue including locations of the at least one sound reproducing transducer of the venue therein includes:

a digital map, a digital plan, a two dimensional CAD drawing, a three dimensional CAD drawing, or a combination there of; and wherein the representation of the venue including locations of the plural sound reproducing transducers of the venue therein optionally includes:

a representation of acoustical properties of the venue and/or of the plural sound reproducing transducers therein.

30. The wireless device of claim 22 further comprising: a locating device, said locating device including a GPS locator, a compass, an accelerometer, a motion detector, an imager, and/or a physical motion detecting device, wherein said correlator correlates in response to location data, a change in location data, or both, produced by said locating device.

31. A wireless device for selectively reproducing transmitted program data relating to audio data originating as natural sound from a source in a venue having at least one sound reproducing transducer therein, said wireless device comprising:

a receiver and a transmitter for receiving and transmitting wireless transmissions, including receiving program data related to the audio data;

at least one sound transducer receiving natural sound via the atmosphere from the at least one sound reproducing transducer, the received natural sound being delayed by the speed of sound in the atmosphere;

means for correlating one or more segments of received data and one or more segments of the received delayed natural sound to identify the received program data that corresponds to a segment of the received delayed natural sound;

wherein said means for correlating correlates in response to: receiving a wireless transmission, or a location of said wireless device, or a change in location of said wireless device, or a combination thereof;

wherein said receiver receives remotely originated data related to the identified received program data;

a reproducing device for reproducing in human perceivable form the received program data, the received remotely originated data, or both;

whereby the received program data and/or the remotely originated data is reproduced by the reproducing device of said wireless device.

32. The wireless device of claim 31 wherein said transmitter transmits one or more segments of the received program data or of the received delayed natural sound, or both, and wherein said receiver receives the received remotely originated data.

33. The wireless device of claim 31 wherein said correlator correlates the received program data and the delayed natural sound for determining a time difference therebetween; and wherein said reproducing device reproducing the received program data, the received remotely originated data, or both, in time synchronization with the received delayed natural sound;

whereby the received program data and/or the remotely originated data is reproduced by the reproducing device substantially in time alignment with ambient natural sound from the sound reproducing transducer of the venue.

34. The wireless device of claim 31 wherein said wireless device comprises: a personal digital assistant (PDA), a mobile phone, a Blackberry® device, an MP3 player, an iPod® device, a smart phone device, an iPhone® device, an ANDROID device, a GALAXY device, a satellite radio receiver, a tablet computer, a netbook computer, a notebook computer, and/or a personal computer, with or without a docking station therefor.

35. A wireless device for reproducing when authorized program data including program data generally corresponding to natural sound originating from one or more sound reproducing transducers within a venue, said wireless device comprising:

a receiver for receiving wireless transmissions and demodulating data contained therein, wherein the data includes at least locating data and authorization data and the program data, the authorization data including authorized location data, and optionally biometric data;

a storage device optionally storing a representation of the venue including predetermined locations therein and locations of the one or more sound reproducing transducers within the venue;

a processor coupled to said receiver for determining from the locating data and optionally from the stored representation of the venue the location of said wireless device;

a reproducing device coupled to the storage device for reproducing the received program data in a human perceivable form;

an input device optionally for providing user biometric data; and said processor determining from the authorization data an authorization for reproducing the received program data and/or the delayed received program data if the determined location of said wireless device is a location defined by the authorized location data, and optionally if the user biometric data matches the authorization biometric data;

wherein said processor enables said reproducing device to reproduce received program data in accordance with the authorization if the determined location of said wireless device is a location defined by the authorized location data, and optionally if the user biometric data matches the authorization biometric data, whereby program data is reproduced only if reproduction thereof is authorized by the authorization data.

36. The wireless device of claim 35 wherein said processor determines from the determined location of said wireless device and from the stored representation of the venue the location of said wireless device a delay representative of the difference in time between program data received via wireless transmission and program data received via the atmosphere as natural sound originating from the one or more sound reproducing transducers;

said processor controlling said storage device to delay said reproducing device reproducing the received program data by the determined delay.

37. The wireless device of claim 35 wherein said processor disables reproduction and use of the program data if the determined location of said wireless device is not a location defined by the authorization location data, or if the user biometric data does not match the authorization biometric data, if the determined location of said wireless device is not within the venue, or if the location of said wireless device is not within a predetermined boundary, or if the time is not within a predetermined time period, or if the authorization does not correspond with a predetermined condition, or if a ticket number is not a predetermined ticket number, or a combination thereof.

38. The wireless device of claim 37 wherein the authorization data defines the predetermined condition to include: a location, or a location, space, section and/or seat within the venue, or a map including a location, or an Internet Protocol (IP) address, or an electronic serial number (ESN), or unique identifying data associated with said wireless device, or a stored access authorization, or a stored ticket access authorization, or an admission authorization, or an in attendance ticket authorization, or a combination thereof.

39. The wireless device of claim 35 wherein the biometric data includes: an image of a body part, a facial image, a facial recognition image, an iris scan, a finger scan, a vein scan, a fingerprint, or a combination thereof.

40. The wireless device of claim 35 wherein an authorization is stored in said storage device, wherein the authorization is representative of rights to control a function of said wireless device selected from the group consisting of: reproducing program video data, reproducing program audio data, storing and playing back video program data, storing and playing back program audio data, capturing image data provided by an imager of said wireless device, mixing program video data with image data provided by the imager of said wireless device, recording and playing back the mixed video data, mixing program audio data with audio data provided by said microphone, recording and playing back the mixed audio data, or a combination of any of the foregoing;

wherein said processor is responsive to the stored authorization for enabling the selected function or functions of said wireless device represented by the rights of the stored authorization.

41. The wireless device of claim 40 wherein said processor is responsive to the stored authorization for disabling a function or functions of said wireless device not enabled responsive to the stored authorization.

42. The wireless device of claim 35 further comprising a transmitter for communication wirelessly, wherein said transmitter and said receiver of said wireless device communicate wirelessly with a ticketing entity for conducting a transaction, the transaction including: obtaining a ticket, obtaining an authorization, changing a ticket, changing an authorization, transferring a ticket, transferring an authorization, upgrading and/or downgrading a ticket, upgrading and/or downgrading an authorization, optionally making payment for any of the foregoing, or a combination thereof.

43. The wireless device of claim 42 wherein information relating to the transaction is stored by the ticketing entity for tracking a ticket, for transferring a ticket for conducting a transaction, the transaction including: issuing a ticket, for issuing an authorization, for changing a ticket, for changing an authorization, for transferring a ticket, for transferring an authorization, for upgrading and/or downgrading a ticket, for upgrading and/or downgrading an authorization, optionally making payment for any of the foregoing, or a combination thereof.

44. The wireless device of claim 35 wherein the determined location of said wireless device is utilized for tracking said wireless device within the venue, for auditing authorizations for said wireless device, or for auditing authorizations for said wireless device relative to the location thereof, or for a combination thereof.

45. A method for obtaining a ticket and/or an authorization from a ticketing entity comprising:

communicating an offer to obtain a ticket, an authorization or both, wherein both the ticket and the authorization relate to a certain event;

receiving response data related to obtaining a ticket and/or an authorization for the certain event, the received data including event identifying data, authorization identifying data, personal data, payment data, remote device identifying data, and optionally biometric data;

storing the received event identifying data, authorization identifying data, personal data, payment data, remote device identifying data, and optionally biometric data;

storing ticket data representing a ticket, authorization data representing an authorization, or both, corresponding to the received response data; and transmitting the ticket data, the authorization data, or both, corresponding to the received response data, to a remote device;

wherein the ticket data, the authorization data, or both, control the remote device in accordance with the ticket data, authorization data, or both;

receiving at least ticket data, personal data and remote device identifying data when a ticket including the ticket data is presented for using the ticket, the authorization, or both, verifying the received at least ticket data, personal data and remote device identifying data by comparison with the stored ticket data, personal data and remote device identifying data; and if the ticket data, personal data and remote device identifying data are verified, then issuing a verification enabling admission to the certain event and use of the remote device including the ticket data, the authorization data, or both, the remote device being thereby enabled in accordance with the ticket data, the authorization data, or both, if the ticket data, personal data and remote device identifying data are not verified, then not issuing a verification and denying admission to the certain event and denying use of the remote device thereat, whereby the ticketing entity maintains control of the issued ticket and of the authorization associated therewith.

46. The method of claim 45 wherein the verification issued:

enables functions of the remote device that are authorized by the authorization data; or disables functions of the remote device that are not authorized by the authorization data; or enables functions of the remote device that are authorized by the authorization data and disables functions of the remote device that are not authorized thereby.

47. The method of claim 45 further comprising:

utilizing the stored ticket data, the stored personal data, and stored biometric data received and stored prior to issuing the ticket for controlling the ticket.

48. The method of claim 45 further comprising:

receiving a request to transfer an issued ticket including request data related to transferring the issued ticket, the request data including issued ticket identifying data, authorization identifying data, personal data for a transferee, payment data, and optionally biometric data for a transferee;

storing the received personal data for a transferee, event identifying data, payment data, and optionally biometric data for a transferee;

storing replacement ticket data representing a replacement ticket, authorization data representing an authorization relating to the replacement ticket, or both, corresponding to the requested data; and transmitting the replacement ticket data, the authorization data relating thereto, or both, corresponding to the request data, to a different remote device;

wherein the replacement ticket data, the authorization data relating thereto, or both, control the different remote device in accordance with the replacement ticket data, the authorization data relating thereto, or both; and transmitting data to the remote device to deactivate and/or delete the ticket data, authorization data, or both, previously transmitted thereto, whereby the ticketing entity maintains control of the issued ticket and of the transfer thereof.

49. The method of claim 48 further comprising:

receiving with the request to transfer an issued ticket issued ticket identifying data and personal data for a transferor, and optionally biometric data for a transferor; and storing the issued ticket identifying data, the personal data for a transferor, and optionally the biometric data for a transferor; and verifying the stored issued ticket identifying data, the stored personal data for a transferor, and optionally the stored biometric data for a transferor, with the ticket data, received personal data, and the optional biometric data received and stored prior to issuing the issued ticket.

50. The method of claim 49 further comprising:

utilizing the stored issued ticket identifying data, the stored personal data for a transferor, the optional stored biometric data for a transferor, and the stored ticket data, the stored personal data, and the optional stored biometric data received and stored prior to issuing the issued ticket for controlling the issued ticket, the replacement ticket, or both.

51. The method of claim 45 further comprising:

receiving a request to upgrade, downgrade, or both, authorizations relating to an issued ticket including change data related to authorizations to be upgraded, authorizations to be downgraded, or both, the change data including issued ticket identifying data, identifying data for the authorizations to be upgraded, downgraded, or both, personal data for a requester, payment data, and optionally biometric data;

storing the received change data including issued ticket identifying data, identifying data for the authorizations to be upgraded, downgraded, or both, personal data for a requester, payment data, and optionally biometric data;

storing changed authorization data representing the authorizations to be upgraded, the authorizations to be downgraded, or both, corresponding to the change data; and transmitting the changed authorization data representing the authorizations to be upgraded, the authorizations to be downgraded, or both, to the remote device.

52. A wireless device for reproducing when authorized program data relating to an event at a venue, the program data generally corresponding to natural sound originating from one or more sound reproducing transducers within the venue, the natural sound having a sound pressure level and a frequency spectrum at locations in the venue that differs from the sound pressure level and the frequency spectrum thereof at locations outside the venue, said wireless device comprising:

a receiver for receiving wireless transmissions, wherein the data therein includes at least the program data;

at least one sound transducer receiving natural sound via the atmosphere from the at least one sound reproducing transducer, the received natural sound being delayed by the speed of sound in the atmosphere;

a processor coupled to said sound transducer for determining from the received natural sound the sound pressure level thereof, the frequency content thereof, or both, said processor comparing the sound pressure level of the received natural sound to a predetermined sound pressure level, or comparing the frequency content of the received natural sound to a predetermined frequency content or spectrum, or both, said processor disabling the processing of received program data if, at the venue during a time for the event, the sound pressure level of the received natural sound is less than the predetermined sound pressure level or if the frequency content of the received natural sound is not within the predetermined frequency content or spectrum, or both, thereby indicating that said wireless device is not in the venue, and said processor enabling the processing of received program data if, at the venue during a time for the event, the sound pressure level of the received natural sound is greater than the predetermined sound pressure level or if the frequency content of the received natural sound is within the predetermined frequency content or spectrum, or both, thereby indicating that said wireless device is in the venue at the time of the event;

whereby program data is reproduced only if the sound pressure level and/or frequency content or spectrum of the natural sound is consistent with a location in the venue during an event.

53. The wireless device of claim 52 further comprising: a reproducing device for reproducing the received program data in a human perceivable form when enabled by said processor;

whereby program data is reproduced only if the sound pressure level and/or frequency content or spectrum of the natural sound is consistent with a location in the venue during an event.

54. The wireless device of claim 52 wherein authorization data is stored in said wireless device, said processor determining from the authorization data an authorization for processing the received program data if said wireless device is in the venue during the time of the event, and wherein said processor enables the processing of the received program data in accordance with the authorization if said wireless device is at a location defined by the authorization data.

55. The wireless device of claim 52 further comprising: a storage device having a representation of the venue stored therein, the stored representation having received natural sound pressure levels at a boundary of the venue, natural sound frequency content or spectrum at the boundary of the venue, or both, therein, wherein the stored representation defines the predetermined sound pressure level, the predetermined frequency content or spectrum, or both.

56. A method for controlling a remote wireless device utilizing ticket data, an authorization, or both, from a ticketing entity, comprising:

communicating with a remote device for providing thereto a ticket and an authorization relating to a certain event and for receiving remote device identifying data;

transmitting ticket data, authorization data, or both, corresponding to the certain event to the remote device;

storing the ticket data, authorization data, or both, and the received remote device identifying data;

wherein the ticket data, the authorization data, or both, control the remote device in accordance with the ticket data, authorization data, or both, during the certain event;

receiving at least ticket data and remote device identifying data when a ticket including the ticket data is presented for using the ticket, the authorization, or both, verifying the received at least ticket data and remote device identifying data by comparison with stored ticket data and remote device identifying data; and if the ticket data and remote device identifying data are verified, then enabling admission to the certain event and use of the remote device at the certain event including the ticket data, the authorization data, or both, the remote device being thereby enabled in accordance with the ticket data, the authorization data, or both, if the ticket data and remote device identifying data are not verified, then disabling functions of the remote device at the certain event, whereby the ticketing entity maintains control of the remote device during the certain event in accordance with the ticket and of the authorization associated therewith.

57. The method of claim 56 wherein the enabling and disabling includes:

enabling functions of the remote device that are authorized by the authorization data; or disabling functions of the remote device that are not authorized by the authorization data; or enabling functions of the remote device that are authorized by the authorization data and disabling functions of the remote device that are not authorized thereby.

58. The method of claim 56 further comprising:

transmitting to the remote device a representation of the venue including received natural sound pressure levels at a boundary of the venue, natural sound frequency content or spectrum at the boundary of the venue, or both, therein, wherein the transmitted representation defines the predetermined sound pressure level, the predetermined frequency content or spectrum, or both.

* * * * *

UNITED STATES PATENT AND TRADEMARK OFFICE
Certificate

Patent No. 8,379,874 B1 Patented: February 19, 2013

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Jeffrey Franklin Simon, Doylestown, PA (US); and James E. Meyer, Lancaster, PA (US).

Signed and Sealed this Eighteenth Day of February 2014.

STEVEN LOKE
*Supervisory Patent Examiner*
Art Unit 2818
Technology Center 2800